United States Patent
Sugahara et al.

(10) Patent No.: US 12,298,826 B2
(45) Date of Patent: May 13, 2025

(54) SEMICONDUCTOR MEMORY DEVICE AND MEMORY SYSTEM

(71) Applicant: Kioxia Corporation, Tokyo (JP)

(72) Inventors: Akio Sugahara, Yokohama Kanagawa (JP); Yasuhiro Hirashima, Kawasaki Kanagawa (JP); Naoya Tokiwa, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 113 days.

(21) Appl. No.: 18/181,488

(22) Filed: Mar. 9, 2023

(65) Prior Publication Data
US 2023/0213993 A1  Jul. 6, 2023

Related U.S. Application Data

(63) Continuation of application No. PCT/JP2020/035698, filed on Sep. 23, 2020.

(51) Int. Cl.
*G06F 1/28* (2006.01)
*G11C 16/04* (2006.01)

(52) U.S. Cl.
CPC ............ *G06F 1/28* (2013.01); *G11C 16/0483* (2013.01)

(58) Field of Classification Search
CPC ........ G06F 1/28; G06F 13/16; G06F 13/1668; G06F 13/4086; G06F 12/00; G11C 16/0483; G11C 16/32; G11C 7/1045; G11C 7/1057; G11C 7/1069; G11C 7/1087; G11C 7/1096; G11C 7/225; G11C 16/26;
(Continued)

(56) References Cited

U.S. PATENT DOCUMENTS 7,486,104 B2 *  2/2009  Oh ..................... G11C 11/413
                                                326/26
7,595,656 B2    9/2009  Hayami et al.
(Continued)

FOREIGN PATENT DOCUMENTS

JP    2008182516 A    8/2008
JP    2011060229 A    3/2011
(Continued)

OTHER PUBLICATIONS

International Search Report (ISR) (and English translation thereof) dated Nov. 2, 2020, issued in International Application No. PCT/JP2020/035698.
(Continued)

*Primary Examiner* — Faisal M Zaman
(74) *Attorney, Agent, or Firm* — Holtz, Holtz & Volek PC

(57) ABSTRACT

According to an embodiment, a semiconductor memory device includes a first pin, a first receiving circuit, and a first terminating circuit. The first pin receives a first signal and a second signal having a smaller amplitude than the first signal. The first receiving circuit is connected to the first pin and outputs, based on a comparison between the first signal and a first voltage, a third signal. The first receiving circuit also outputs, based on a comparison between the second signal and a second voltage, a fourth signal having a smaller amplitude than the third signal. The first terminating circuit is connected to the first pin. The first terminating circuit is disabled if the first pin receives the first signal, and enabled if the first pin receives the second signal.

24 Claims, 45 Drawing Sheets

(58) Field of Classification Search
CPC . G11C 7/1084; G11C 2207/105; G11C 5/063; H03K 19/017509
See application file for complete search history.

(56) References Cited

U.S. PATENT DOCUMENTS

| | | | |
|---|---|---|---|
| 9,088,445 | B2 | 7/2015 | Chun et al. |
| 9,130,557 | B2 | 9/2015 | Cho et al. |
| 9,431,078 | B2 | 8/2016 | Takeyama et al. |
| 9,564,185 | B1* | 2/2017 | Yanagidaira .......... G11C 7/1081 |
| 11,031,070 | B1* | 6/2021 | Buerkle .................... G11C 8/06 |
| 2005/0228912 | A1* | 10/2005 | Walker ................ G06F 13/4086 710/107 |
| 2010/0226185 | A1* | 9/2010 | Lee ...................... G11C 7/1084 365/189.05 |
| 2012/0113733 | A1* | 5/2012 | Kim ....................... G11C 5/063 365/191 |
| 2015/0098289 | A1* | 4/2015 | Saito ...................... G11C 16/26 365/222 |
| 2017/0178750 | A1* | 6/2017 | Kang ................... G11C 11/4093 |
| 2017/0222649 | A1* | 8/2017 | Koo ................. H03K 19/00361 |
| 2020/0293198 | A1 | 9/2020 | Anazawa |

FOREIGN PATENT DOCUMENTS

| | | |
|---|---|---|
| JP | 2015118527 A | 6/2015 |
| JP | 6158960 B2 | 6/2017 |
| JP | 2020149588 A | 9/2020 |

OTHER PUBLICATIONS

Written Opinion (WO) dated Nov. 2, 2020, issued in International Application No. PCT/JP2020/035698.

* cited by examiner

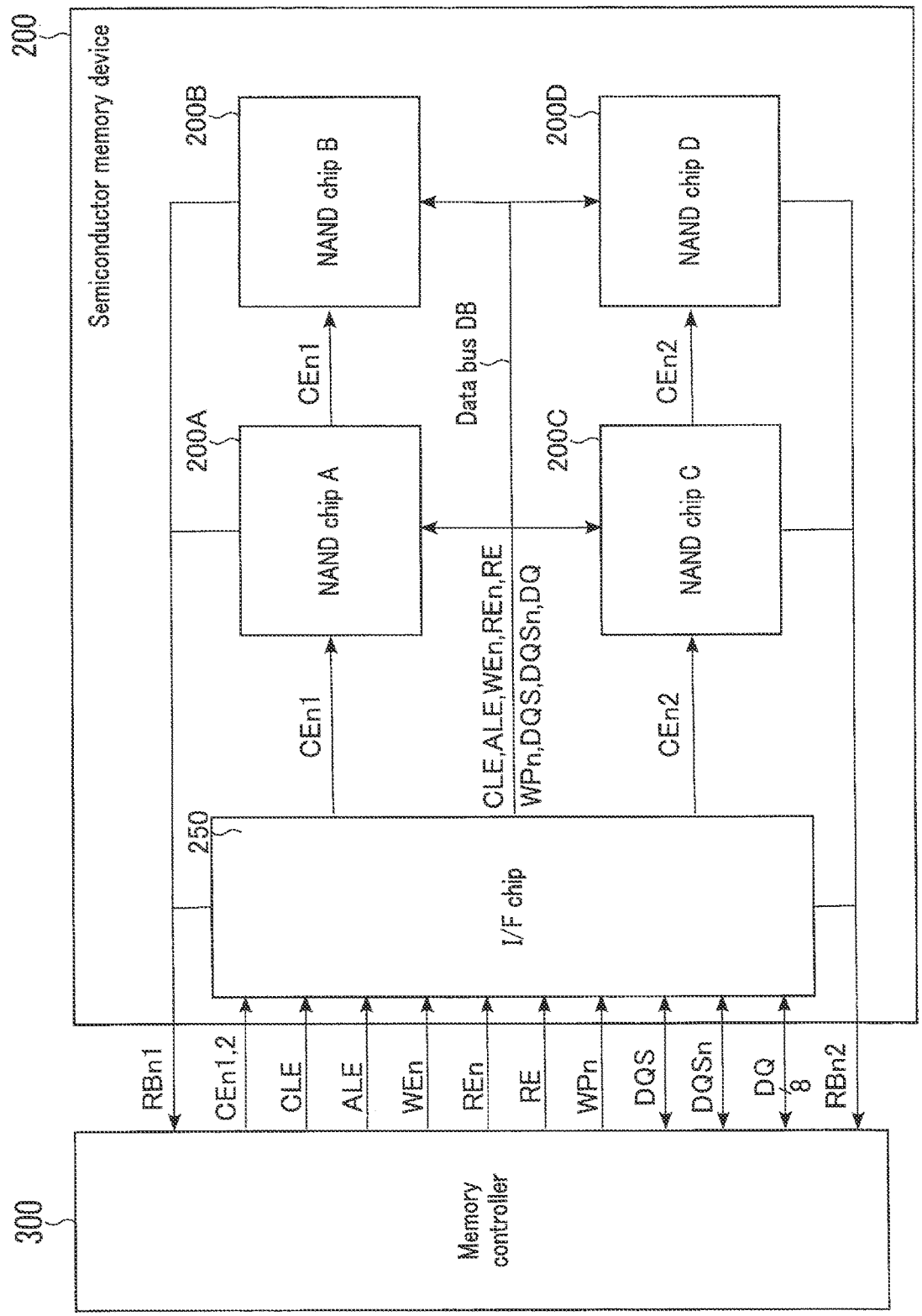
F I G. 2

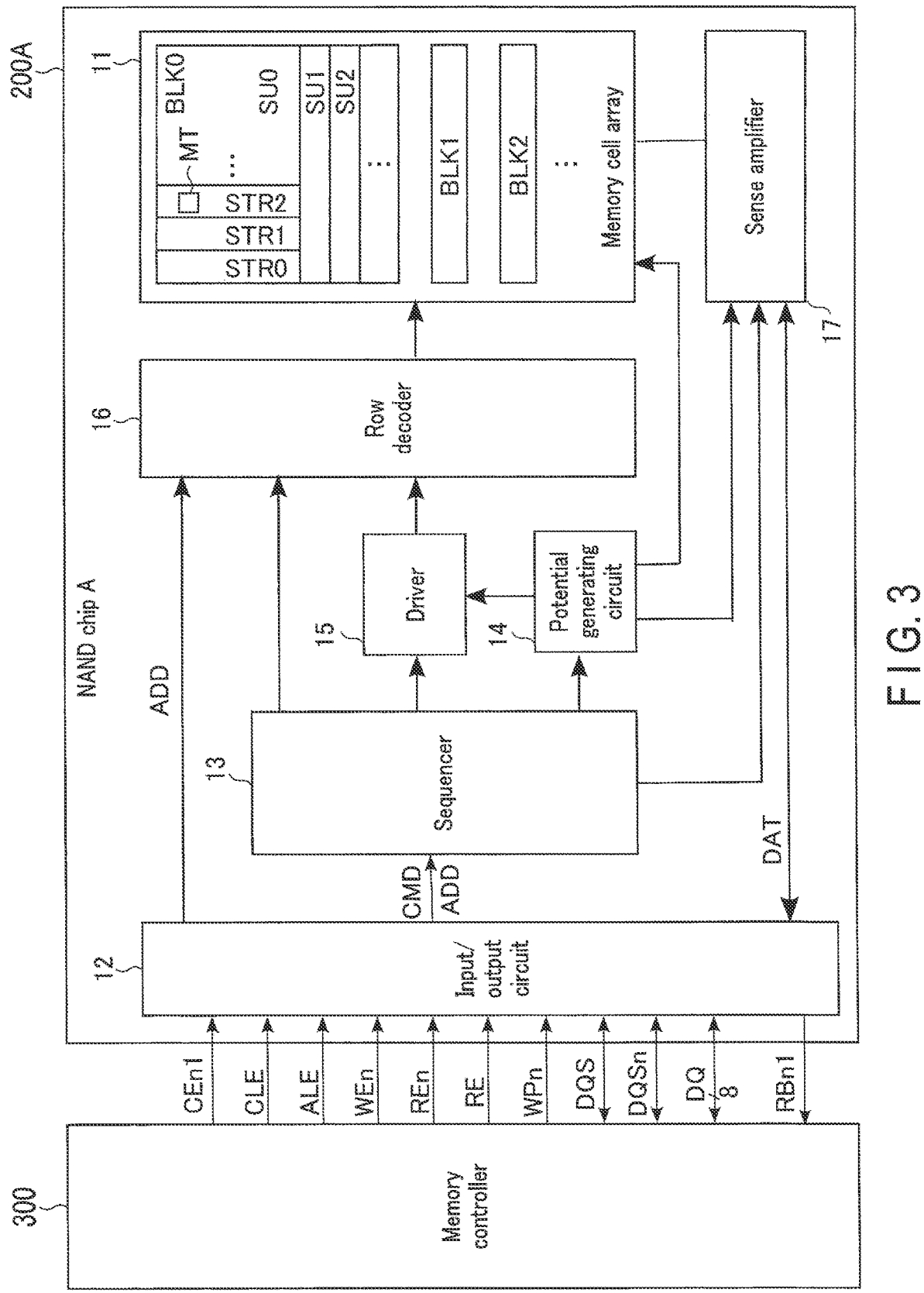
F I G. 3

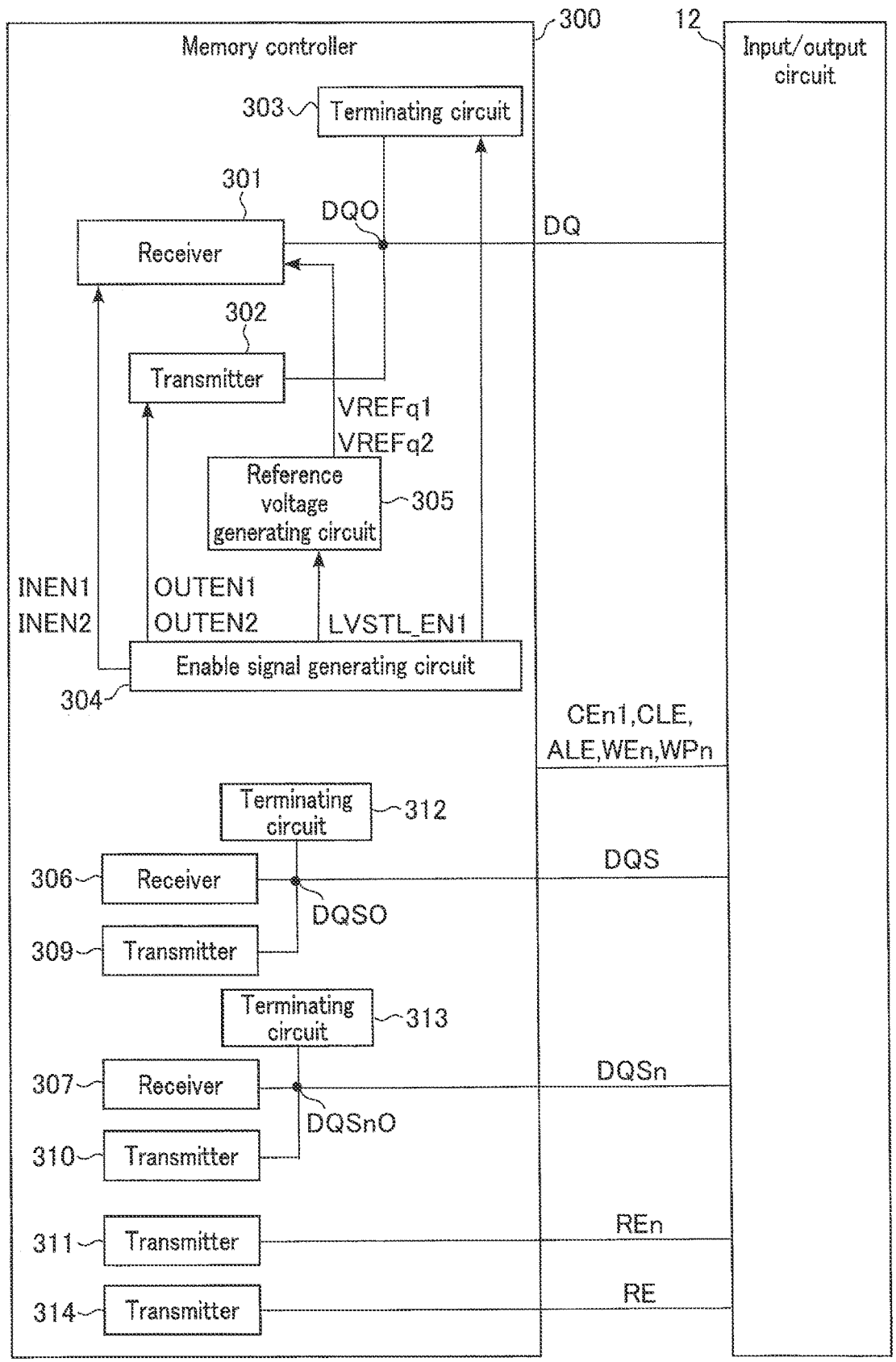
F I G. 5

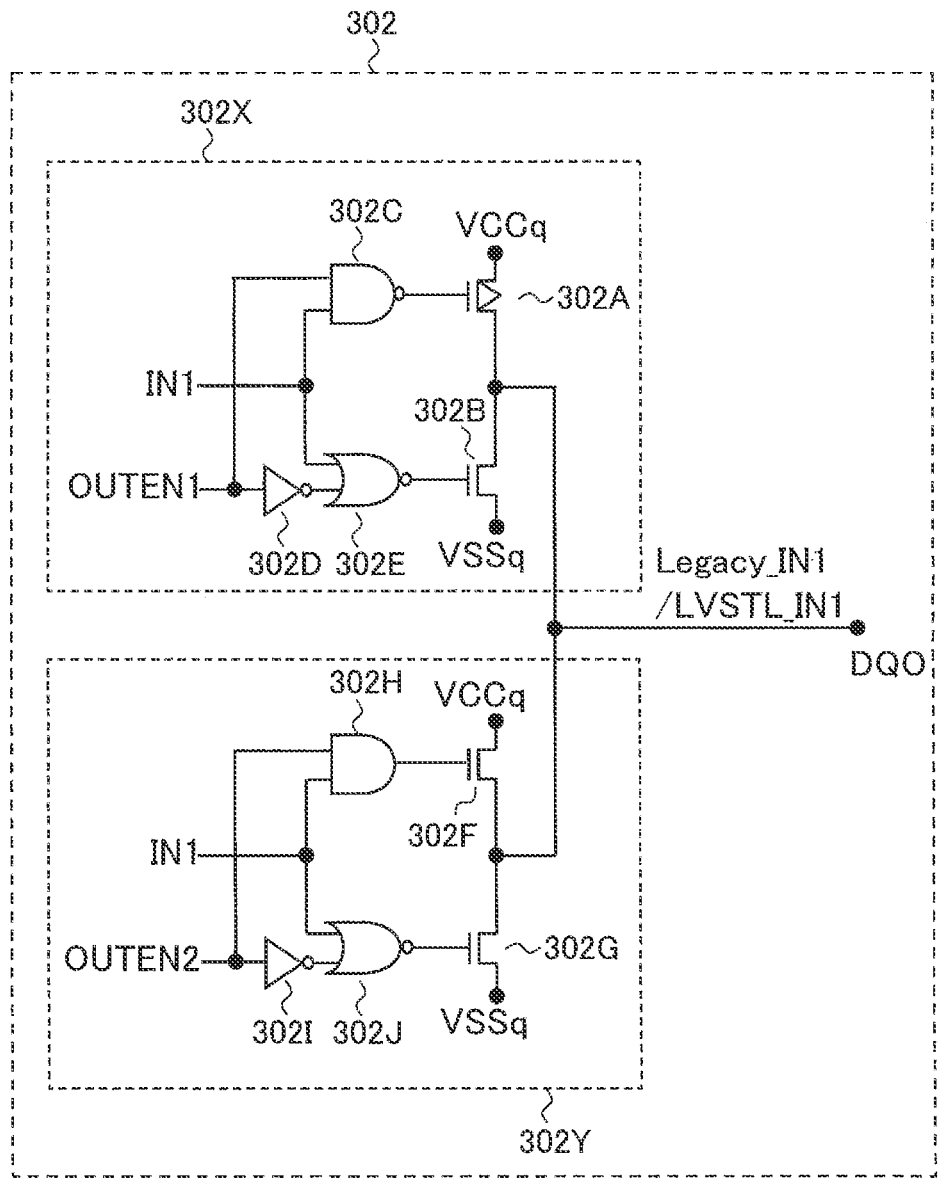
F I G. 9

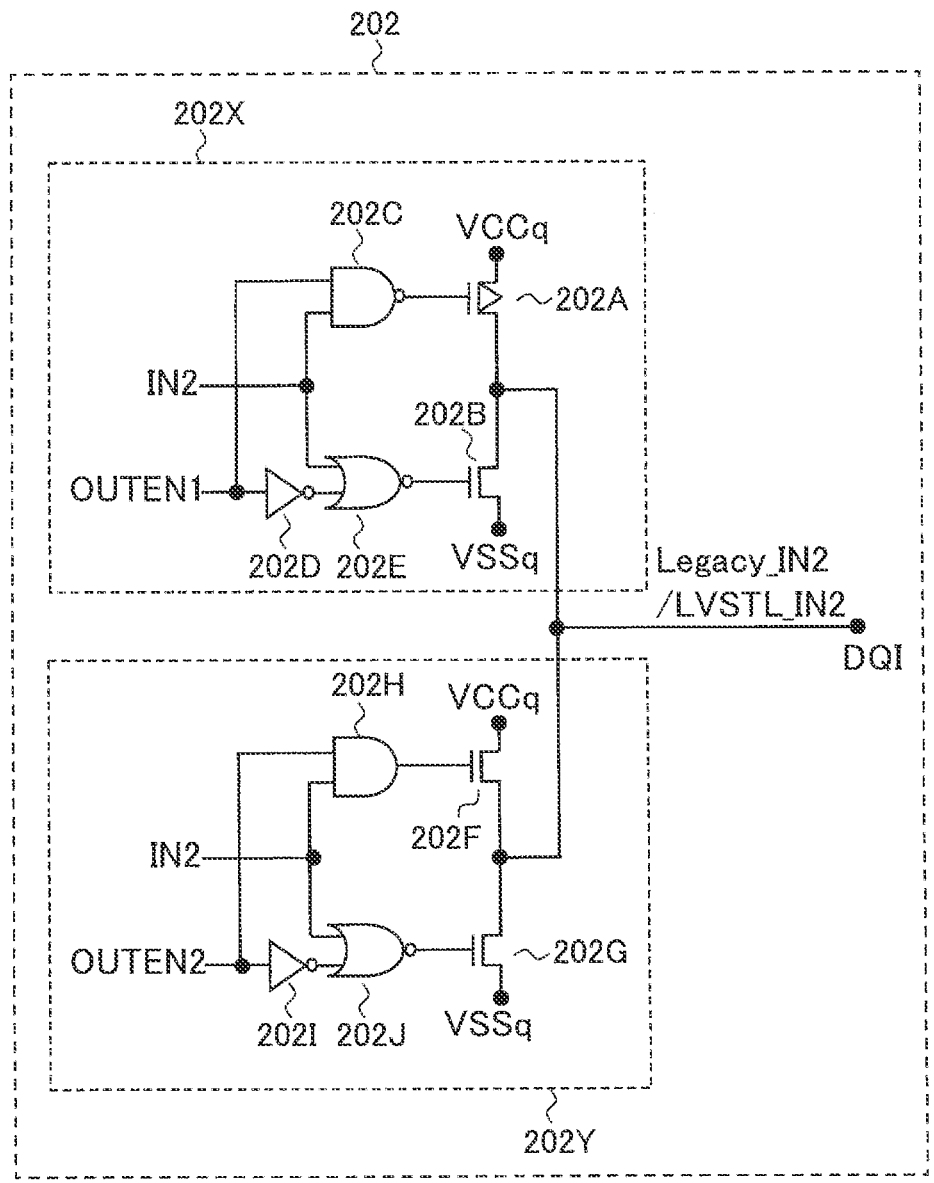
F I G. 10

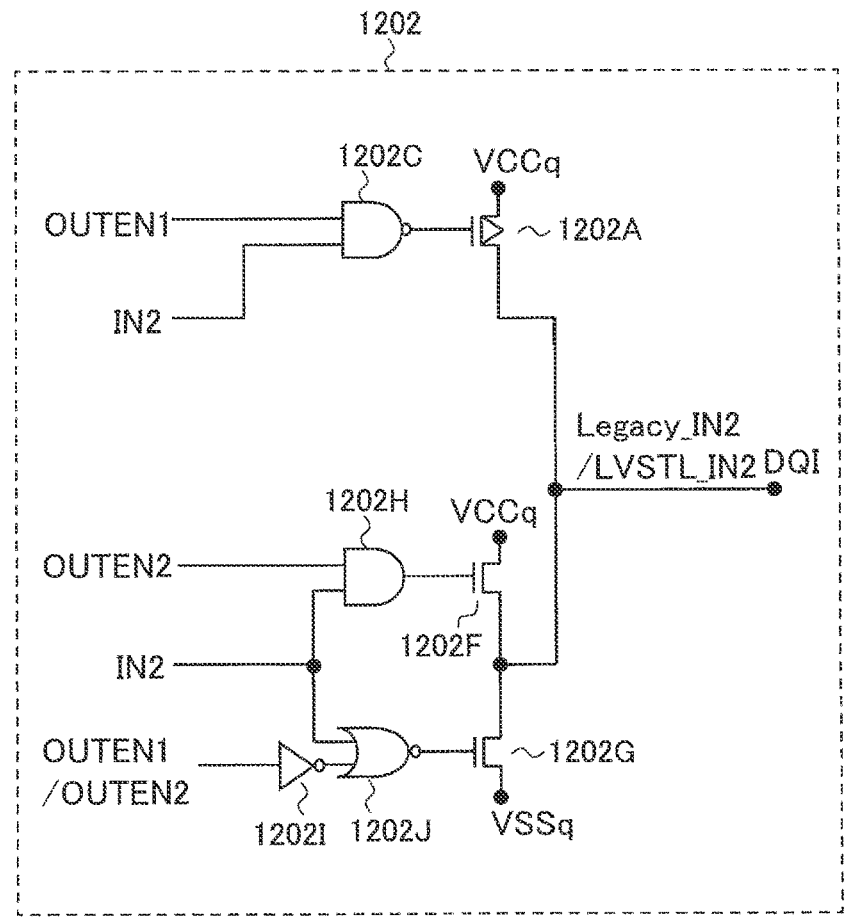
F I G. 11
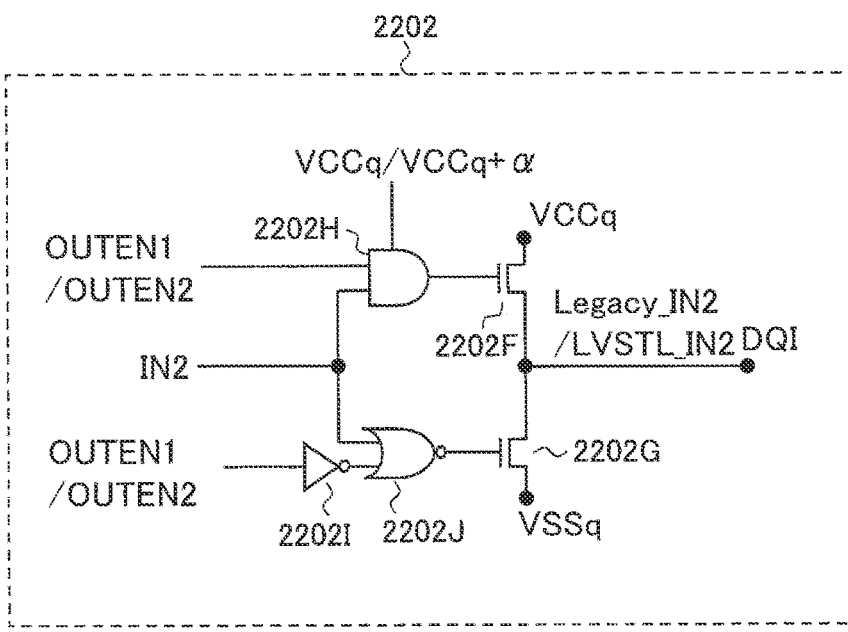
F I G. 12

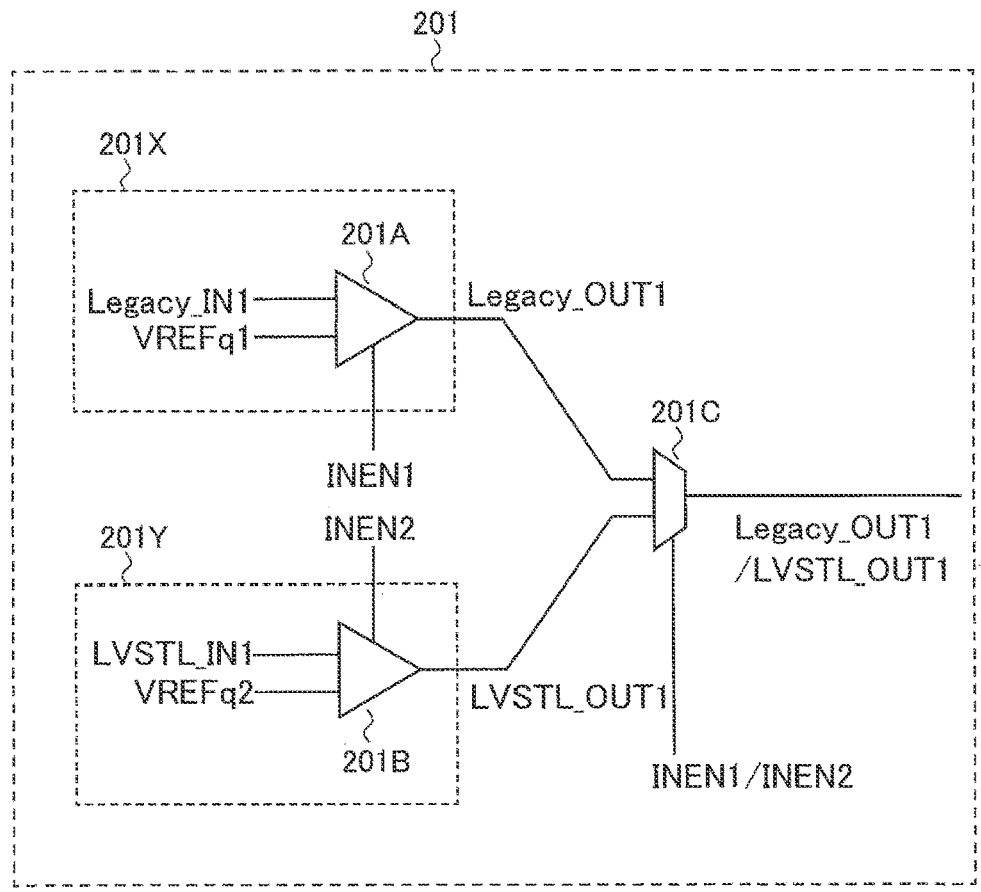
F I G. 14
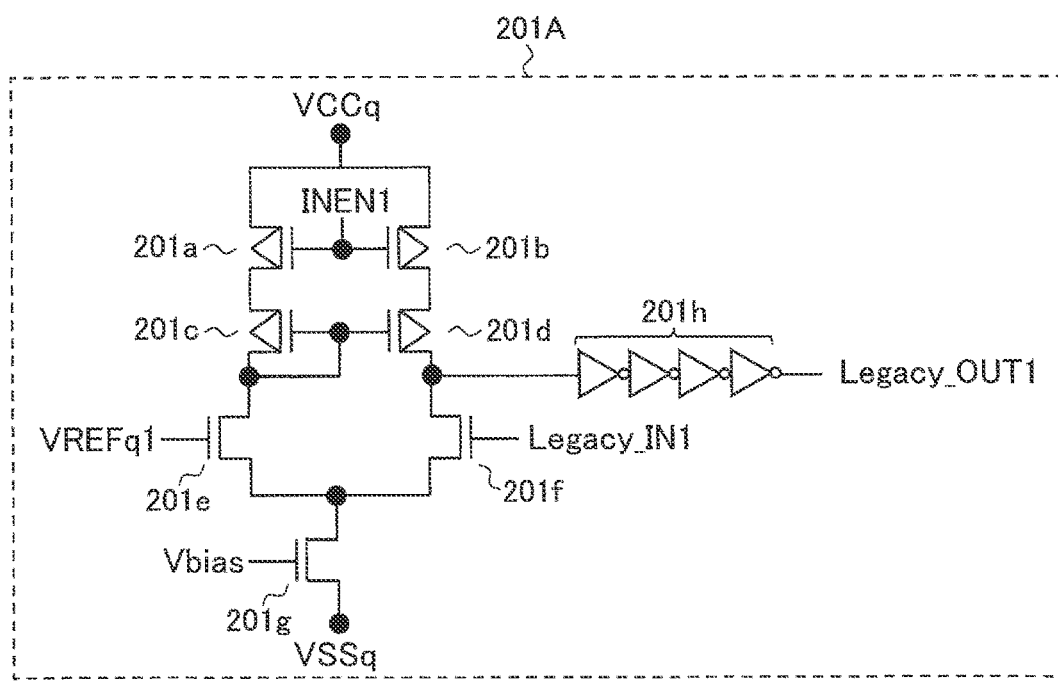
F I G. 15

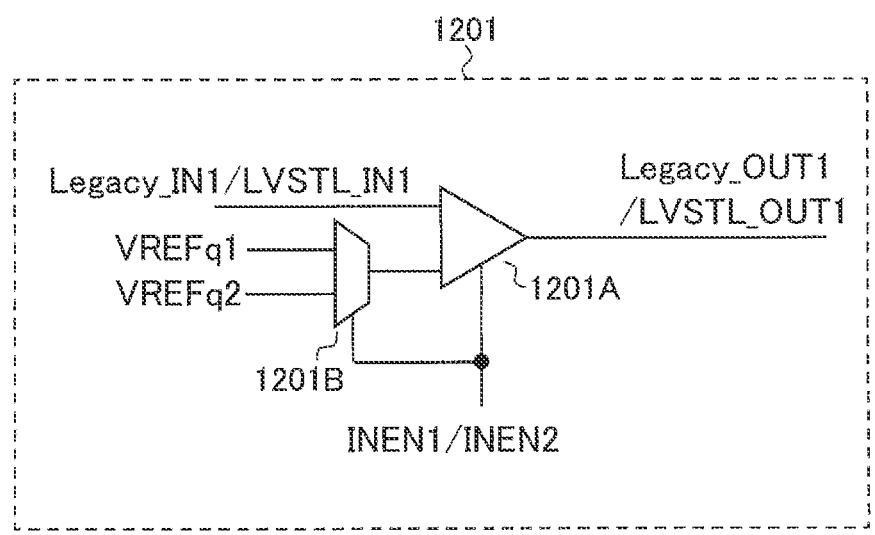
F I G. 16

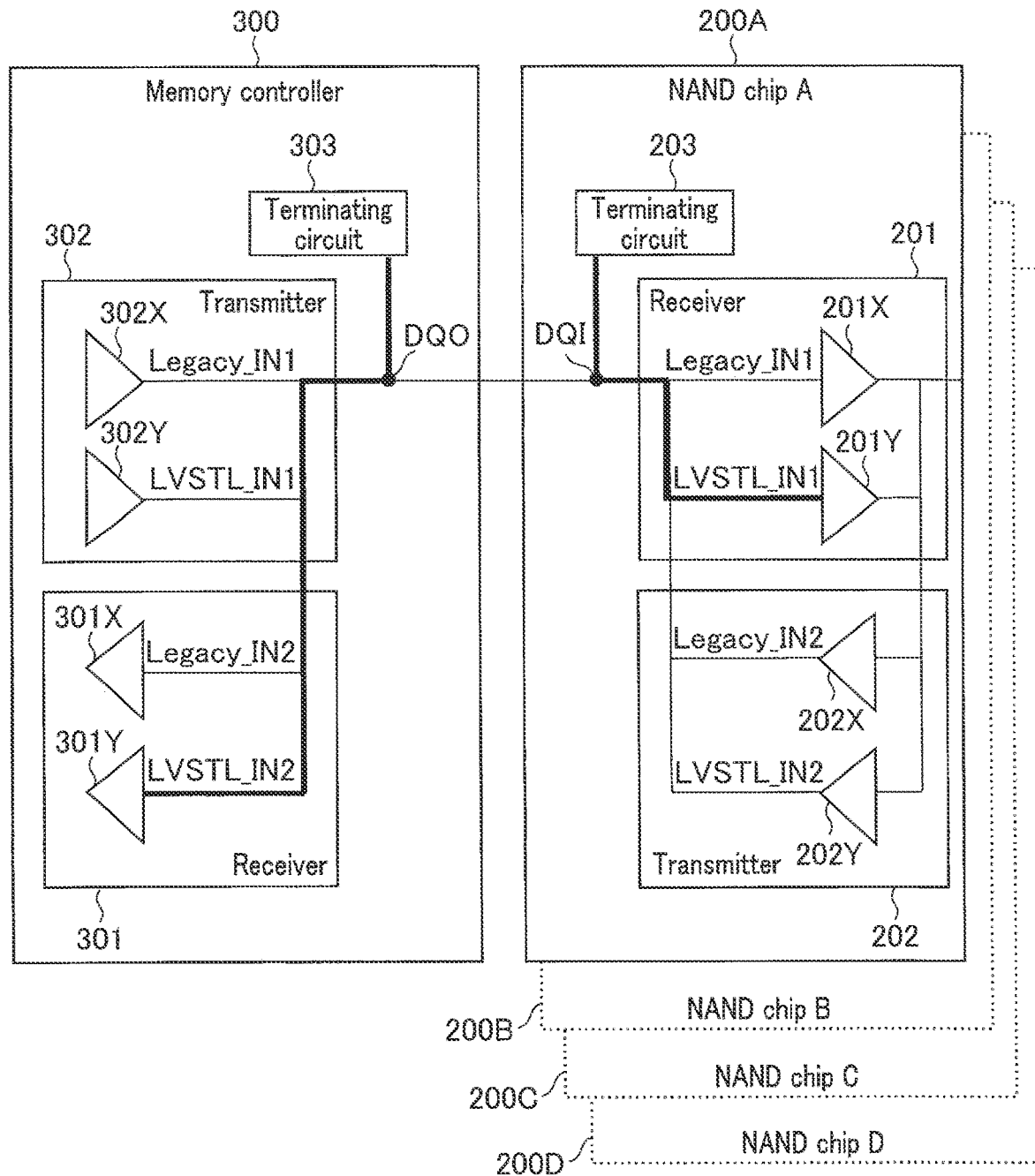
F I G. 18

Command & address

| | Memory controller | NAND chip A | NAND chip B | NAND chip C | NAND chip D |
|---|---|---|---|---|---|
| DQ | Legacy_IN1 | Legacy_IN1 | Legacy_IN1 | | |
| DQS | Fixed at L | | | | |
| RE | Fixed at L | | | | |

Status

| | Memory controller | NAND chip A | NAND chip B | NAND chip C | NAND chip D |
|---|---|---|---|---|---|
| DQ | Legacy_IN2 | Legacy_IN2 | | | |
| DQS | Legacy_DQS2 | Legacy_DQS2 | | | |
| RE | Legacy_RE1 | Legacy_RE1 | | | |

Parallel status

| | Memory controller | NAND chip A | NAND chip B | NAND chip C | NAND chip D |
|---|---|---|---|---|---|
| DQ | Legacy_IN2 | Legacy_IN2 | Legacy_IN2 | | |
| DQS | Legacy_DQS2 | Legacy_DQS2 | Legacy_DQS2 | | |
| RE | Legacy_RE1 | Legacy_RE1 | Legacy_RE1 | | |

FeatureData

| | Memory controller | NAND chip A | NAND chip B | NAND chip C | NAND chip D |
|---|---|---|---|---|---|
| DQ | LVSTL_IN1 | LVSTL_IN1, Terminate | | | |
| DQS | LVSTL_DQS1 | LVSTL_DQS1, Terminate | | | |
| RE | Fixed at L | | | | |

DataOutput

| | Memory controller | NAND chip A | NAND chip B | NAND chip C | NAND chip D |
|---|---|---|---|---|---|
| DQ | LVSTL_IN2, Terminate | LVSTL_IN2 | | | |
| DQS | LVSTL_DQS2, Terminate | LVSTL_DQS2 | | | |
| RE | LVSTL_RE1 | LVSTL_RE1, Terminate | | | |

DataInput

| | Memory controller | NAND chip A | NAND chip B | NAND chip C | NAND chip D |
|---|---|---|---|---|---|
| DQ | LVSTL_IN1 | LVSTL_IN1, Terminate | | | |
| DQS | LVSTL_DQS1 | LVSTL_DQS1, Terminate | | | |
| RE | Fixed at L | | | | |

F I G. 19

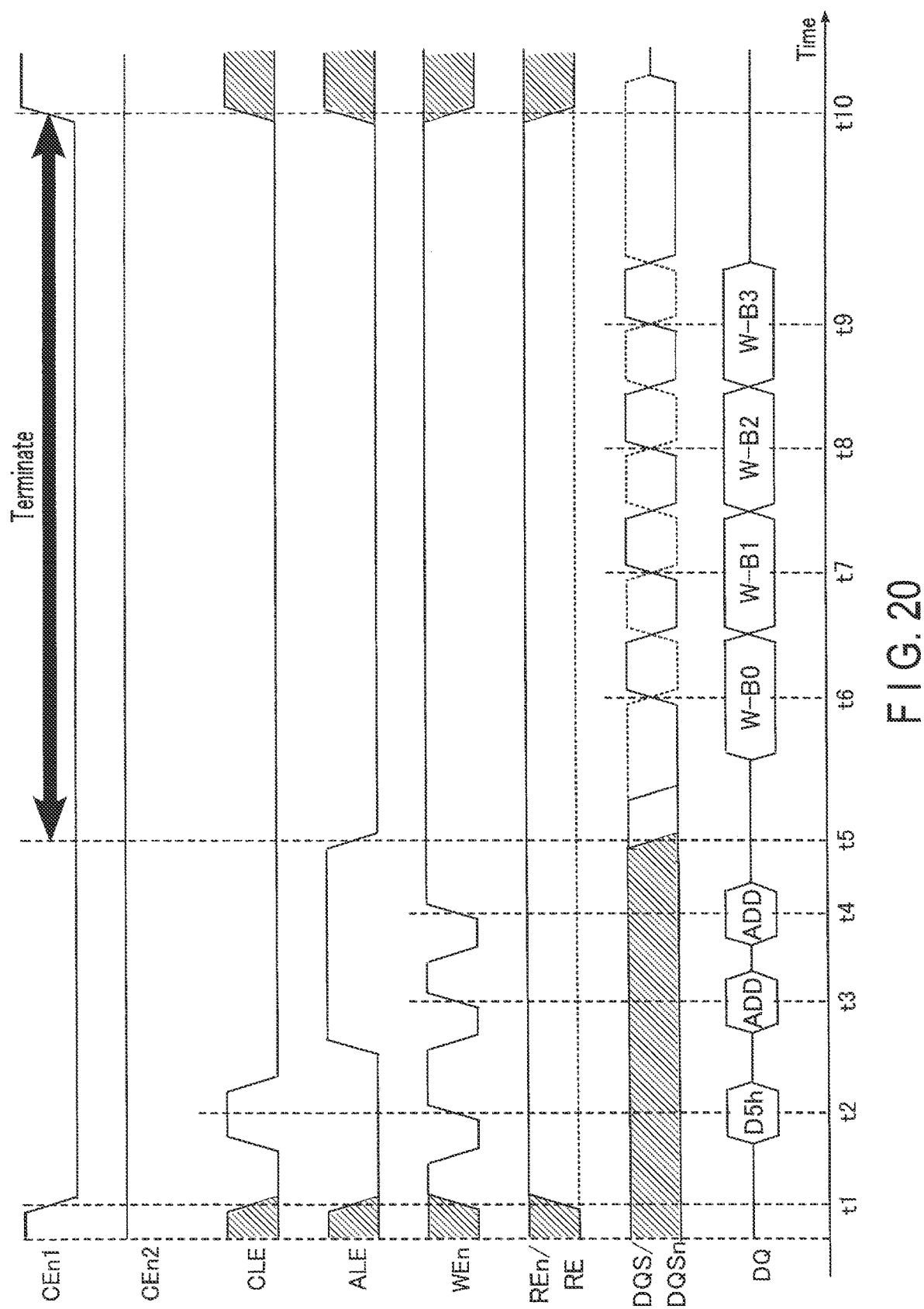
F I G. 20

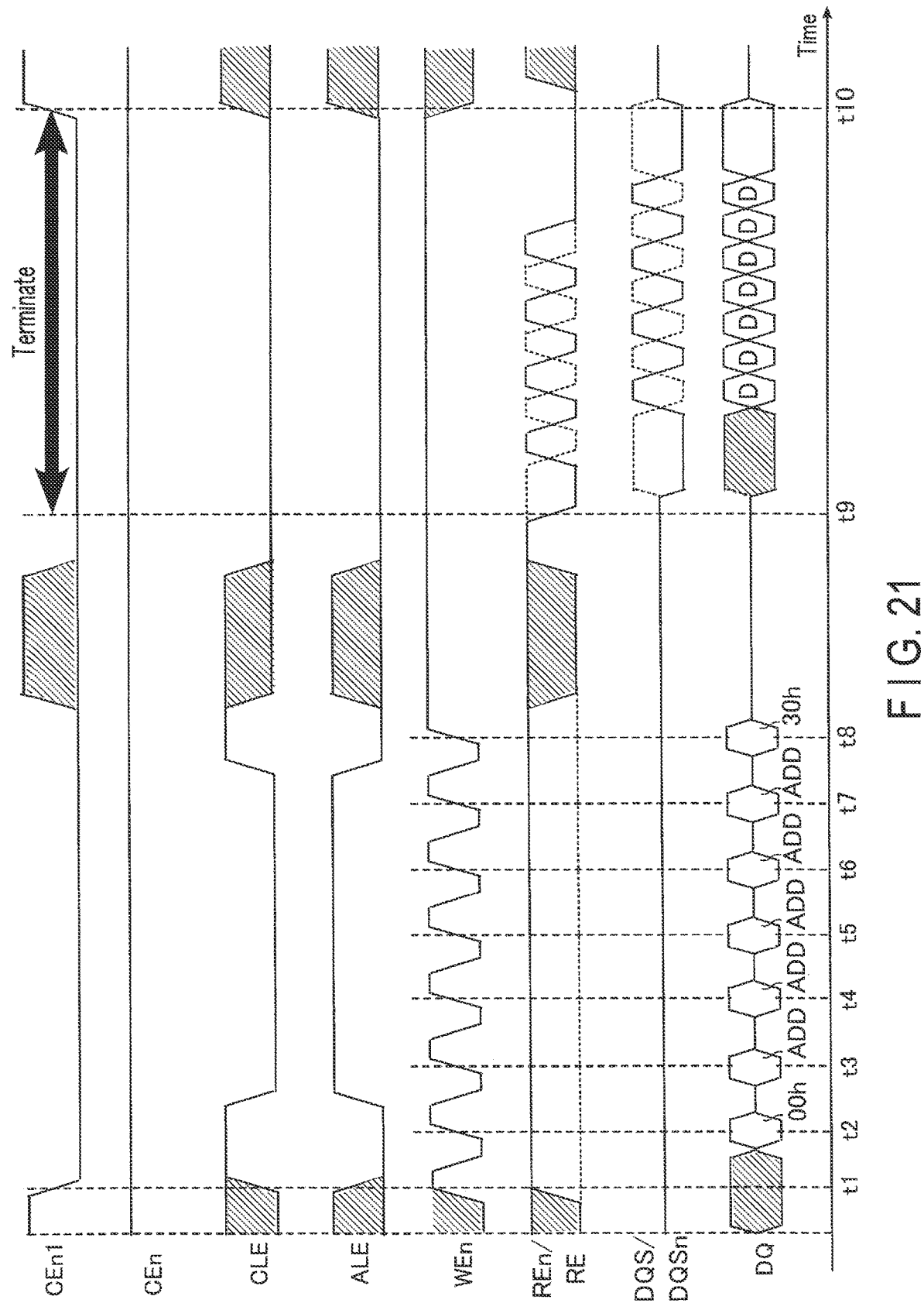
F I G. 21

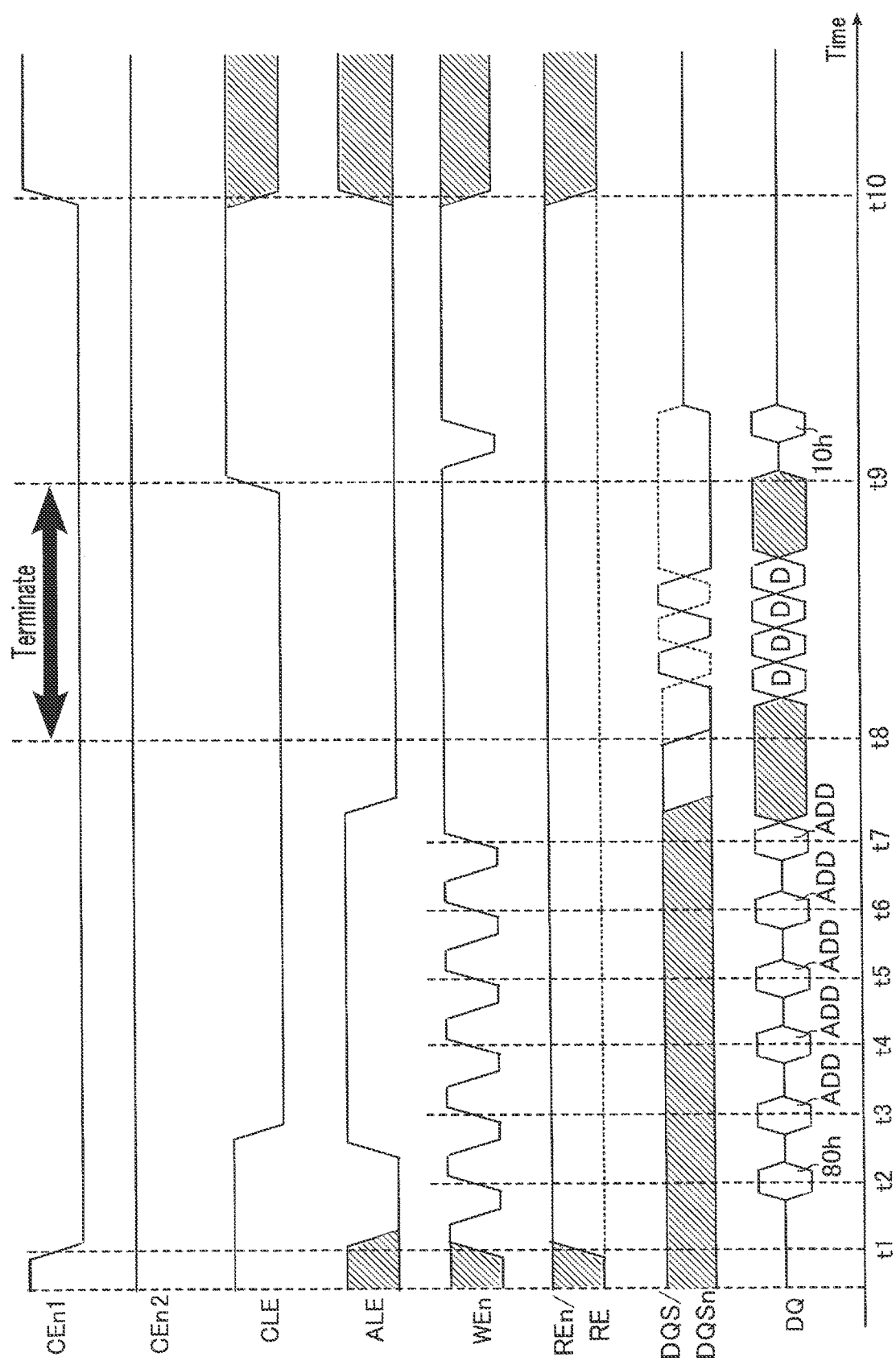
F I G. 22

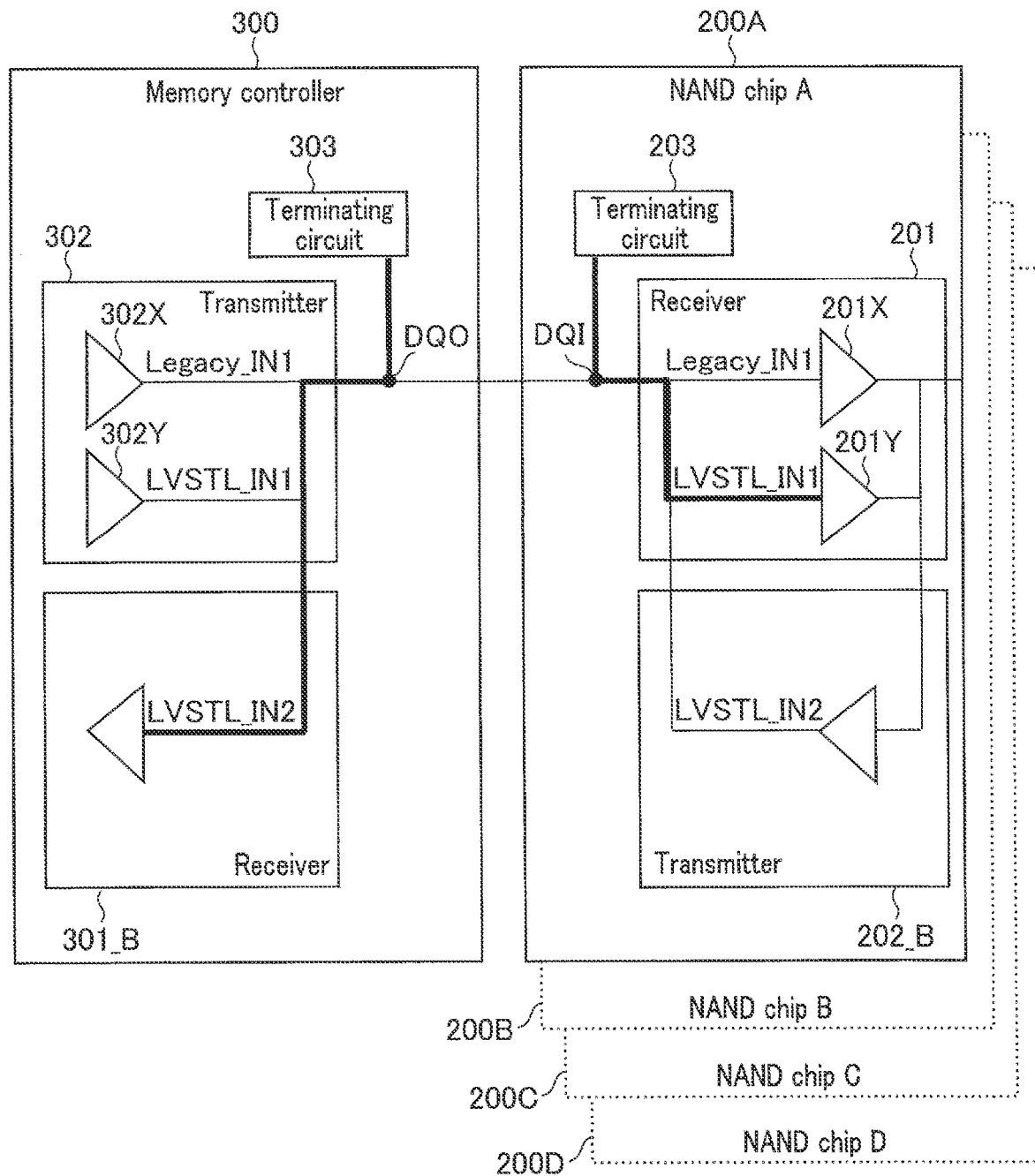
F I G. 25

Command & address

| | Memory controller | NAND chip A | NAND chip B | NAND chip C | NAND chip D |
|---|---|---|---|---|---|
| DQ | Legacy_IN1 | Legacy_IN1 | Legacy_IN1 | | |
| DQS | Fixed at L | | | | |
| RE | Fixed at L | | | | |

Status

| | Memory controller | NAND chip A | NAND chip B | NAND chip C | NAND chip D |
|---|---|---|---|---|---|
| DQ | LVSTL_IN2, Terminate | LVSTL_IN2 | LVSTL_IN2 | | |
| DQS | LVSTL_DQS2, Terminate | LVSTL_DQS2 | LVSTL_DQS2 | | |
| RE | LVSTL_RE1 | LVSTL_RE1, Terminate | Legacy_RE1 | | |

Parallel status

| | Memory controller | NAND chip A | NAND chip B | NAND chip C | NAND chip D |
|---|---|---|---|---|---|
| DQ | LVSTL_IN2, Terminate | LVSTL_IN2 | LVSTL_IN2 | | |
| DQS | LVSTL_DQS2, Terminate | LVSTL_DQS2 | LVSTL_DQS2 | | |
| RE | Legacy_RE1 | LVSTL_RE1, Terminate | Legacy_RE1 | | |

FeatureData

| | Memory controller | NAND chip A | NAND chip B | NAND chip C | NAND chip D |
|---|---|---|---|---|---|
| DQ | LVSTL_IN1 | LVSTL_IN1, Terminate | LVSTL_IN1, Terminate | | |
| DQS | LVSTL_DQS1 | LVSTL_DQS1, Terminate | LVSTL_DQS1, Terminate | | |
| RE | Fixed at L | | | | |

DataOutput

| | Memory controller | NAND chip A | NAND chip B | NAND chip C | NAND chip D |
|---|---|---|---|---|---|
| DQ | LVSTL_IN2, Terminate | LVSTL_IN2 | LVSTL_IN2 | | |
| DQS | LVSTL_DQS2, Terminate | LVSTL_DQS2 | LVSTL_DQS2 | | |
| RE | LVSTL_RE1 | LVSTL_RE1, Terminate | Legacy_RE1 | | |

DataInput

| | Memory controller | NAND chip A | NAND chip B | NAND chip C | NAND chip D |
|---|---|---|---|---|---|
| DQ | LVSTL_IN1 | LVSTL_IN1, Terminate | LVSTL_IN1, Terminate | | |
| DQS | LVSTL_DQS1 | LVSTL_DQS1, Terminate | LVSTL_DQS1, Terminate | | |
| RE | Fixed at L | | | | |

F I G. 26

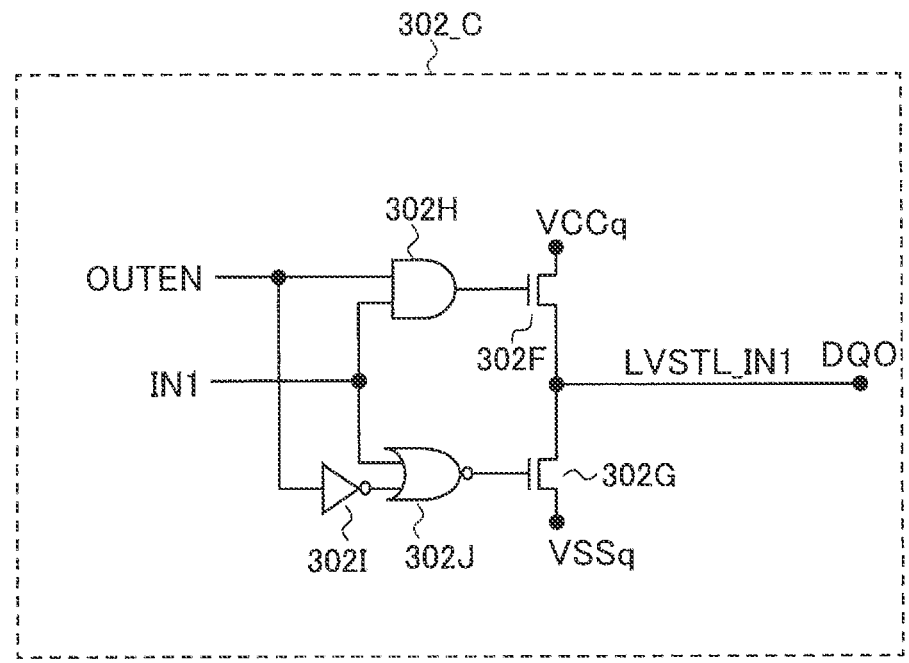
F I G. 28
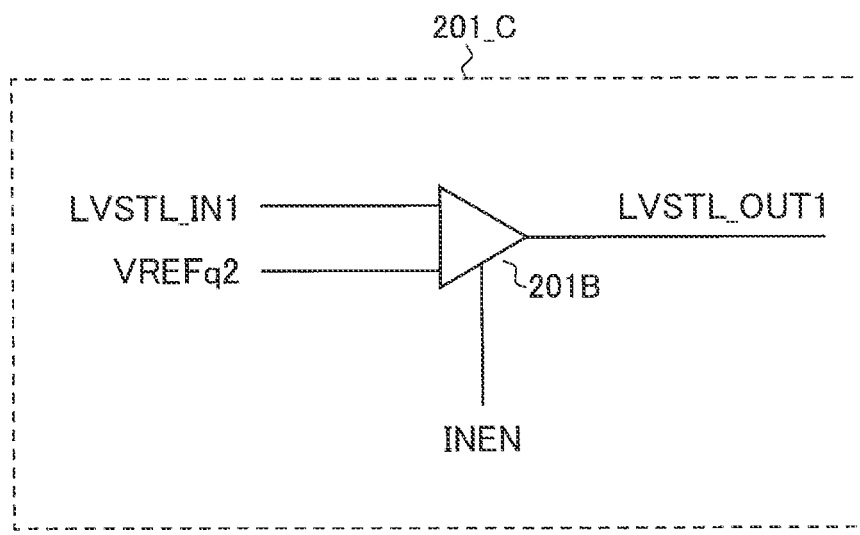
F I G. 29

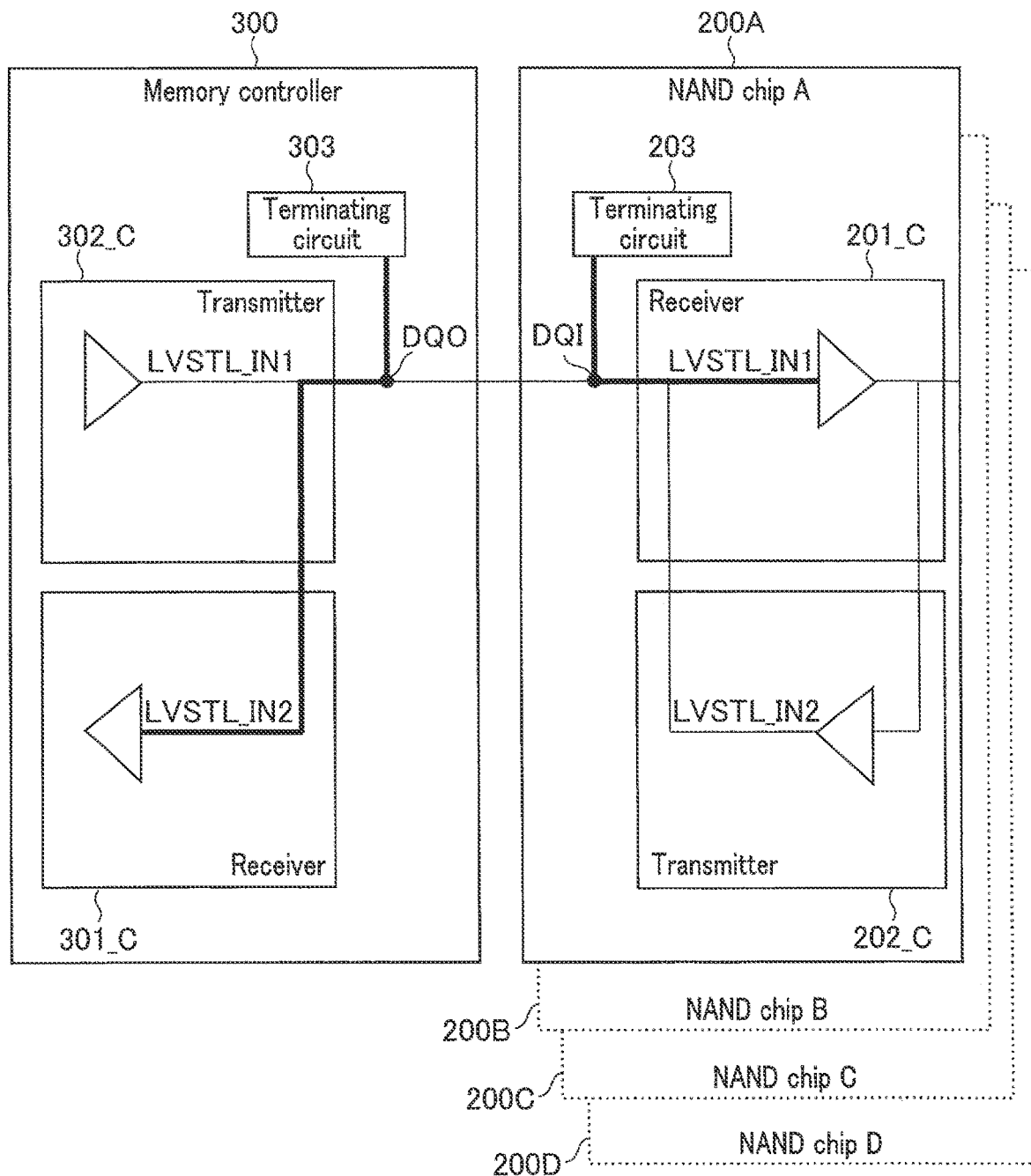
F I G. 30

Command & address

|  | Memory controller | NAND chip A | NAND chip B | NAND chip C | NAND chip D |
|---|---|---|---|---|---|
| DQ | LVSTL_IN1 | LVSTL_IN1, Terminate | | | |
| DQS | Fixed at L | | | | |
| RE | Fixed at L | | | | |

Status

|  | Memory controller | NAND chip A | NAND chip B | NAND chip C | NAND chip D |
|---|---|---|---|---|---|
| DQ | LVSTL_IN2, Terminate | LVSTL_IN2 | | | |
| DQS | LVSTL_DQS2, Terminate | LVSTL_DQS2 | | | |
| RE | LVSTL_RE1 | LVSTL_RE1, Terminate | | | |

Parallel status

|  | Memory controller | NAND chip A | NAND chip B | NAND chip C | NAND chip D |
|---|---|---|---|---|---|
| DQ | LVSTL_IN2, Terminate | LVSTL_IN2 | LVSTL_IN2 | | |
| DQS | LVSTL_DQS2, Terminate | LVSTL_DQS2 | LVSTL_DQS2 | | |
| RE | LVSTL_RE1 | LVSTL_RE1, Terminate | LVSTL_RE1 | | |

FeatureData

|  | Memory controller | NAND chip A | NAND chip B | NAND chip C | NAND chip D |
|---|---|---|---|---|---|
| DQ | LVSTL_IN1 | LVSTL_IN1, Terminate | | | |
| DQS | LVSTL_DQS1 | LVSTL_DQS1, Terminate | | | |
| RE | Fixed at L | | | | |

DataOutput

|  | Memory controller | NAND chip A | NAND chip B | NAND chip C | NAND chip D |
|---|---|---|---|---|---|
| DQ | LVSTL_IN2, Terminate | LVSTL_IN2 | | | |
| DQS | LVSTL_DQS2, Terminate | LVSTL_DQS2 | | | |
| RE | LVSTL_RE1 | LVSTL_RE1, Terminate | | | |

DataInput

|  | Memory controller | NAND chip A | NAND chip B | NAND chip C | NAND chip D |
|---|---|---|---|---|---|
| DQ | LVSTL_IN1 | LVSTL_IN1, Terminate | | | |
| DQS | LVSTL_DQS1 | LVSTL_DQS1, Terminate | | | |
| RE | Fixed at L | | | | |

F I G. 31

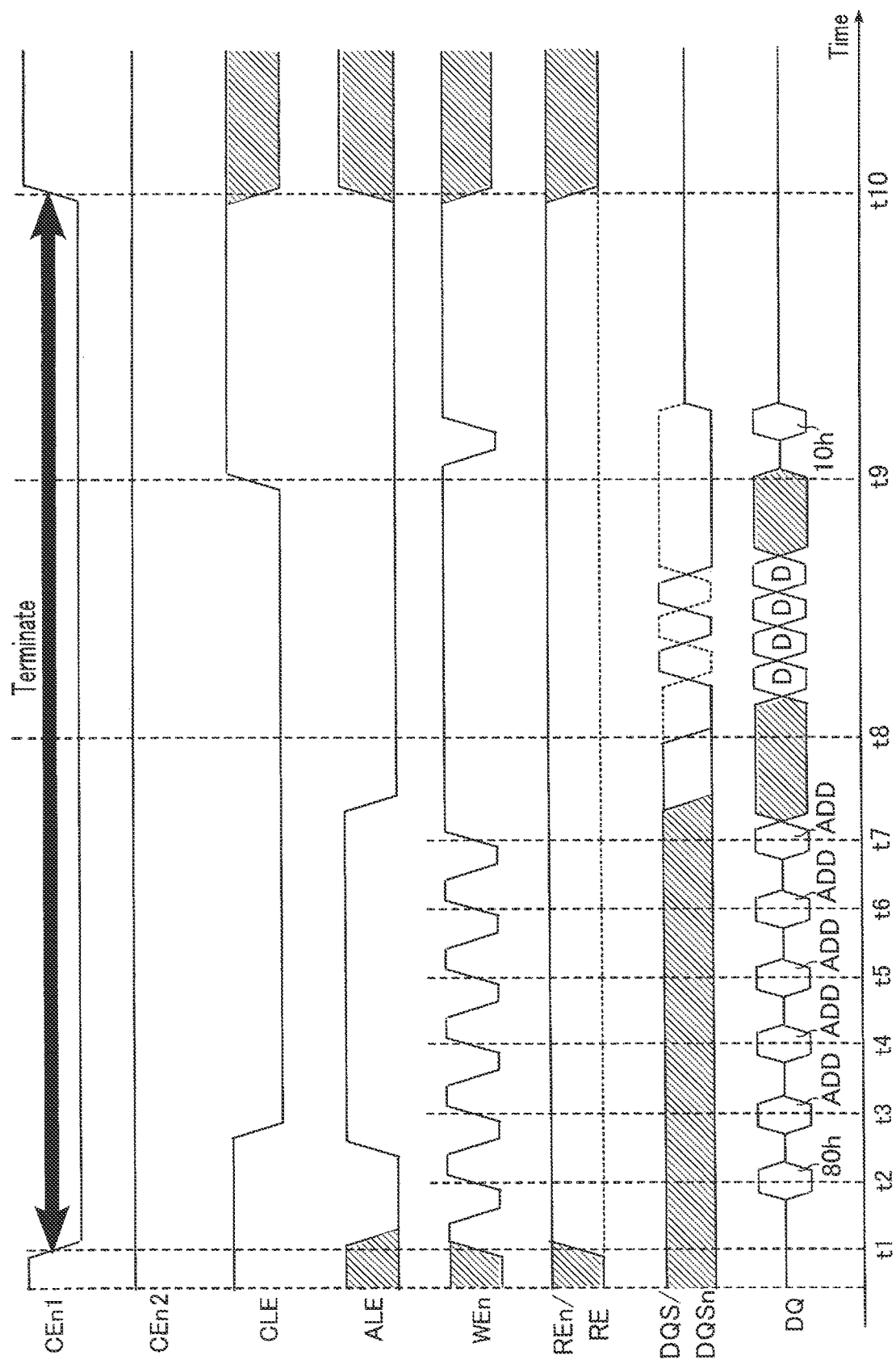
F I G. 32

Command & address

| | Memory controller | NAND chip A | NAND chip B | NAND chip C | NAND chip D |
|---|---|---|---|---|---|
| DQ | Legacy_IN1 | | Legacy_IN1 | | |
| DQS | Fixed at L | | | | |
| RE | Fixed at L | | | | |

Status

| | Memory controller | NAND chip A | NAND chip B | NAND chip C | NAND chip D |
|---|---|---|---|---|---|
| DQ | Legacy_IN2 | Legacy_IN2 | | | |
| DQS | Legacy_DQS2 | Legacy_DQS2 | | | |
| RE | Legacy_RE1 | Legacy_RE1 | | | |

Parallel status

| | Memory controller | NAND chip A | NAND chip B | NAND chip C | NAND chip D |
|---|---|---|---|---|---|
| DQ | Legacy_IN2 | Legacy_IN2 | Legacy_IN2 | | |
| DQS | Legacy_DQS2 | Legacy_DQS2 | Legacy_DQS2 | | |
| RE | Legacy_RE1 | Legacy_RE1 | Legacy_RE1 | | |

FeatureData

| | Memory controller | NAND chip A | NAND chip B | NAND chip C | NAND chip D |
|---|---|---|---|---|---|
| DQ | LVSTL_IN1 | LVSTL_IN1 | | Terminate | |
| DQS | LVSTL_DQS1 | LVSTL_DQS1 | | Terminate | |
| RE | Fixed at L | | | | |

DataOutput

| | Memory controller | NAND chip A | NAND chip B | NAND chip C | NAND chip D |
|---|---|---|---|---|---|
| DQ | LVSTL_IN2 | LVSTL_IN2 | | Terminate | |
| DQS | LVSTL_DQS2 | LVSTL_DQS2 | | Terminate | |
| RE | LVSTL_RE1 | LVSTL_RE1 | | Terminate | |

DataInput

| | Memory controller | NAND chip A | NAND chip B | NAND chip C | NAND chip D |
|---|---|---|---|---|---|
| DQ | LVSTL_IN1 | LVSTL_IN1 | | Terminate | |
| DQS | LVSTL_DQS1 | LVSTL_DQS1 | | Terminate | |
| RE | Fixed at L | | | | |

F I G. 37

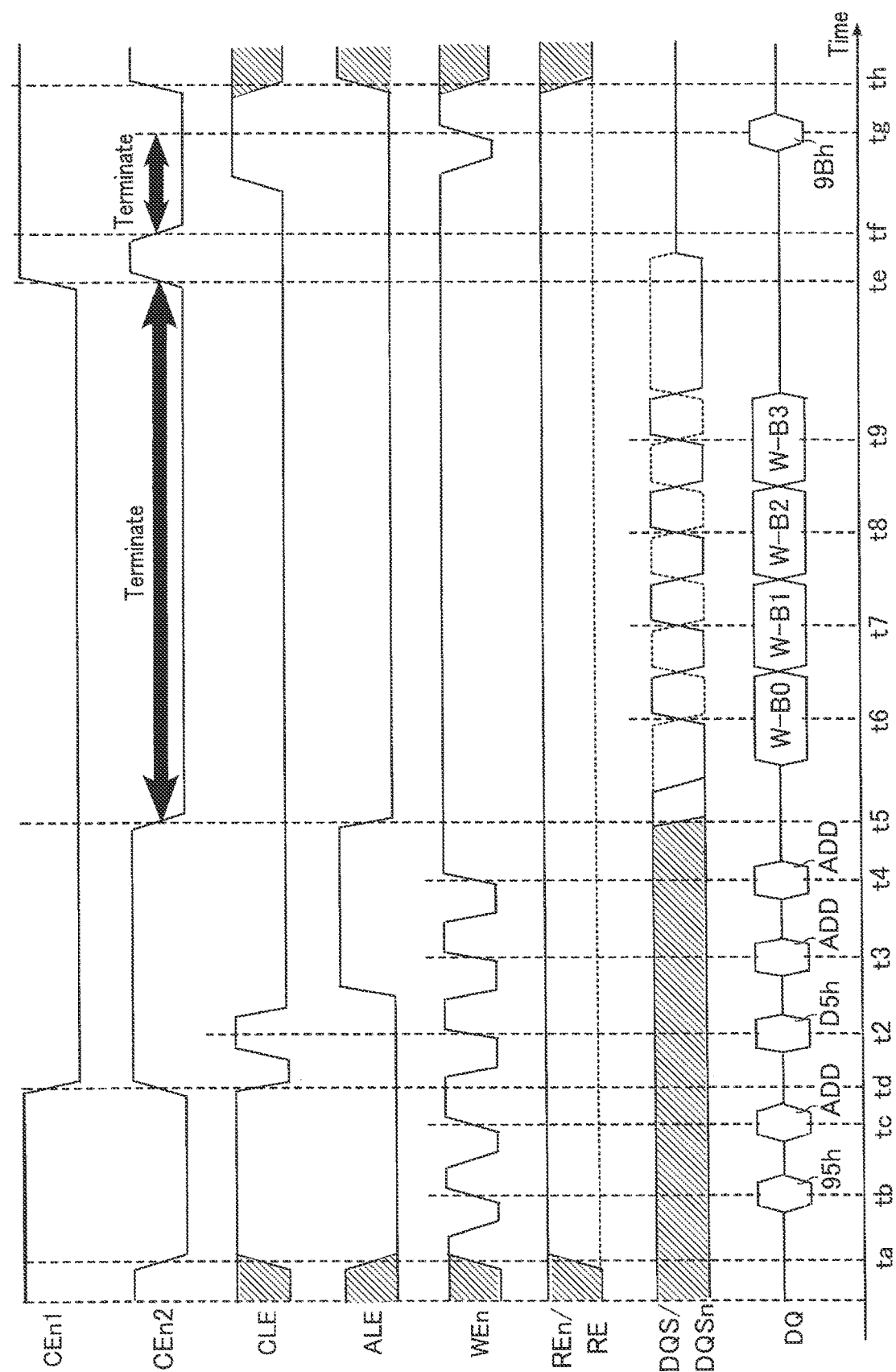
F I G. 38

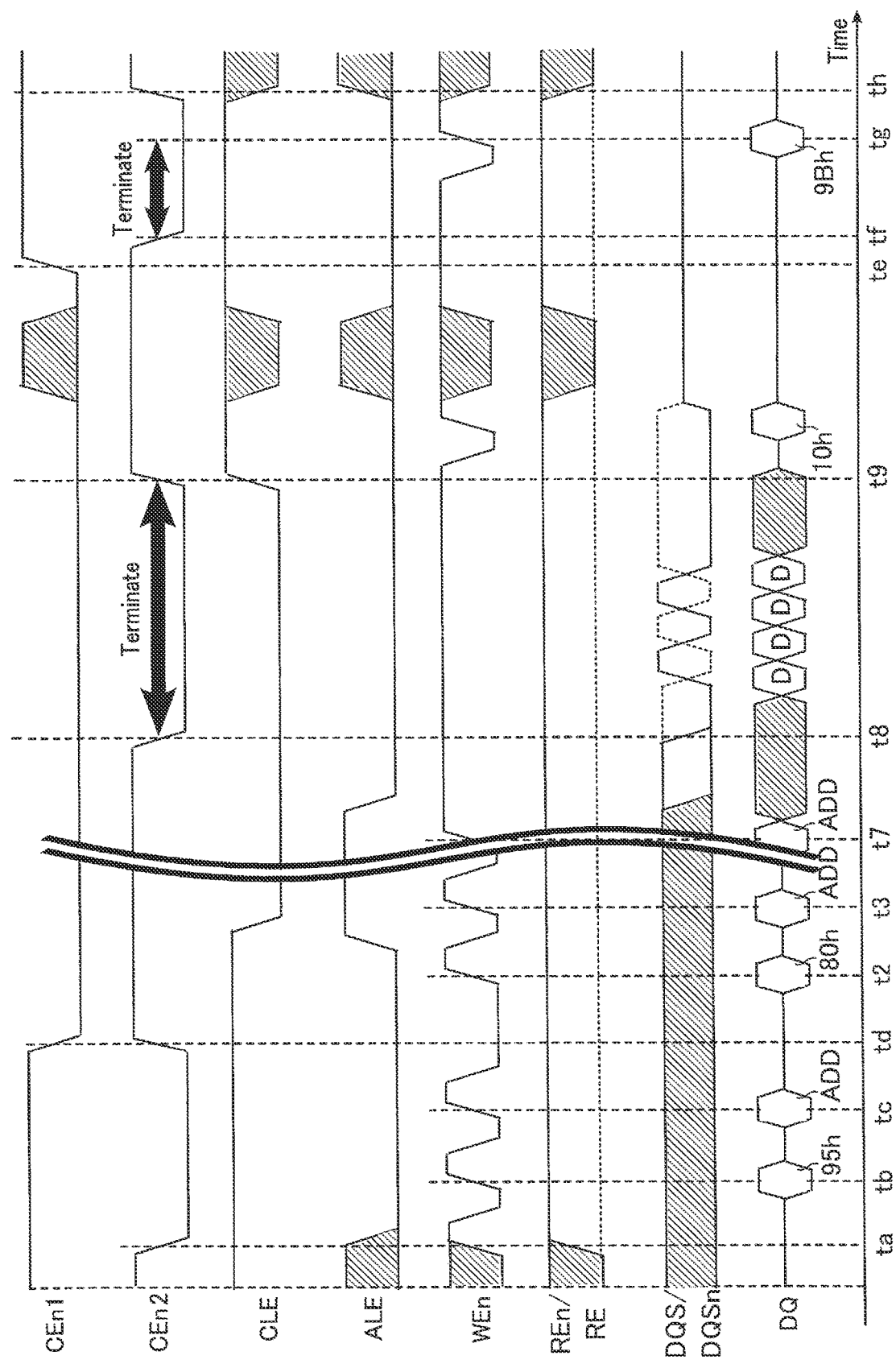
F I G. 40

Command & address

| | Memory controller | NAND chip A | NAND chip B | NAND chip C | NAND chip D |
|---|---|---|---|---|---|
| DQ | Legacy_IN1 | Legacy_IN1 | Legacy_IN1 | | |
| DQS | Fixed at L | | | | |
| RE | Fixed at L | | | | |

Status

| | Memory controller | NAND chip A | NAND chip B | NAND chip C | NAND chip D |
|---|---|---|---|---|---|
| DQ | LVSTL_IN2 | LVSTL_IN2 | | Terminate | |
| DQS | LVSTL_DQS2 | LVSTL_DQS2 | | Terminate | |
| RE | LVSTL_RE1 | LVSTL_RE1 | | Terminate | |

Parallel status

| | Memory controller | NAND chip A | NAND chip B | NAND chip C | NAND chip D |
|---|---|---|---|---|---|
| DQ | LVSTL_IN2 | LVSTL_IN2 | LVSTL_IN2 | Terminate | |
| DQS | LVSTL_DQS2 | LVSTL_DQS2 | LVSTL_DQS2 | Terminate | |
| RE | LVSTL_RE1 | LVSTL_RE1 | LVSTL_RE1 | Terminate | |

FeatureData

| | Memory controller | NAND chip A | NAND chip B | NAND chip C | NAND chip D |
|---|---|---|---|---|---|
| DQ | LVSTL_IN1 | LVSTL_IN1 | | Terminate | |
| DQS | LVSTL_DQS1 | LVSTL_DQS1 | | Terminate | |
| RE | Fixed at L | | | | |

DataOutput

| | Memory controller | NAND chip A | NAND chip B | NAND chip C | NAND chip D |
|---|---|---|---|---|---|
| DQ | LVSTL_IN2 | LVSTL_IN2 | | Terminate | |
| DQS | LVSTL_DQS2 | LVSTL_DQS2 | | Terminate | |
| RE | LVSTL_RE1 | LVSTL_RE1 | | Terminate | |

DataInput

| | Memory controller | NAND chip A | NAND chip B | NAND chip C | NAND chip D |
|---|---|---|---|---|---|
| DQ | LVSTL_IN1 | LVSTL_IN1 | | Terminate | |
| DQS | LVSTL_DQS1 | LVSTL_DQS1 | | Terminate | |
| RE | Fixed at L | | | | |

F I G. 42

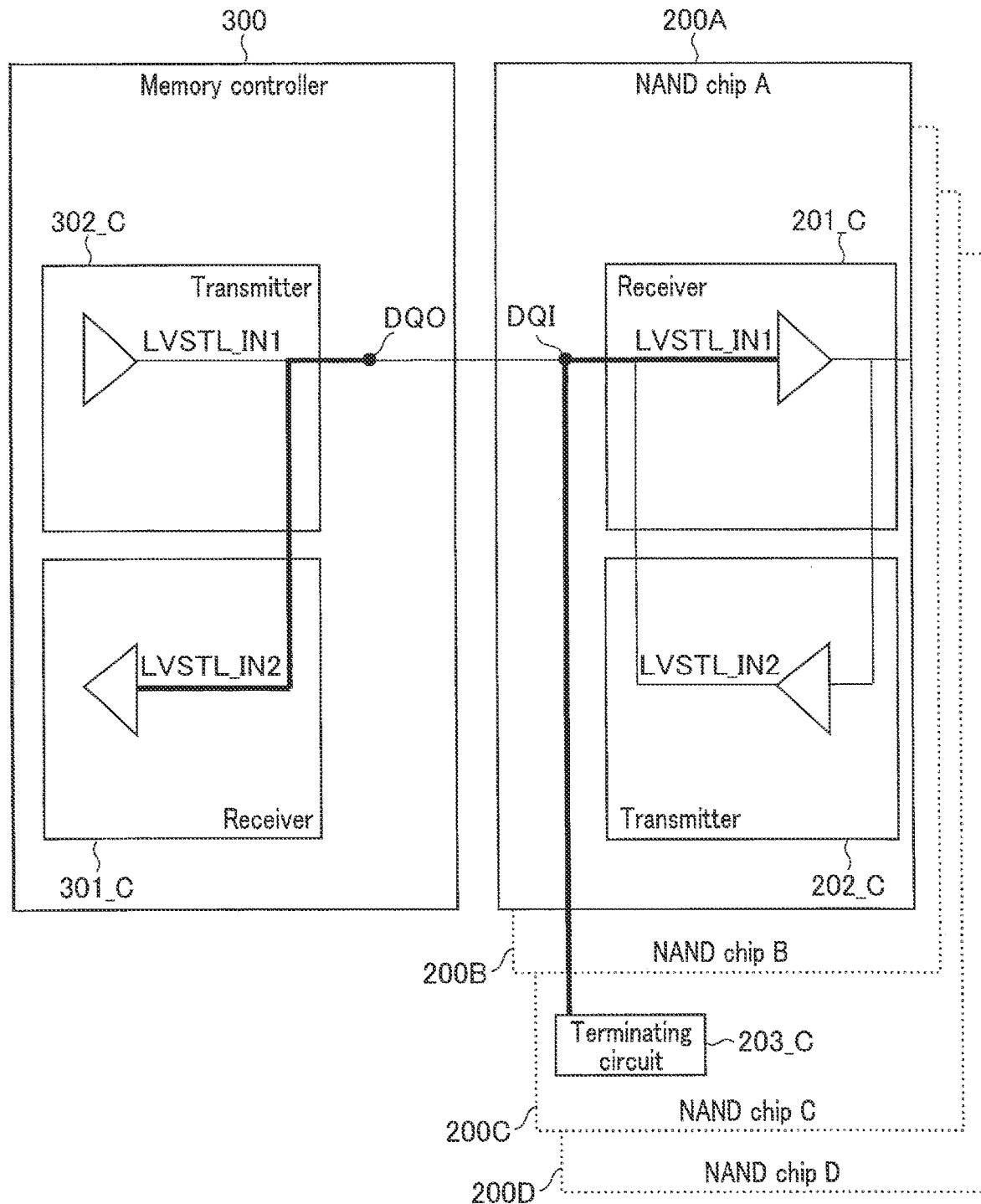
F I G. 44

Command & address

| | Memory controller | NAND chip A | NAND chip B | NAND chip C | NAND chip D |
|---|---|---|---|---|---|
| DQ | LVSTL_IN1 | LVSTL_IN1 | LVSTL_IN1 | Terminate | |
| DQS | floating | | | Terminate | |
| RE | floating | | | Terminate | |

Status

| | Memory controller | NAND chip A | NAND chip B | NAND chip C | NAND chip D |
|---|---|---|---|---|---|
| DQ | LVSTL_IN2 | LVSTL_IN2 | | Terminate | |
| DQS | LVSTL_DQS2 | LVSTL_DQS2 | | Terminate | |
| RE | LVSTL_RE1 | LVSTL_RE1 | | Terminate | |

Parallel status

| | Memory controller | NAND chip A | NAND chip B | NAND chip C | NAND chip D |
|---|---|---|---|---|---|
| DQ | LVSTL_IN2 | LVSTL_IN2 | LVSTL_IN2 | Terminate | |
| DQS | LVSTL_DQS2 | LVSTL_DQS2 | LVSTL_DQS2 | Terminate | |
| RE | LVSTL_RE1 | LVSTL_RE1 | LVSTL_RE1 | Terminate | |

FeatureData

| | Memory controller | NAND chip A | NAND chip B | NAND chip C | NAND chip D |
|---|---|---|---|---|---|
| DQ | LVSTL_IN1 | LVSTL_IN1 | | Terminate | |
| DQS | LVSTL_DQS1 | LVSTL_DQS1 | | Terminate | |
| RE | floating | | | Terminate | |

DataOutput

| | Memory controller | NAND chip A | NAND chip B | NAND chip C | NAND chip D |
|---|---|---|---|---|---|
| DQ | LVSTL_IN2 | LVSTL_IN2 | | Terminate | |
| DQS | LVSTL_DQS2 | LVSTL_DQS2 | | Terminate | |
| RE | LVSTL_RE1 | LVSTL_RE1 | | Terminate | |

DataInput

| | Memory controller | NAND chip A | NAND chip B | NAND chip C | NAND chip D |
|---|---|---|---|---|---|
| DQ | LVSTL_IN1 | LVSTL_IN1 | | Terminate | |
| DQS | LVSTL_DQS1 | LVSTL_DQS1 | | Terminate | |
| RE | floating | | | Terminate | |

F I G. 45

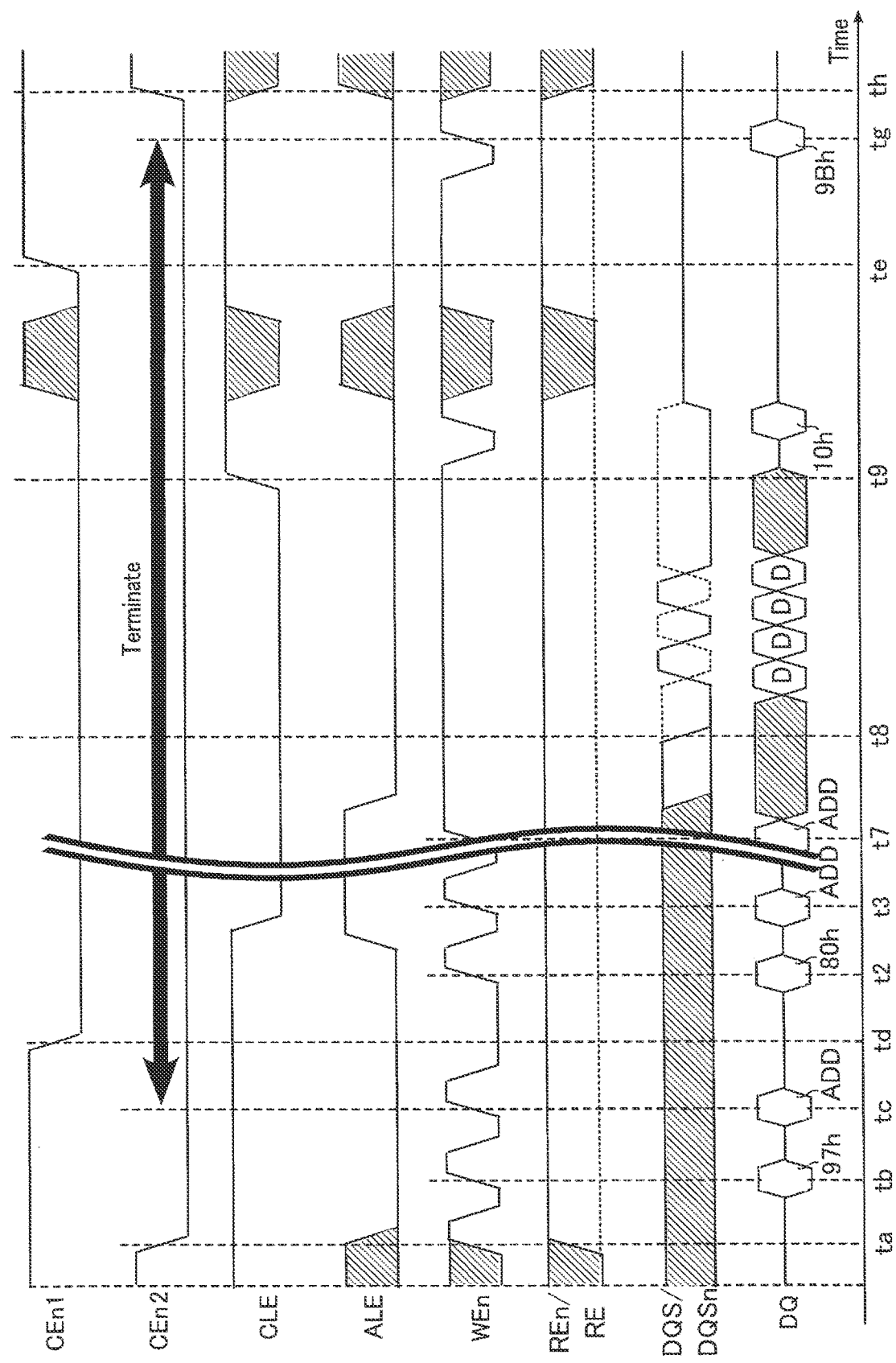
F I G. 46

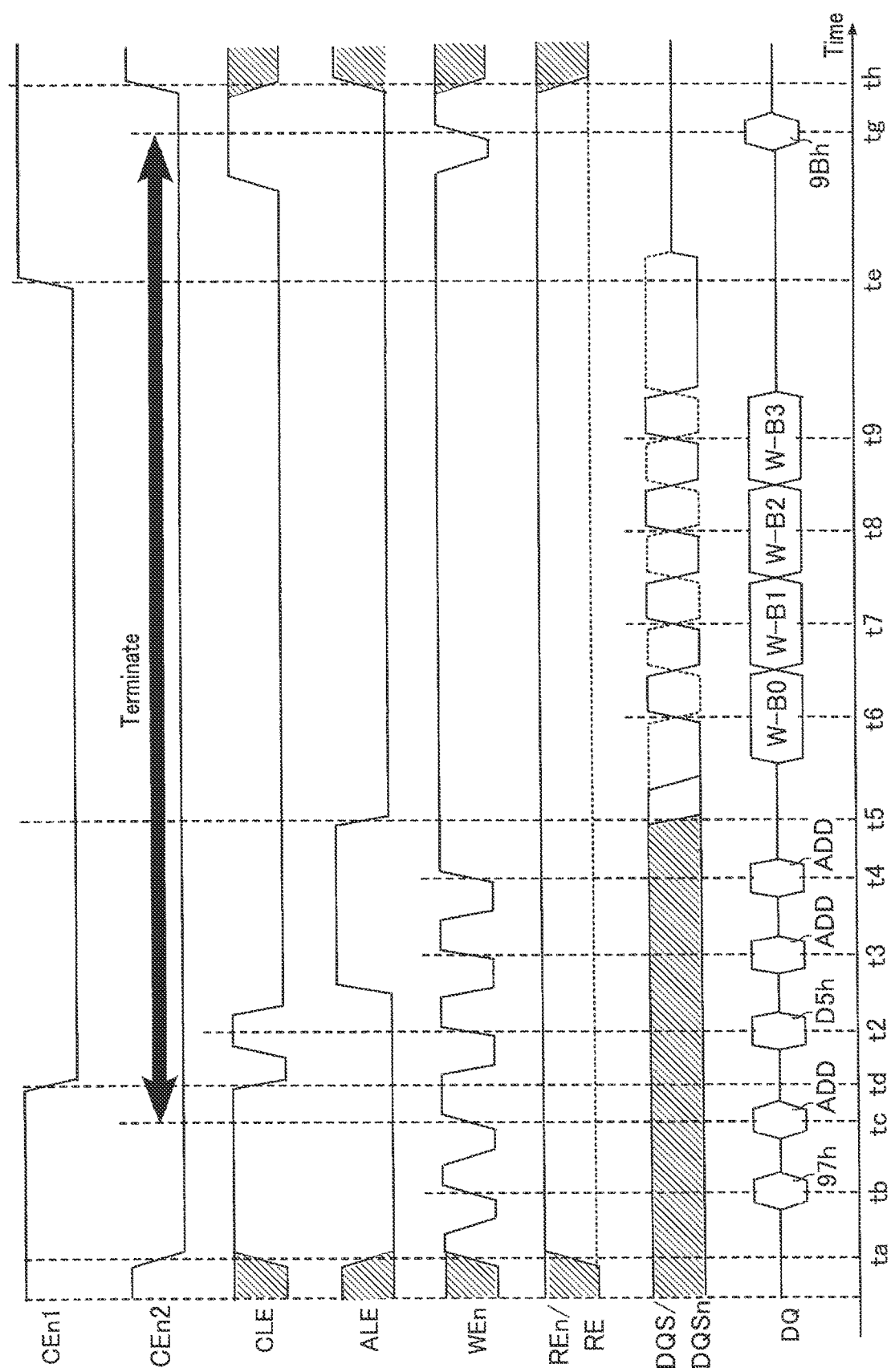
F I G. 48

SEMICONDUCTOR MEMORY DEVICE AND MEMORY SYSTEM

CROSS-REFERENCE TO RELATED APPLICATIONS

This application is a Continuation application of PCT Application No. PCT/JP2020/035698, filed Sep. 23, 2020, the entire contents of which are incorporated herein by reference.

FIELD

Embodiments relate generally to a semiconductor memory device.

BACKGROUND

A NAND flash memory capable of storing data in a non-volatile manner is known.

BRIEF DESCRIPTION OF THE DRAWINGS

FIG. 2 is a block diagram showing an exemplary configuration of a semiconductor memory device 200 according to the first embodiment.

FIG. 3 shows functional blocks of a NAND chip A 200A according to the first embodiment and their related elements.

FIG. 5 is a block diagram showing an exemplary configuration of a memory controller 300 according to the first embodiment.

FIG. 9 is a circuit diagram showing an exemplary configuration of a transmitter 302 for the semiconductor memory device 200 according to the first embodiment.

FIG. 10 is a circuit diagram showing an exemplary configuration of a transmitter 202 for the semiconductor memory device 200 according to the first embodiment.

FIG. 11 is a circuit diagram showing an exemplary configuration of a transmitter for the semiconductor memory device 200 according to the first embodiment.

FIG. 12 is a circuit diagram showing an exemplary configuration of a transmitter for the semiconductor memory device 200 according to the first embodiment.

FIG. 14 is a circuit diagram showing an exemplary configuration of a receiver 201 for the semiconductor memory device 200 according to the first embodiment.

FIG. 15 is a circuit diagram showing an exemplary configuration of a differential amplifier circuit 201A in the receiver 201 according to the first embodiment.

FIG. 16 is a circuit diagram showing an exemplary configuration of a receiver for the semiconductor memory device 200 according to the first embodiment.

FIG. 18 illustrates a mode of terminating a signal DQ in the semiconductor memory device 200 and the memory controller 300 according to the first embodiment.

FIG. 19 sets forth, as one example, transmission and reception modes and termination modes for signals DQ, DQS, and RE.

FIG. 20 is one exemplary timing chart for signals in a memory system 100 according to the first embodiment.

FIG. 21 is one exemplary timing chart for signals in the memory system 100 according to the first embodiment.

FIG. 22 is one exemplary timing chart for signals in the memory system 100 according to the first embodiment.

FIG. 25 illustrates a mode of terminating a signal DQ in the semiconductor memory device 200 and a memory controller 300 according to the second embodiment.

FIG. 26 sets forth, as one example, transmission and reception modes and termination modes for signals DQ, DQS, and RE.

FIG. 28 is a circuit diagram showing an exemplary configuration of a transmitter 302_C for a semiconductor memory device 200 according to a third embodiment.

FIG. 29 is a circuit diagram showing an exemplary configuration of a receiver 201_C for the semiconductor memory device 200 according to the third embodiment.

FIG. 30 illustrates a mode of terminating a signal DQ in the semiconductor memory device 200 and a memory controller 300 according to the third embodiment.

FIG. 31 sets forth, as one example, transmission and reception modes and termination modes for signals DQ, DQS, and RE.

FIG. 32 is one exemplary timing chart for signals in a memory system 100 according to the third embodiment.

FIG. 37 sets forth, as one example, transmission and reception modes and termination modes for signals DQ, DQS, and RE.

FIG. 38 is one exemplary timing chart for signals in a memory system 100 according to the fourth embodiment.

FIG. 40 is one exemplary timing chart for signals in the memory system 100 according to the fourth embodiment.

FIG. 42 sets forth, as one example, transmission and reception modes and termination modes for signals DQ, DQS, and RE.

FIG. 44 illustrates a mode of terminating a signal DQ in a semiconductor memory device 200 and a memory controller 300 according to a sixth embodiment.

FIG. 45 sets forth, as one example, transmission and reception modes and termination modes for signals DQ, DQS, and RE.

FIG. 46 is one exemplary timing chart for signals in a memory system 100 according to the sixth embodiment.

FIG. 48 is one exemplary timing chart for signals in the memory system 100 according to the sixth embodiment.

DETAILED DESCRIPTION

In general, according to one embodiment, a semiconductor memory device includes a first pin, a first receiving circuit, and a first terminating circuit. The first pin receives a first signal and a second signal having a smaller amplitude than the first signal. The first receiving circuit is connected to the first pin and outputs, based on a comparison between the first signal and a first voltage, a third signal. The first receiving circuit also outputs, based on a comparison between the second signal and a second voltage, a fourth signal having a smaller amplitude than the third signal. The first terminating circuit is connected to the first pin. The first terminating circuit is disabled if the first pin receives the first signal, and enabled if the first pin receives the second signal.

Embodiments will be described with reference to the drawings. Each embodiment will illustrate devices and methods for embodying the technical idea of the invention by way of example. The drawings are schematic or conceptual and may not use dimensions, scales, etc., conforming to actual products. Unless explicitly or self-explanatorily disclaimed, the entire description of an embodiment applies to other embodiments. The technical idea of the invention is not bound by particular component shapes, structures, arrangements, etc.

Note that the description will use the same reference signs for the elements or components having the same or substantially the same functions and configurations. Numerals may be added after reference sign-constituting characters in order to distinguish between elements that are denoted by reference signs of the same characters and that have substantially the same configurations. If it is not necessary to distinguish between elements denoted by reference signs of the same characters, the description will basically refer to each of such elements using the reference sign including only the characters.

(1) First Embodiment (1-1) Configurations (Structures)

A memory controller 300 and a semiconductor memory device 200 according to an embodiment will be described.

(1-1-1) Configurations of Memory System

Figure 1:
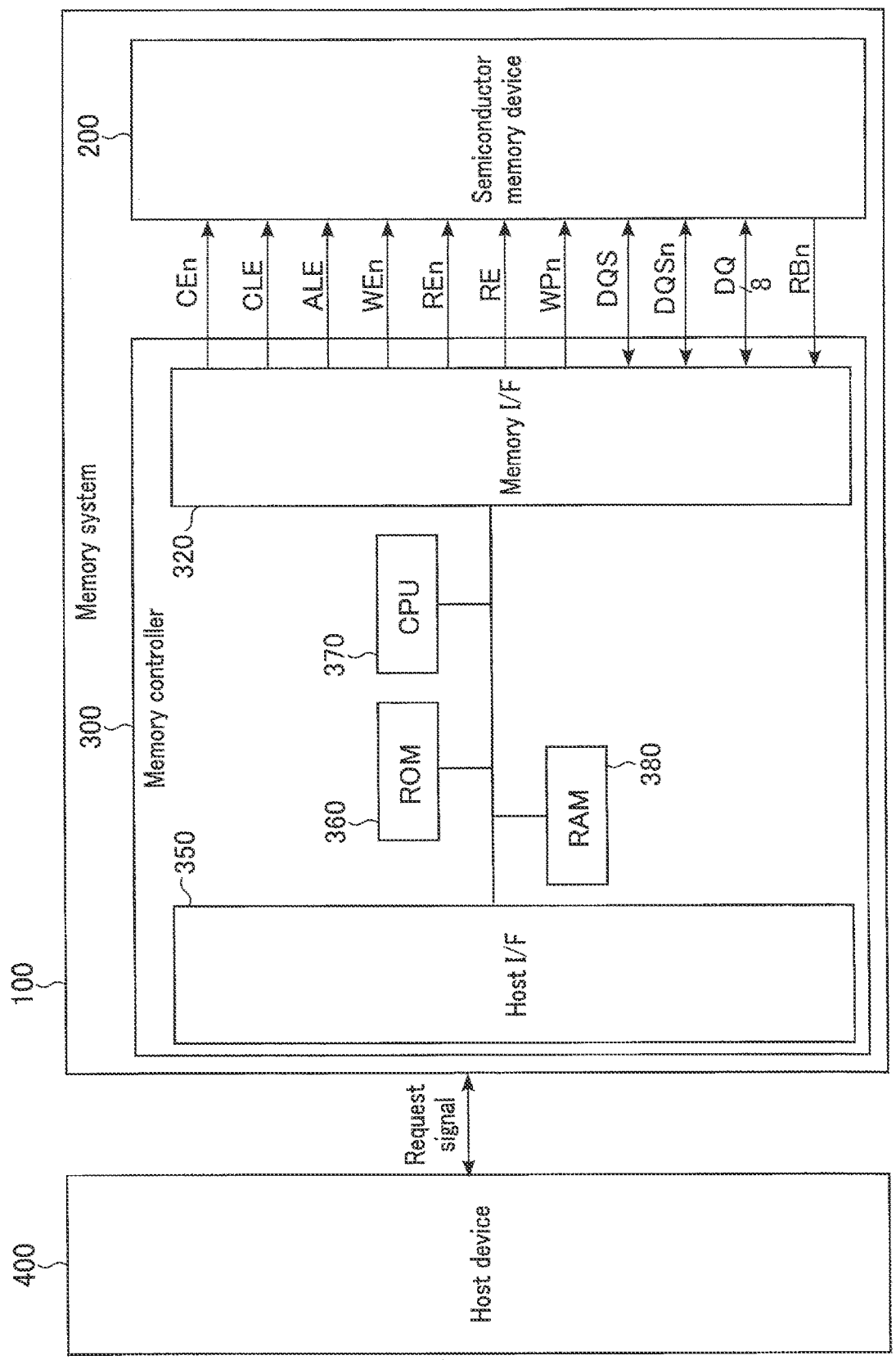
FIG. 1 is a block diagram schematically showing a system according to a first embodiment.

FIG. 1 is a block diagram schematically showing a system according to a first embodiment. As shown in FIG. 1, this memory system 100 includes, in one example, the memory controller 300 and the semiconductor memory device 200. The memory system 100 is controlled by a host device 400. The memory system 100 is, for example, a solid-state drive (SSD), a USB memory, or a memory card such as an SD card.

The semiconductor memory device 200 is not required to be a single member, but two or more semiconductor memory devices 200 may be provided. The semiconductor memory device 200 is a NAND flash memory capable of storing data in a non-volatile manner. The semiconductor memory device 200 is controlled by the memory controller 300.

The memory controller 300 receives a request signal from the host device 400 via a host bus. The type of the host bus, and also the request signal transmitted via the host bus, depend on an application to which the semiconductor memory device 200 is applied. In instances where the memory system 100 is an SSD, the host bus may be a serial attached SCSI (SAS), a serial ATA (SATA), or a programmable communications interface express (PCIe™). In instances where the memory system 100 is a universal serial bus (USB) memory, the host bus may be a USB. In instances where the memory system 100 is a multimedia card (MMC), the host bus may be an eMMC standard interface. In instances where the memory system 100 is an SD card, the host bus may be an SD memory standard interface.

The memory controller 300 controls the semiconductor memory device 200 according to the request signal received from the host device 400. To this end, the memory controller 300 is connected to the semiconductor memory device 200 via a NAND bus. The NAND bus transmits multiple control signals and an input/output signal DQ having an 8-bit width. The control signals include signals CEn, CLE, ALE, WEn, REn, RE, WPn, RBn, DQS, and DQSn. The NAND bus includes multiple interconnects for transferring the respective signals CEn, CLE, ALE, WEn, REn, RE, WPn, RBn, DQS, and DQSn. A letter "n" at the tail of the name of a signal indicates a logic inversion of the corresponding signal having the name without "n". It will be assumed that a signal with the letter "n" is in an asserted state if it is at the low level. These signals will be described in more detail later.

The memory controller 300 includes a host interface 350, a memory interface 320, a read only memory (ROM) 360, a central processing unit (CPU) 370, and a random access memory (RAM) 380. The CPU 370 executes firmware (a program or programs) stored in the ROM 360 and loaded into the RAM 380 so that the memory controller 300 performs various operations and some functions of the host interface 350 and the memory interface 320. The firmware is designed to cause the memory controller 300 to perform the operations described in the embodiments herein.

The host interface 350 is connected to the host device 400 via the host bus and controls communications between the memory controller 300 and the host device 400. The memory interface 320 is connected to the semiconductor memory device 200 via the NAND bus and controls communications between the memory controller 300 and the semiconductor memory device 200.

In one example, in instances where data is written to the semiconductor memory device 200 in response to a request signal from the host device 400, the memory controller 300 provides the data to the semiconductor memory device 200 via the interconnects for transmitting the input/output signal DQ. Also, in instances where data is read from the semiconductor memory device 200 as a response to the host device 400 for a request signal from the host device 400, the memory controller 300 receives the data read from the semiconductor memory device 200 via the interconnects for transmitting the input/output signal DQ.

FIG. 2 is a block diagram showing an exemplary configuration of the semiconductor memory device 200 according to the first embodiment. As shown in FIG. 2, the semiconductor memory device 200 in one example includes an I/F chip 250, a NAND chip A 200A, a NAND chip B 200B, a NAND chip C 200C, and a NAND chip D 200D. The number of NAND chips is not limited to four. Less than four NAND chips or four or more NAND chips may be used. The NAND chip A 200A, the NAND chip B 200B, the NAND chip C 200C, and the NAND chip D 200D are connected to a common data bus DB. The NAND chips are not required to be connected by a common data bus, and any configuration may be adopted as long as it connects multiple NAND chips to one data bus DB.

In one example, the signal CEn includes two signals, namely, a signal CEn1 and a signal CEn2. The number of signals CEn is not limited to two. Less than two signals CEn or two or more signals Cen may be used. In one example, the signal RBn includes two signals, namely, a signal RBn1 and a signal RBn2. The number of signals RBn is not limited to two. Less than two signals RBn or two or more signals RBn may be used.

The I/F chip 250 receives the signals CEn1, CEn2, CLE, ALE, WEn, REn, RE, WPn, DQS, DQSn, and DQ from the memory controller 300. The I/F chip 250 transmits the received signals CLE, ALE, WEn, REn, RE, WPn, DQS, DQSn, and DQ to the NAND chip A 200A, the NAND chip B 200B, the NAND chip C 200C, and the NAND chip D 200D. The I/F chip 250 transmits the received signal CEn1 to the NAND chip A 200A and the NAND chip B 200B. The I/F chip 250 transmits the received signal CEn2 to the NAND chip C 200C and the NAND chip D 200D.

The NAND chip A 200A and the NAND chip B 200B transmit the signal RBn1 to the memory controller 300. The NAND chip C 200C and the NAND chip D 200D transmit the signal RBn2 to the memory controller 300.

The signal CEn1 in an asserted state enables the NAND chip A 200A and the NAND chip B 200B. One of the NAND chip A 200A and the NAND chip B 200B is selected according to the signal CEn1 and an address ADD for NAND chip selection. The signal CEn2 in an asserted state enables the NAND chip C 200C and the NAND chip D 200D. One of the NAND chip C 200C and the NAND chip D 200D is selected according to the signal CEn2 and an address ADD for NAND chip selection. Data is written to one NAND chip selected from the NAND chip A 200A, the NAND chip B 200B, the NAND chip C 200C, and the NAND chip D 200D. In another instance, data is read from one NAND chip selected from the NAND chip A 200A, the NAND chip B 200B, the NAND chip C 200C, and the NAND chip D 200D.

The NAND chip A 200A, the NAND chip B 200B, the NAND chip C 200C, and the NAND chip D 200D include their respective terminating circuits, which will be described later. In the course of communications between the memory controller 300 and the NAND chips, selection of a given NAND chip may be accompanied by either the enabling of the terminating circuit or circuits of the selected NAND chip or the enabling of the terminating circuit or circuits of non-selected NAND chips. The terminating circuit or circuits of the selected NAND chip and the terminating circuit or circuits of the non-selected NAND chips may also be enabled together. The memory controller 300 can select a terminating circuit or circuits of which a non-selected NAND chip among the multiple non-selected NAND chips should be enabled. A terminating circuit or circuits of which a NAND chip should be enabled in association with the selected NAND chip may be determined based on, for example, a test conducted in advance for the combination of a selected NAND chip and one or more non-selected NAND chips that demonstrates good signal characteristics.

In the disclosure herein, a "selected NAND chip" refers to a NAND chip currently in communication with the memory controller 300 in the course of communications between the memory controller 300 and the NAND chips. A "non-selected NAND chip" refers to a NAND chip currently not in communication with the memory controller 300 in the course of communications between the memory controller 300 and the NAND chips.

(1-1-2) Configurations of NAND Chips

FIG. 3 shows functional blocks of the NAND chip A 200A according to the first embodiment and their related elements. The description will be given of the NAND chip A 200A; however, the NAND chip B 200B, the NAND chip C 200C, and the NAND chip D 200D each have the same configuration as the NAND chip A 200A. Note that FIG. 3 omits the I/F chip 250. However, communications between the NAND chips and the memory controller 300 described below are performed via the I/F chip 250. The I/F chip 250 may also be omitted from other figures after FIG. 3.

As discussed in relation to FIG. 2, the NAND chip A 200A is controlled by the memory controller 300. The NAND chip A 200A includes components such as a memory cell array 11, an input/output circuit 12, a sequencer (control circuit) 13, a potential generating circuit 14, a driver 15, a row decoder 16, and a sense amplifier 17.

The memory cell array 11 includes multiple memory blocks BLK (BLK0, BLK1, . . . ). Below, the memory blocks will simply be called "blocks". Data in each block BLK is subjected to batch erasure processing. Data may instead be erased in a unit smaller than one block BLK (e.g., a half of one block BLK). Each block BLK is a set of multiple string units SU (SU0, SU1, . . . ). Each string unit SU is a set of multiple NAND strings STR (STR0, STR1, . . . ). Each string STR includes multiple memory cell transistors MT.

The memory cell array 11 further includes various interconnects not shown in the figure. Such various interconnects include a source line CELSRC, word lines WL, and bit lines BL.

The memory controller 300 and the input/output circuit 12 mutually transmit and receive signals DQ, DQS, and DQSn with each other. The signal DQ is an 8-bit signal and conveys information. As this information, the signal DQ conveys a command (CMD), an address (ADD), write data or read data (DAT), status data (STA), and so on. The signals DQS and DQSn are data strobe signals indicative of the timing at which DQ should be taken in. The signal DQSn is a signal corresponding to the signal DQS with its high/low level inverted.

The memory controller 300 transmits the signals CEn1, CLE, ALE, WEn, REn, RE, and WPn to the input/output circuit 12. The signal CEn1 in an asserted state enables the NAND chip A 200A. The asserted-state signal CLE informs the input/output circuit 12 that the signal DQ being transmitted in parallel with itself is a command CMD. The asserted-state signal ALE informs the input/output circuit 12 that the signal DQ being transmitted in parallel with itself is an address ADD. The asserted-state signal WEn instructs the input/output circuit 12 to take in the signal DQ transmitted in parallel with itself. The asserted-state signals REn and RE instruct the input/output circuit 12 to output a given signal DQ. The signal RE is a signal corresponding to the signal REn with its high/low level inverted. The asserted-state signal WPn instructs the input/output circuit 12 to forgo data writing and data erasing for a period during which its receipt is ongoing.

The memory controller 300 receives the signal RBn1 from the input/output circuit 12. The signal RBn1 indicates whether the NAND chip A 200A is in a ready state or a busy state. While RBn1 is at a high level, the NAND chip A 200A is in a ready state. The NAND chip A 200A in its ready state accepts a command from the memory controller 300. The NAND chip A 200A in its busy state does not accept commands from the memory controller 300.

The sequencer 13 receives a command CMD and an address ADD from the input/output circuit 12. The sequencer 13 controls the potential generating circuit 14, the driver 15, the row decoder 16, and the sense amplifier 17 based on the command CMD and the address ADD.

The potential generating circuit 14 receives a supply potential from the outside of the NAND chip A 200A and generates various potentials from the supply potential. The generated potentials are supplied to the components such as the memory cell array 11, the driver 15, and the sense amplifier 17. In one example, the potentials supplied from the potential generating circuit 14 to the memory cell array 11 include a potential to be applied to the source line CELSRC. In one example, the potentials supplied from the potential generating circuit 14 to the driver 15 are then applied to the word lines WL from the driver 15. In one example, the potentials supplied from the potential generating circuit 14 to the sense amplifier 17 are applied to the bit lines BL.

The driver 15 receives multiple potentials from the potential generating circuit 14. The received potentials are supplied to the row decoder 16 according to control signals from the sequencer 13.

The row decoder 16 receives an address ADD from the input/output circuit 12. The row decoder 16 receives, from the driver 15, various potentials that have been selected by the driver 15. The row decoder 16 receives control signals including the address ADD from the sequencer 13. The row decoder 16 selects one block BLK based on the received address ADD and transfers the potentials received from the driver 15 to the selected block BLK.

The sense amplifier 17 senses the states of memory cell transistors MT included in the memory cell array 11, generates read data DAT based on the sensed states, and transmits the read data DAT to the input/output circuit 12. The sense amplifier 17 also transmits write data DAT received from the input/output circuit 12 to the memory cell transistors MT. The sense amplifier 17 receives given potentials from the potential generating circuit 14 and supplies them to the bit lines BL selected based on the write data DAT.

(1-1-3) Circuit Configurations of Memory System

Figure 4:
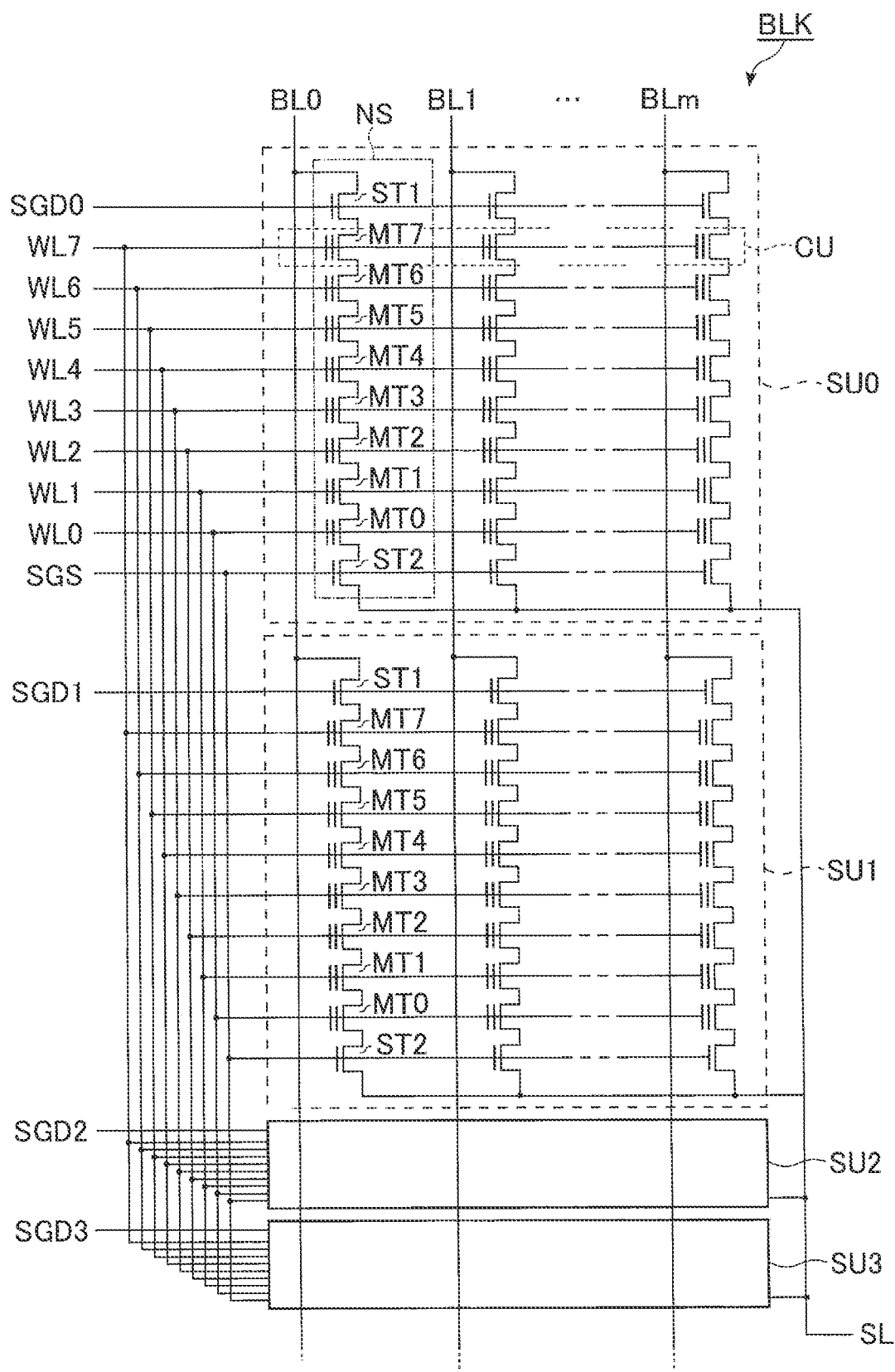
FIG. 4 shows an exemplary circuit configuration of a memory cell array 10 included in the semiconductor memory device 200 according to the first embodiment.

FIG. 4 shows an exemplary circuit configuration of the memory cell array 10 included in the semiconductor memory device 200 according to the first embodiment, and it particularly shows one of the multiple blocks BLK included in the memory cell array 10. All the other blocks BLK may, for example, be configured using the same components and connections as those shown in FIG. 4. The number of blocks BLK in the memory cell array 10 as well as the number of string units SU in each block BLK may be set to any number. The description will assume an example where one block BLK includes four string units SU0 to SU3.

Each string unit SU is a set of multiple NAND strings NS associated with respective bit lines BL0 to BLm, where m is an integer equal to or greater than 1. In one example, the NAND strings NS each include memory cell transistors MT0 to MT7 and select transistors ST1 and ST2. The memory cell transistors MT each include a control gate and a charge accumulating layer, and store data in a non-volatile manner. The select transistors ST1 and ST2 are each used for the selection of the applicable string unit SU in various operations.

In each NAND string NS, the memory cell transistors MT0 to MT7 are connected in series. The select transistor ST1 has its drain connected to an associated bit line BL and its source connected to one end of a set of serially connected memory cell transistors MT0 to MT7. The select transistor ST2 has its drain connected to the other end of the set of serially connected memory cell transistors MT0 to MT7. The source of the select transistor ST2 is connected to a source line SL.

Multiple memory cell transistors MT0 to multiple memory cell transistors MT7 within the same block BLK have their control gates connected in common to a word line WL0 to a word line WL7, respectively. Multiple select transistors ST1 in each of the string units SU0 to SU3 have their gates connected in common to the respective one of select gate lines SGD0 to SGD3. Multiple select transistors ST2 have their gates connected in common to a select gate line SGS.

In each string unit SU, one NAND string NS is connected to one bit line BL. In one example, the source line SL is shared by the multiple blocks BLK.

A set of multiple memory cell transistors MT connected to a common word line WL within one string unit SU may be called, for example, a "cell unit CU". In one example, the storage capacity of a cell unit CU constituted by the memory cell transistors MT each adapted to store 1-bit data is defined as "1-page data". Each cell unit CU may have a storage capacity of 2-page data or more according to the bit number of data to be stored in its memory cell transistors MT.

Note that the memory cell array 10 included in the NAND chip A 200A according to the first embodiment is not limited to the circuit configuration described above. For example, the number of the memory cell transistors MT and the number of the select transistors ST1 and ST2 in each NAND string NS may each be discretionarily designed.

FIG. 5 is a block diagram showing an exemplary configuration of the memory controller 300 according to the first embodiment. FIG. 5 shows, as a representative example, only a configuration for the interconnect for transmitting one bit among an 8-bit width input/output signal DQ. The interconnects for transmitting the remaining seven bits may adopt the same configuration as shown in FIG. 5. In the following description, the 1-bit signal subjected to the processing by the configuration shown in FIG. 5, among the 8-bit width input/output signal DQ, will be simply called a "signal DQ". Also, the interconnect for transmitting the signal DQ, among the interconnects in the NAND bus, will be called a "DQ interconnect".

In the following description, reference to the "first end" of a transistor indicates one of its source and drain, and a reference to the "second end" indicates the other one of the source and drain. Also, reference to the "control terminal" of a transistor indicates its gate.

The memory controller 300 receives a request signal from the host device 400 as discussed above. The memory controller 300 includes receivers 301, 306, and 307, transmitters 302, 309 to 311, and 314, terminating circuits 303, 312, and 313, an enable signal generating circuit 304, and a reference voltage generating circuit 305.

In one example, the enable signal generating circuit 304 generates an LVSTL enable signal LVSTL_EN1 according to a program executed by the CPU 370. The enable signal generating circuit 304 transmits the generated LVSTL enable signal LVSTL_EN1 to the terminating circuit 303 and the reference voltage generating circuit 305. The enable signal generating circuit 304 also generates enable signals OUTEN1 and OUTEN2. The enable signal generating circuit 304 transmits the generated enable signals OUTEN1 and OUTEN2 to the transmitter 302. The enable signal generating circuit 304 further generates enable signals INEN1 and INEN2. The enable signal generating circuit 304 transmits the generated enable signals INEN1 and INEN2 to the receiver 301.

The reference voltage generating circuit 305 generates reference voltages VREFq1 and VREFq2 based on the received signal LVSTL_EN1. The reference voltage generating circuit 305 may, according to the LVSTL enable signal LVSTL_EN1, generate and supply multiple kinds of reference voltages VREFq1 and VREFq2 by itself, or select and supply multiple kinds of externally provided reference voltages VREFq1 and VREFq2. The reference voltages VREFq1 and VREFq2 will be described in more detail later.

The receiver 301 receives the reference voltages VREFq1 and VREFq2. The receiver 301 is connected to a node DQO. The receiver 301 receives a signal DQ from the input/output circuit 12 (described later) via the node DQO. The receiver 301 receives the enable signals INEN1 and INEN2 from the enable signal generating circuit 304. The receiver 301 performs an operation associated with the receiving of the signal DQ. In one example, the receiver 301 determines the level of the signal DQ based on the received enable signals INEN1 and INEN2. The receiver 301 may perform different operations according to the types of information conveyed by the received signal DQ. The receiver 301 outputs a signal based on the received signal DQ to another component (not illustrated) in the memory controller 300. The receiver 301 will be described in more detail later. The receivers 306 and 307 perform operations associated with the receiving of signals DQS and DQSn, respectively. The receivers 306 and 307 each have the same configuration and function as the receiver 301, so their description will be omitted. Illustrations of some interconnects, e.g., interconnects connecting the receivers 306 and 307 with the enable signal generating circuit 304, are omitted in FIG. 5.

The terminating circuit 303 is connected to the node DQO. The terminating circuit 303 is capable of freely terminating the node DQO. That is, the terminating circuit 303 can perform or forgo termination of the node DQO. Whether or not the terminating circuit 303 terminates the node DQO may be selected according to the type of the received signal DQ. The terminating circuit 303 performs the termination using the LVSTL enable signal LVSTL_EN1 received from the enable signal generating circuit 304. The terminating circuit 303 will be described in more detail later. The terminating circuits 312 and 313 are capable of freely terminating nodes DQSO and DQSnO, respectively. The terminating circuits 312 and 313 each have the same configuration and function as the terminating circuit 303, so their description will be omitted. Illustrations of some interconnects, e.g., interconnects connecting the terminating circuits 312 and 313 with the enable signal generating circuit 304, are omitted in FIG. 5.

The transmitter 302 receives a signal transmitted as the signal DQ from another component (not illustrated) in the memory controller 300. The transmitter 302 receives the enable signals OUTEN1 and OUTEN2 from the enable signal generating circuit 304. The transmitter 302 outputs the received signal DQ based on the received enable signals OUTEN1 and OUTEN2. The transmitter 302 is connected to the node DQO. The transmitter 302 transmits the signal DQ to the input/output circuit 12 via the node DQO. The transmitter 302 controls the voltage of the node DQO based on the signal transmitted as the signal DQ. The transmitter 302 will be described in more detail later. The transmitters 309 to 311 and 314 transmit the respective signals DQS, DQSn, REn, and RE to the input/output circuit 12. The transmitters 309 to 311 and 314 each have the same configuration and function as the transmitter 302, so their description will be omitted. Illustrations of some interconnects, e.g., interconnects connecting the transmitters 309 to 311 and 314 with the enable signal generating circuit 304, are omitted in FIG. 5.

The signal DQ conveys a signal using a voltage size. The memory controller 300 also transmits the generated signals CEn1, CLE, ALE, WEn, and WPn to the input/output circuit 12 through interconnects in the NAND bus for transmitting these signals.

Figure 6:
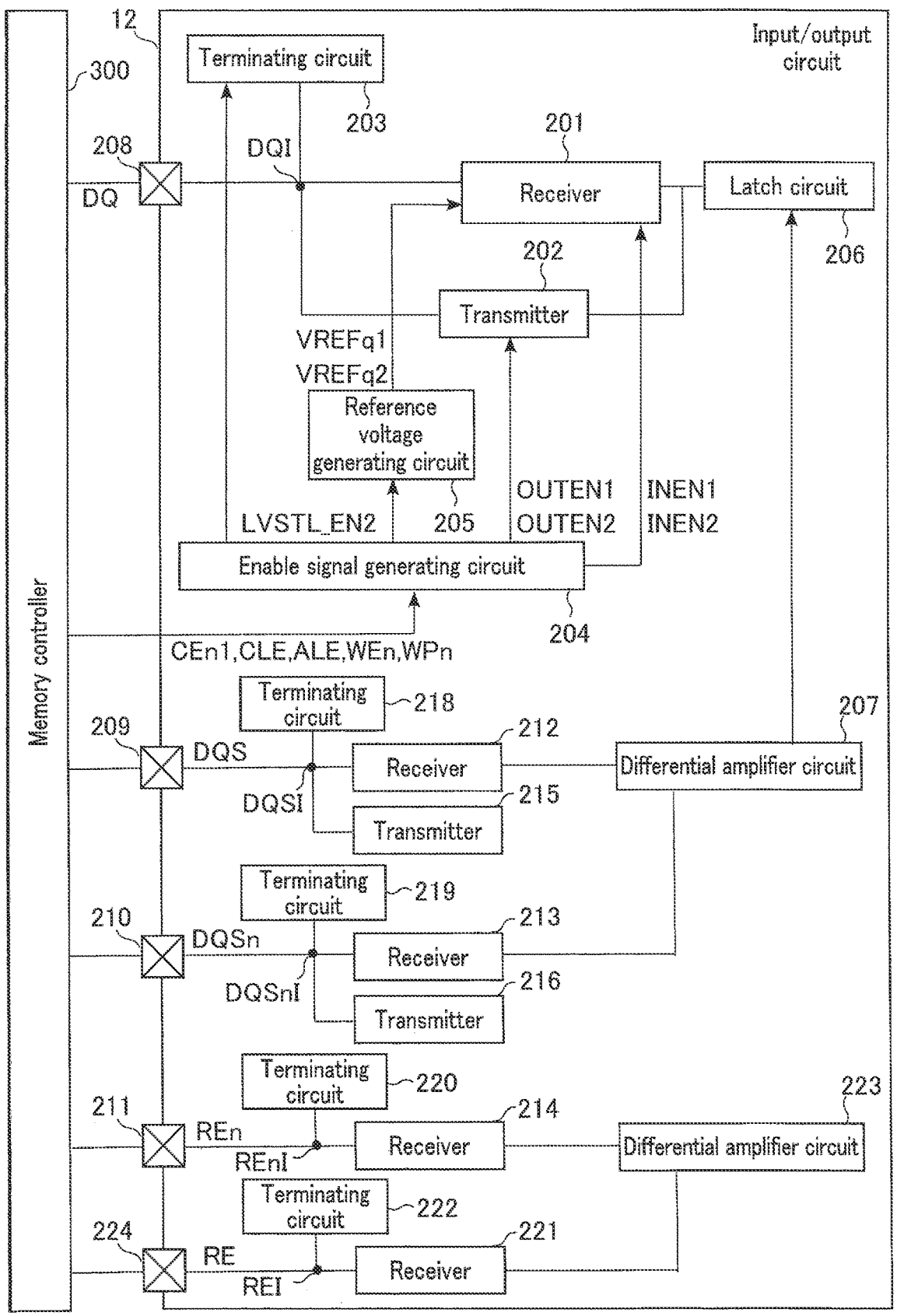
FIG. 6 is a block diagram showing an exemplary configuration of an input/output circuit 12 in the semiconductor memory device 200 according to the first embodiment.

FIG. 6 is a block diagram showing an exemplary configuration of the input/output circuit 12 in the semiconductor memory device 200 according to the first embodiment. Similar to FIG. 5, FIG. 6 shows, as a representative example, only a configuration for the interconnect for transmitting one bit among the 8-bit width input/output signal DQ. The interconnects for transmitting the remaining seven bits may adopt the same configuration as shown in FIG. 6.

The input/output circuit 12 includes receivers 201, 212 to 214, and 221, transmitters 202, 215, and 216, terminating circuits 203, 218 to 220, and 222, an enable signal generating circuit 204, a reference voltage generating circuit 205, a latch circuit 206, differential amplifier circuits 207 and 223, and input/output pins 208 to 211 and 224.

The input/output pin 208 is connected to the DQ interconnect. The input/output pin 208 is connected to a node DQI. The input/output pin 209 is connected to an interconnect for transmitting the data strobe signal DQS of the memory controller 300. The input/output pin 209 is connected to a node DQSI. The input/output pin 210 is connected to an interconnect for transmitting the data strobe signal DQSn of the memory controller 300. The input/output pin 210 is connected to a node DQSnI. The input/output pin 211 is connected to an interconnect for receiving the signal REn of the memory controller 300. The input/output pin 211 is connected to a node REnI. The input/output pin 224 is connected to an interconnect for transmitting the signal RE of the memory controller 300. The input/output pin 224 is connected to a node REI.

The enable signal generating circuit 204 generates an LVSTL enable signal LVSTL_EN2 according to the signals CEn1, CLE, ALE, WEn, and WPn received from the memory controller 300. The enable signal generating circuit 204 supplies the generated LVSTL enable signal LVSTL_EN2 to the terminating circuit 203 and the reference voltage generating circuit 205. The enable signal generating circuit 204 also generates enable signals OUTEN1 and OUTEN2. The enable signal generating circuit 204 transmits the generated enable signals OUTEN1 and OUTEN2 to the transmitter 202. The enable signal generating circuit 204 further generates enable signals INEN1 and INEN2. The enable signal generating circuit 204 transmits the generated enable signals INEN1 and INEN2 to the receiver 201.

The reference voltage generating circuit 205 generates reference voltages VREFq1 and VREFq2 based on the received signal LVSTL_EN2. The reference voltage generating circuit 205 may, according to the LVSTL enable signal LVSTL_EN2, generate and supply multiple kinds of reference voltages VREFq1 and VREFq2 by itself, or select and supply multiple kinds of externally provided reference voltages VREFq1 and VREFq2.

The receiver 201 receives the reference voltages VREFq1 and VREFq2. The receiver 201 is connected to the node DQI. The receiver 201 receives the signal DQ from the node DQI. The receiver 201 receives the enable signals INEN1 and INEN2 from the enable signal generating circuit 204. The receiver 201 performs an operation associated with the receiving of the signal DQ. In one example, the receiver 201 determines the level of the signal DQ based on the received enable signals INEN1 and INEN2. The receiver 201 may perform different operations according to the types of information conveyed by the received signal DQ. The receiver 201 outputs a signal based on the received signal DQ to the latch circuit 206. The receiver 201 will be described in more detail later. The receivers 212 to 214 and 221 perform operations associated with the receiving of the respective signals DQS, DQSn, REn, and RE. The receivers 212 to 214 and 221 each have the same configuration and function as the receiver 201, so their description will be omitted. Illustrations of some interconnects, e.g., interconnects connecting receivers 212 to 214 and 221 with the enable signal generating circuit 204, are omitted in FIG. 6.

The terminating circuit 203 is connected to the node DQI. The terminating circuit 203 is capable of freely terminating the node DQI. That is, the terminating circuit 203 can perform or forgo termination of the node DQI. Whether or not the terminating circuit 203 terminates the node DQI may be selected according to the type of the received signal DQ. The terminating circuit 203 performs the termination using the LVSTL enable signal LVSTL_EN2 received from the enable signal generating circuit 204. The terminating circuit 203 will be described in more detail later. The terminating circuits 218 to 220 and 222 are capable of freely terminating the respective nodes DQSI, DQSnI, REnI, and REI. The terminating circuits 218 to 220 and 222 each have the same configuration and function as the terminating circuit 203, so their description will be omitted. Illustrations of some interconnects, e.g., interconnects connecting the terminating circuits 218 to 220 and 222 with the enable signal generating circuit 204, are omitted in FIG. 6.

The latch circuit 206 receives a signal based on the signal DQ from the receiver 201 and holds the received signal based on the signal DQ. The latch circuit 206 transmits, to the transmitter 202, the signal which will be transmitted as the signal DQ to the memory controller 300. The latch circuit 206 will be described in more detail later.

The transmitter 202 receives, from the latch circuit 206, the signal to be transmitted as the signal DQ. The transmitter 202 receives the enable signals OUTEN1 and OUTEN2 from the enable signal generating circuit 204. The transmitter 202 outputs the received signal DQ based on the received enable signals OUTEN1 and OUTEN2. The transmitter 202 is connected to the node DQI. The transmitter 202 transmits the signal DQ to the memory controller 300, via the node DQI and the input/output pin 208. The transmitter 202 controls the voltage of the node DQI based on the signal transmitted as the signal DQ. The transmitter 202 will be described in more detail later. The transmitters 215 and 216 transmit the respective signals DQS and DQSn to the memory controller 300. The transmitters 215 and 216 each have the same configuration and function as the transmitter 202, so their description will be omitted. Illustrations of some interconnects, e.g., interconnects connecting the transmitters 215 and 216 with the enable signal generating circuit 204, are omitted in FIG. 6.

The differential amplifier circuit 207 is connected to the receivers 212 and 213. The differential amplifier circuit 207 receives a signal based on the signal DQS from the receiver 212. The differential amplifier circuit 207 receives a signal based on the signal DQSn from the receiver 213. The differential amplifier circuit 207 controls the latch circuit 206 according to the received signals DQS and DQSn. The differential amplifier circuit 207 will be described in more detail later.

The differential amplifier circuit 223 is connected to the receivers 214 and 221. The differential amplifier circuit 223 receives a signal based on the signal REn from the receiver 214. The differential amplifier circuit 223 receives a signal based on the signal RE from the receiver 221. The differential amplifier circuit 223 generates signals REni and REi based on the received signals REn and RE. The differential amplifier circuit 223 outputs the generated signals REni and REi to another element (not illustrated) in the input/output circuit 12.

Figure 7:
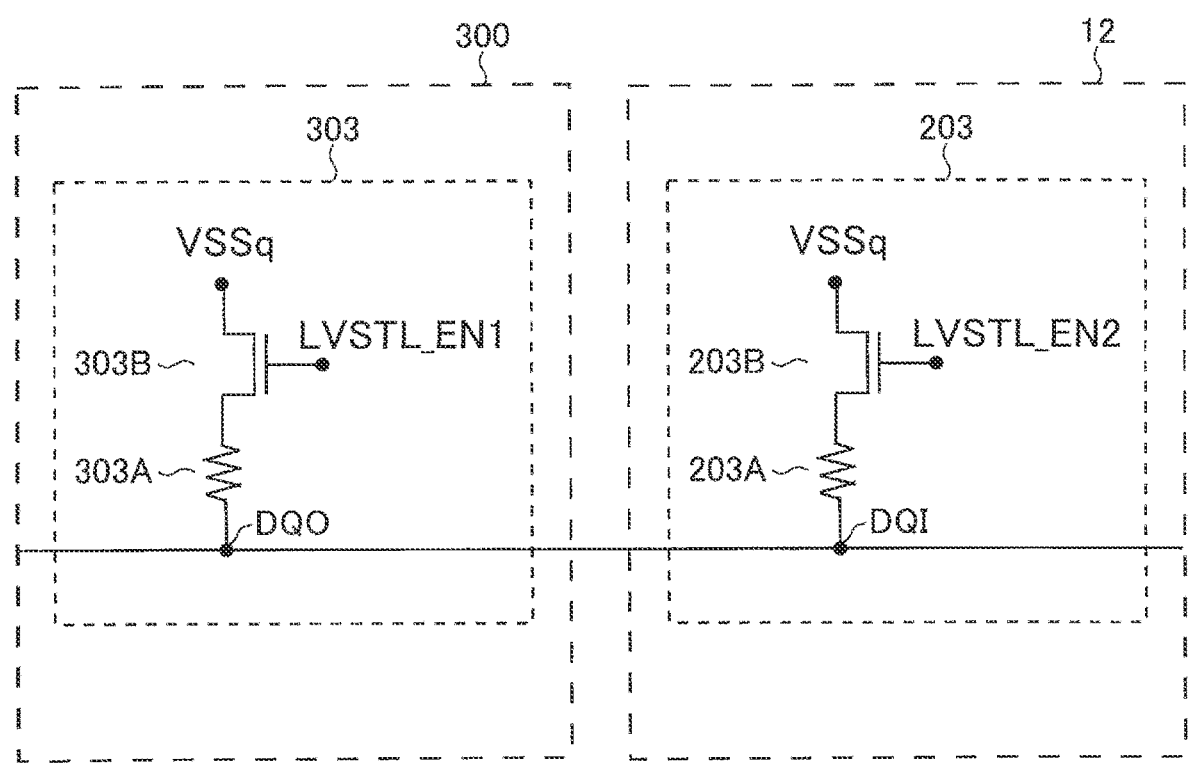
FIG. 7 is a circuit diagram showing exemplary configurations of terminating circuits 203 and 303 for the semiconductor memory device 200 according to the first embodiment.
Figure 8:
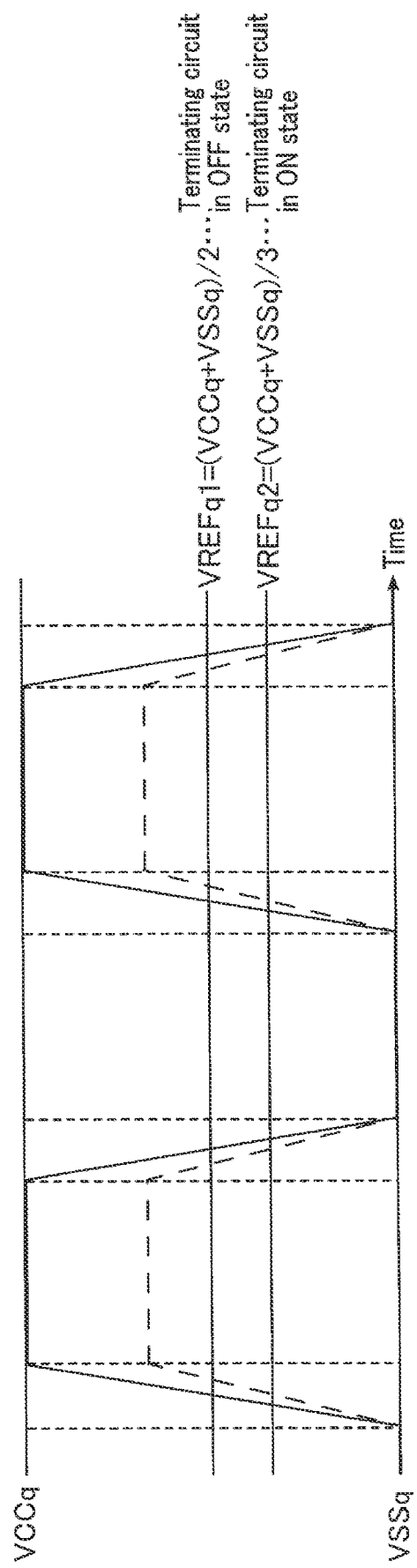
FIG. 8 is a waveform diagram showing voltage amplitudes of a node (DQO) terminated by the terminating circuits 203 and 303 according to the first embodiment.

FIG. 7 is a circuit diagram showing exemplary configurations of the terminating circuits 203 and 303 for the semiconductor memory device 200 according to the first embodiment. FIG. 8 is a waveform diagram showing voltage amplitudes of the node (DQO) terminated by the terminating circuits 203 and 303 according to the first embodiment. A description will be given based on FIG. 7 with reference to FIG. 8 as appropriate.

FIG. 7 shows detailed circuit structures of the terminating circuits 203 and 303 described with reference to FIGS. 5 and 6. First, the circuit structure of the terminating circuit 303 will be described. As described above, the terminating circuit 303 freely terminates the node DQO. The terminating circuit 303 includes a resistor 303A and an NMOS transistor 303B. The resistor 303A has its one end electrically connected to the node DQO. A second end of the resistor 303A is electrically connected to a first end of the NMOS transistor 303B. A second end of the NMOS transistor 303B is electrically connected to a node of a ground voltage VSSq. The NMOS transistor 303B has a control terminal to which the LVSTL enable signal LVSTL_EN1 is supplied from the enable signal generating circuit 304.

The NMOS transistor 303B is turned ON upon its control terminal receiving a supply of the high-level LVSTL enable signal LVSTL_EN1. The NMOS transistor 303B is turned OFF upon its control terminal receiving a supply of the low-level LVSTL enable signal LVSTL_EN1.

While the NMOS transistor 303B is in the ON state, the terminating circuit 303 terminates the node DQO. The terminating circuit 303 does not terminate the node DQO while the NMOS transistor 303B is in the OFF state. As such, adjustment of the level of the LVSTL enable signal LVSTL_EN1 allows for the selection of whether or not the terminating circuit 303 performs termination for the signal DQ. In the description below, a condition where the NMOS transistor 303B has been turned ON and the terminating circuit 303 is terminating the node DQO will be referred to as "the terminating circuit 303 is in the enabled state". Similarly, a condition where the NMOS transistor 303B has been turned OFF and the terminating circuit 303 is not terminating the node DQO will be referred to as "the terminating circuit 303 is not in the enabled state (or is in the disabled state)".

While the terminating circuit 303 is in the enabled state, the ON resistance of the NMOS transistor 303B and the resistor 303A cause the voltage drop of the signal DQ received by the node DQO. The effect of the terminating circuit 303 on the voltage amplitude of the node DQO will be described with reference to FIG. 8. The description will assume an instance where the node DQO receives a voltage that periodically oscillates between a high level (VCCq) and a low level (VSSq).

While the terminating circuit 303 is not in the enabled state, the terminating circuit 303 does not adjust the resistance value of the node DQO. Here, the terminating circuit 303 does not adjust the voltage amplitude of the signal DQ to the node DQO, as indicated by solid lines in FIG. 8. Accordingly, the node DQO supplies a signal having an amplitude ranging from the voltage VSSq to the voltage VCCq to the receiver 301.

While the terminating circuit 303 is in the enabled state, the ON resistance of the NMOS transistor 303B and the resistor 303A lower the voltage VCCq supplied from the node DQO, down to the voltage VCCq−α. In other words, the terminating circuit 303 adjusts the voltage amplitude of the node DQO to an amplitude ranging from the voltage VSSq to the voltage VCCq−α using the ON resistance of the NMOS transistor 303B and the load resistance of the resistor 303A, as indicated by broken lines in FIG. 8. Accordingly, the node DQO supplies a signal having an amplitude ranging from the voltage VSSq to the voltage VCCq−α to the receiver 301.

The maximum value (i.e., the high level) of the signal DQ differs in size between the case of the terminating circuit 303 being in the enabled state and the case of the terminating circuit 303 not being in the enabled state. Thus, the size of the reference voltage VREFq for determining the level of the signal DQ is changed depending on whether the terminating circuit 303 is in the enabled state or not. More specifically, as shown in FIG. 8, the reference voltage generating circuit 305 supplies a reference voltage VREFq1 of a size between the voltage VSSq and the voltage VCCq in the case where the terminating circuit 303 is not in the enabled state. The reference voltage VREFq1 here is, for example, an intermediate value between the voltage VSSq and the voltage VCCq, that is, (VCCq+VSSq)/2. On the other hand, the reference voltage generating circuit 305 supplies a reference voltage VREFq2 of a size between the voltage VSSq and the voltage VCCq−α in the case where the terminating circuit 303 is in the enabled state. For example, the reference voltage VREFq2 is smaller than (VCCq+VSSq)/2. Examples of a reference voltage VREFq2 that is smaller than (VCCq+VSSq)/2 include a value (VCCq+VSSq)/3, so the disclosure herein refers to this value. However, this does not pose any limitations.

Turning back to FIG. 7, the circuit structure of the terminating circuit 203 will be described. As noted above, the terminating circuit 203 freely terminates the node DQI. The terminating circuit 203 has the same structure and function as the terminating circuit 303. The terminating circuit 203 includes a resistor 203A and an NMOS transistor 203B. The resistor 203A has its one end electrically connected to the node DQI. A second end of the resistor 203A is electrically connected to a first end of the NMOS transistor 203B. A second end of the NMOS transistor 203B is electrically connected to a node of the ground voltage VSSq. The NMOS transistor 203B has a control terminal to which the LVSTL enable signal LVSTL_EN2 is supplied from the enable signal generating circuit 204.

The NMOS transistor 203B is turned ON upon its control terminal receiving a supply of the high-level LVSTL enable signal LVSTL_EN2. The NMOS transistor 203B is turned OFF upon its control terminal receiving a supply of the low-level LVSTL enable signal LVSTL_EN2.

While the NMOS transistor 203B is in the ON state, the terminating circuit 203 terminates the node DQI. The terminating circuit 203 does not terminate the node DQI while the NMOS transistor 203B is in the OFF state. As such, adjustment of the level of the LVSTL enable signal LVSTL_EN2 allows for the selection of whether or not the terminating circuit 203 performs termination for the signal DQ. In the description below, as in the description of the terminating circuit 303, a condition where the NMOS transistor 203B has been turned ON and the terminating circuit 203 is terminating the node DQI will be referred to as "the terminating circuit 203 is in the enabled state". Similarly, a condition where the NMOS transistor 203B has been turned OFF and the terminating circuit 203 is not terminating the node DQI will be referred to as "the terminating circuit 203 is not in the enabled state (or is in the disabled state)".

Similar to the terminating circuit 303, the terminating circuit 203 adjusts the voltage amplitude of the node DQI to an amplitude ranging from the voltage VSSq to the voltage VCCq−α using the ON resistance of the NMOS transistor 203B and the load resistance of the resistor 203A (cf. broken lines in FIG. 8). Accordingly, the node DQI supplies a voltage having an amplitude ranging from the voltage VSSq to the voltage VCCq−α to the receiver 201. As with the terminating circuit 303, the reference voltage generating circuit 205 supplies the reference voltage VREFq1 (e.g., VREFq1=(VCCq+VSSq)/2) in the case where the terminating circuit 203 is not in the enabled state. On the other hand, the reference voltage generating circuit 205 supplies a reference voltage VREFq2 having an intermediate value between the voltage VSSq and the voltage VCCq−α (VREFq2<(VCCq+VSSq)/2) in the case where the terminating circuit 203 is in the enabled state. The terminating circuits 218 to 220, 222, 312, and 313 each have the same configuration and function as the terminating circuits 203 and 303, so their description will be omitted.

FIG. 9 is a circuit diagram showing an exemplary configuration of the transmitter 302 for the semiconductor memory device 200 according to the first embodiment. FIG. 9 shows a detailed circuit structure of the transmitter 302 described with reference to FIG. 5. As described above, the transmitter 302 controls the voltage of the node DQO based on a signal transmitted as the signal DQ. Hereinafter, the signal transmitted as the signal DQ for the transmitter 302 will be called a "signal IN1".

The transmitter 302 includes a legacy transmitter 302X and a low voltage swing terminated logic (LVSTL) transmitter 302Y. The transmitter 302 is capable of selecting, based on the type of the received signal IN1, whether to use the legacy transmitter 302X or the LVSTL transmitter 302Y for transmitting the signal DQ. Types of the signal DQ and the transmitter for use (the legacy transmitter 302X or the LVSTL transmitter 302Y) will be described in more detail later.

For selecting the legacy transmitter 302X, the enable signal generating circuit 304 transmits the enable signal OUTEN1 being at a high level and the enable signal OUTEN2 being at a low level to the transmitter 302. For selecting the LVSTL transmitter 302Y, the enable signal generating circuit 304 transmits the enable signal OUTEN1 being at a low level and the enable signal OUTEN2 being at a high level to the transmitter 302.

In one example, the legacy transmitter 302X transmits the signal DQ by a transmission technique compatible with a terminating circuit that uses a center tapped termination (CTT) method or a pseudo open drain (POD) method. The legacy transmitter 302X includes a PMOS transistor 302A, an NMOS transistor 302B, a negative logical product (NAND) gate 302C, an inverter 302D, and a negative logical sum (NOR) gate 302E. The legacy transmitter 302X is not limited to the logic circuit configuration shown in FIG. 9. As long as equivalent signal logic is derived, the legacy transmitter 302X may be realized by adopting, in addition to (or instead of) the illustrated logic gates, any combination of logical circuits including a logical product (AND) gate, a negative logical product (NAND) gate, a logical sum (OR) gate, a negative logical sum (NOR) gate, an exclusive logical sum (XOR) gate, an exclusive negative logical sum (XNOR) gate, an inverter, and so on.

The PMOS transistor 302A has its first end electrically connected to a node of a supply voltage VCCq (high level). The supply voltage VCCq is lower than the voltage of an amplitude of the signal IN1 (or its high level). A second end of the PMOS transistor 302A is connected to the node DQO.

The NMOS transistor 302B has its first end connected to the node DQO. A second end of the NMOS transistor 302B is electrically connected to a node of the ground voltage VSSq.

The NAND gate includes a first input end, a second input end, and an output end. The NAND gate outputs, from the output end, a negative logical product of the level of a signal received at the first input end and the level of a signal received at the second input end. The first input end of the NAND gate 302C receives the enable signal OUTEN1 from the enable signal generating circuit 304. The second input end of the NAND gate 302C receives the signal IN1 from another component (not illustrated) in the memory controller 300. The output end of the NAND gate 302C is connected to a control terminal of the PMOS transistor 302A. The NAND gate 302C transmits the negative logical product obtained using the signal received at the first input end and the signal received at the second input end, from the output end to the control terminal of the PMOS transistor 302A.

The inverter includes an input end and an output end. The inverter outputs the logical inversion of the level of a signal received at the input end. The input end of the inverter 302D receives the enable signal OUTEN1 from the enable signal generating circuit 304. The inverter 302D transmits the logical inversion of the received signal OUTEN1, from the output end to a first input end of the NOR gate 302E.

The NOR gate includes this first input end, a second input end, and an output end. The NOR gate outputs, from the output end, a negative logical sum of the level of a signal received at the first input end and the level of a signal received at the second input end. The first input end of the NOR gate 302E is connected to the output end of the inverter 302D. The second input end of the NOR gate 302E receives the signal IN1 from another component (not illustrated) in the memory controller 300. The output end of the NOR gate 302E is connected to a control terminal of the NMOS transistor 302B. The NOR gate 302E transmits the negative logical sum obtained using the signal received at the first input end and the signal received at the second input end, from the output end to the control terminal of the NMOS transistor 302B.

In one example, the LVSTL transmitter 302Y transmits the signal DQ by a transmission technique compatible with a terminating circuit that uses a low voltage swing terminated logic (LVSTL) method. The LVSTL transmitter 302Y includes NMOS transistors 302F and 302G, a logical product (AND) gate 302H, an inverter 302I, and a NOR gate 302J. As long as equivalent signal logic is derived, the LVSTL transmitter 302Y is not limited to the structure shown in FIG. 9 and may, for example, further include one or more logical circuits, etc., including a NAND gate, an inverter, and the like.

The NMOS transistor 302F has its first end electrically connected to a node of the supply voltage VCCq. A second end of the NMOS transistor 302F is connected to the node DQO.

The NMOS transistor 302G has its first end connected to the node DQO. A second end of the NMOS transistor 302G is electrically connected to a node of the ground voltage VSSq.

The AND gate includes a first input end, a second input end, and an output end. The AND gate outputs, from the output end, a logical product of the level of a signal received at the first input end and the level of a signal received at the second input end. The first input end of the AND gate 302H receives the enable signal OUTEN2 from the enable signal generating circuit 304. The second input end of the AND gate 302H receives the signal IN1 from another component (not illustrated) in the memory controller 300. The output end of the AND gate 302H is connected to a control terminal of the NMOS transistor 302F. The AND gate 302H transmits the logical product obtained using the signal received at the first input end and the signal received at the second input end, from the output end to the control terminal of the NMOS transistor 302F.

The inverter 302I receives, at its input end, the enable signal OUTEN2 from the enable signal generating circuit 304. The inverter 302I transmits the logical inversion of the received signal OUTEN2, from its output end to a first input end of the NOR gate 302J.

The first input end of the NOR gate 302J is connected to the output end of the inverter 302I. A second input end of the NOR gate 302J receives the signal IN1 from another component (not illustrated) in the memory controller 300. An output end of the NOR gate 302J is connected to a control terminal of the NMOS transistor 302G. The NOR gate 302J transmits the negative logical sum obtained using the signal received at the first input end and the signal received at the second input end, from the output end to the control terminal of the NMOS transistor 302G.

In this manner, the transmitter 302 switches between the legacy transmitter 302X and the LVSTL transmitter 302Y to generate a signal DQ, according to the information type to be conveyed by the signal DQ. For this switching, the low/high level adjustments of the enable signals OUTEN1 and OUTEN2 are performed. In other words, the transmitter 302 has two transmission modes, and which transmission mode is selected is determined according to the type of the signal DQ.

For the sake of distinction, the signal DQ transmitted based on the enable signal OUTEN1 (the signal DQ generated by the legacy transmitter 302X from the signal IN1) will be called a "signal Legacy_IN1". The signal DQ transmitted based on the enable signal OUTEN2 (the signal DQ generated by the LVSTL transmitter 302Y from the signal IN1) will be called a "signal LVSTL_IN1".

In instances where the LVSTL transmitter 302Y is used, the voltage VCCq is transferred via the NMOS transistor 302F, and accordingly, the transferred voltage is lower than the voltage VCCq by a threshold voltage of the NMOS transistor 302F. Therefore, the amplitude of the signal LVSTL_IN1 is smaller than that of the signal Legacy_IN1.

This means that the use of the LVSTL transmitter 302Y allows for the transmission of a signal DQ that has a smaller amplitude as compared to the case of using the legacy transmitter 302X.

Next, the circuit structure of the transmitter 202 will be described. FIG. 10 is a circuit diagram showing an exemplary configuration of the transmitter 202 for the semiconductor memory device 200 according to the first embodiment. FIG. 10 shows a detailed circuit structure of the transmitter 202 described with reference to FIG. 6. As described above, the transmitter 202 controls the voltage of the node DQI based on a signal transmitted as the signal DQ. The transmitter 202 has the same structure and function as the transmitter 302. Hereinafter, the signal transmitted as the signal DQ for the transmitter 202 will be called a "signal IN2".

The transmitter 202 includes a legacy transmitter 202X and an LVSTL transmitter 202Y. The transmitter 202 is capable of selecting, based on the type of the received signal IN2, whether to use the legacy transmitter 202X or the LVSTL transmitter 202Y for transmitting the signal. Types of the signal DQ and the transmitter for use (the legacy transmitter 202X or the LVSTL transmitter 202Y) will be described in more detail later.

For selecting the legacy transmitter 202X, the enable signal generating circuit 204 transmits the enable signal OUTEN1 being at a high level and the enable signal OUTEN2 being at a low level to the transmitter 202. For selecting the LVSTL transmitter 202Y, the enable signal generating circuit 204 transmits the enable signal OUTEN1 being at a low level and the enable signal OUTEN2 being at a high level to the transmitter 202.

The legacy transmitter 202X includes a PMOS transistor 202A, an NMOS transistor 202B, a NAND gate 202C, an inverter 202D, and a NOR gate 202E. As long as equivalent signal logic is derived, the legacy transmitter 202X is not limited to the structure shown in FIG. 10 and may, for example, further include one or more logical circuits, etc., including a NAND gate, an inverter, and the like.

The PMOS transistor 202A has its first end electrically connected to a node of the supply voltage VCCq. A second end of the PMOS transistor 202A is connected to the node DQI.

The NMOS transistor 202B has its first end connected to the node DQI. A second end of the NMOS transistor 202B is electrically connected to a node of the ground voltage VSSq.

A first input end of the NAND gate 202C receives the enable signal OUTEN1 from the enable signal generating circuit 204. A second input end of the NAND gate 202C receives the signal IN2 from the latch circuit 206. An output end of the NAND gate 202C is connected to a control terminal of the PMOS transistor 202A. The NAND gate 202C transmits the negative logical product obtained using the signal received at the first input end and the signal received at the second input end, from the output end to the control terminal of the PMOS transistor 202A.

The inverter 202D receives, at its input end, the enable signal OUTEN1 from the enable signal generating circuit 204. The inverter 202D transmits the logical inversion of the received signal OUTEN1, from its output end to a first input end of the NOR gate 202E.

The first input end of the NOR gate 202E is connected to the output end of the inverter 202D. A second input end of the NOR gate 202E receives the signal IN2 from the latch circuit 206. An output end of the NOR gate 202E is connected to a control terminal of the NMOS transistor 202B. The NOR gate 202E transmits the negative logical sum obtained using the signal received at the first input end and the signal received at the second input end, from the output end to the control terminal of the NMOS transistor 202B.

The LVSTL transmitter 202Y includes NMOS transistors 202F and 202G, an AND gate 202H, an inverter 202I, and a NOR gate 202J. As long as equivalent signal logic is derived, the LVSTL transmitter 202Y is not limited to the structure shown in FIG. 10 and may, for example, further include one or more logical circuits, etc., including a NAND gate, an inverter, and the like.

The NMOS transistor 202F has its first end electrically connected to a node of the supply voltage VCCq. A second end of the NMOS transistor 202F is connected to the node DQI.

The NMOS transistor 202G has its first end connected to the node DQI. A second end of the NMOS transistor 202G is electrically connected to a node of the ground voltage VSSq.

A first input end of the AND gate 202H receives the enable signal OUTEN2 from the enable signal generating circuit 204. A second input end of the AND gate 202H receives the signal IN2 from the latch circuit 206. The output end of the AND gate 202H is connected to a control terminal of the NMOS transistor 202F. The AND gate 202H transmits the logical product obtained using the signal received at the first input end and the signal received at the second input end, from the output end to the control terminal of the NMOS transistor 202F.

The inverter 202I receives, at its input end, the enable signal OUTEN2 from the enable signal generating circuit 204. The inverter 202I transmits the logical inversion of the received signal OUTEN2, from its output end to a first input end of the NOR gate 202J.

The first input end of the NOR gate 202J is connected to the output end of the inverter 202I. A second input end of the NOR gate 202J receives the signal IN2 from the latch circuit 206. An output end of the NOR gate 202J is connected to a control terminal of the NMOS transistor 202G. The NOR gate 202J transmits the negative logical sum obtained using the signal received at the first input end and the signal received at the second input end, from the output end to the control terminal of the NMOS transistor 202G.

In this manner, similar to the transmitter 302, the transmitter 202 switches between the legacy transmitter 202X and the LVSTL transmitter 202Y to generate a signal DQ, according to the information type to be conveyed by the signal DQ. For this switching, the low/high level adjustments of the enable signals OUTEN1 and OUTEN2 are performed. In other words, the transmitter 202 has two transmission modes, and which transmission mode is selected is determined according to the type of the signal DQ.

For the sake of distinction, the signal DQ transmitted based on the enable signal OUTEN1 (the signal DQ generated by the legacy transmitter 202X from the signal IN2) will be called a "signal Legacy_IN2". The signal DQ transmitted based on the enable signal OUTEN2 (the signal DQ generated by the LVSTL transmitter 202Y from the signal IN2) will be called a "signal LVSTL_IN2".

In instances where the LVSTL transmitter 202Y is used, the voltage VCCq is transferred via the NMOS transistor 202F, and accordingly, the transferred voltage is lower than the voltage VCCq by a threshold voltage of the NMOS transistor 202F. Therefore, the amplitude of the signal LVSTL_IN2 is smaller than that of the signal Legacy_IN2.

This means that the use of the LVSTL transmitter 202Y allows for the transmission of a signal DQ that has a smaller amplitude than in the case of using the legacy transmitter 202X. The transmitters 215, 216, 309 to 311, and 314 each have the same configuration and function as the transmitters 202 and 302, so their description will be omitted. Here, similar to "Legacy_IN1" and "LVSTL_IN1", the signal transmitted from the transmitter 309 and received by the receiver 212 may be called a "signal Legacy_DQS1" or a "signal LVSTL_DQS1". The signal transmitted from the transmitter 215 and received by the receiver 306 may be called a "signal Legacy_DQS2" or a "signal LVSTL_DQS2". The signals LVSTL_DQS1 and LVSTL_DQS2 have smaller amplitudes than the respective signals Legacy_DQS1 and Legacy_DQS2.

The signal transmitted from the transmitter 314 and received by the receiver 221 may be called a "signal Legacy_RE1" or a "signal LVSTL_RE1". The signal LVSTL_RE1 has a smaller amplitude than the signal Legacy_RE1.

The circuit diagrams of the transmitters 302 and 202 shown in FIGS. 9 and 10 each represent an example of the configuration. Thus, the circuit configurations of the transmitters 302 and 202 may include other structures as long as functions comparable to those described with reference to FIGS. 9 and 10 are retained. Note that the functions of the transmitters in the memory system 100 according to the first embodiment involve aspects wherein two transmission modes are available and wherein which transmission mode is selected is determined according to the type of the signal DQ.

FIGS. 11 and 12 set forth concrete examples of the configurations that may be adopted other than the configurations shown in FIGS. 9 and 10. FIGS. 11 and 12 are circuit diagrams each showing an exemplary configuration of a transmitter for the semiconductor memory device 200 according to the first embodiment. As noted with reference to FIG. 9, the transmitter 202 has the same structure and function as the transmitter 302. Thus, the description here will only assume the transmitter 202 as a representative example.

One example of the configuration of the transmitter 202 is given in FIG. 11. The transmitter 202 shown in FIG. 11 will be called a "transmitter 1202" for distinction from the transmitter 202 shown in FIG. 10. The description of the transmitter 1202 will mainly focus on differences from the transmitter 202.

The transmitter 1202, similar to the transmitter 202, has two transmission modes, and selects the transmission mode according to the type of a received signal DQ. The selection of the transmission mode is based on the level of the enable signal OUTEN1 or OUTEN2. Here, the signal DQ generated by the transmitter 1202 from the signal IN2 based on the signal OUTEN1 is called a "signal Legacy_IN2". The signal DQ generated by the transmitter 1202 from the signal IN2 based on the signal OUTEN2 is called a "signal LVSTL_IN2".

The transmitter 1202 has a configuration corresponding to the structure of the transmitter 202, from which the NMOS transistor 202B, the inverter 202D, and the NOR gate 202E are omitted. The functions of the omitted components, i.e., the NMOS transistor 202B, the inverter 202D, and the NOR gate 202E, are covered by the NMOS transistor 202G, the inverter 202I, and the NOR gate 202J, respectively.

More specifically, the transmitter 1202 includes a PMOS transistor 1202A, a NAND gate 1202C, NMOS transistors 1202F and 1202G, an AND gate 1202H, an inverter 1202I, and a NOR gate 1202J. As long as equivalent signal logic is derived, the transmitter 1202 is not limited to the structure shown in FIG. 11 and may, for example, further include one or more logical circuits, etc., including a NAND gate, an inverter, and the like. The PMOS transistor 1202A, the NAND gate 1202C, the NMOS transistors 1202F and 1202G, the AND gate 1202H, the inverter 1202I, and the NOR gate 1202J of the transmitter 1202 have the same configurations and functions as those of the PMOS transistor 202A, the NAND gate 202C, the NMOS transistors 202F and 202G, the AND gate 202H, the inverter 202I, and the NOR gate 202J of the transmitter 202, respectively.

The transmitter 1202, similar to the transmitter 202, uses the NMOS transistors 1202F and 1202G, the AND gate 1202H, the inverter 1202I, and the NOR gate 1202J, for transmitting the signal LVSTL_IN2. On the other hand, the transmitter 1202 uses the PMOS transistor 1202A, the NMOS transistor 1202G, the NAND gate 1202C, the inverter 1202I, and the NOR gate 1202J, for transmitting the signal Legacy_IN2. That is, the NMOS transistor 1202G, the inverter 1202I, and the NOR gate 1202J are used not only in the instance of transmitting the signal LVSTL_IN2, but also in the instance of transmitting the signal Legacy_IN2.

The inverter 1202I receives not only the signal OUTEN1 but also the signal OUTEN2 from the enable signal generating circuit 204. As discussed above, while the signal OUTEN1 is at the high level, the signal OUTEN2 is at the low level. Also, while the signal OUTEN1 is at the low level, the signal OUTEN2 is at the high level. Since the signal OUTEN1 and the signal OUTEN2 are not turned to the high level at the same time, the inverter 1202I can receive both the signal OUTEN1 and the signal OUTEN2. Therefore, the inverter 1202I is usable in both the instances of transmitting the signal Legacy_IN2 and transmitting the signal LVSTL_IN2.

Likewise, the NOR gate 1202J connected to the inverter 1202I, and the NMOS transistor 1202G connected to the NOR gate 1202J are also usable in both the instances of transmitting the signal Legacy_IN2 and transmitting the signal LVSTL_IN2.

In sum, in the case of the transmitter 202, the legacy transmitter 202X is used for transmitting the signal Legacy_IN2 and the LVSTL transmitter 202Y is used for transmitting the signal LVSTL_IN2, such that the components for use have been made completely discrete for the respective signals. In contrast, the transmitter 1202 employs some of the components of the LVSTL transmitter 202Y for common use so that the components of the legacy transmitter 202X are simplified. Since this can omit some of the components, the transmitter 1202 can downsize its circuit area as compared to the transmitter 202.

One example of the configuration of the transmitter 202 is given in FIG. 12. The transmitter 202 shown in FIG. 12 will be called a "transmitter 2202" for distinction from the transmitter 202 shown in FIG. 10. The description of the transmitter 2202 will mainly focus on differences from the transmitters 202 and 1202.

The transmitter 2202, similar to the transmitter 202, has two transmission modes, and selects the transmission mode according to the type of a received signal DQ. The selection of the transmission mode is based on the level of the enable signal OUTEN1 or OUTEN2. Here, the signal IN2 transmitted from the transmitter 2202 based on the enable signal OUTEN1 is called a "signal Legacy_IN2". The signal IN2 transmitted from the transmitter 2202 based on the enable signal OUTEN2 is called a "signal LVSTL_IN2".

The transmitter 2202 has a configuration corresponding to the structure of the transmitter 1202, from which the PMOS transistor 1202A and the NAND gate 1202C are omitted. The functions of the omitted components, i.e., the PMOS transistor 1202A and the NAND gate 1202C, are covered by the NMOS transistor 1202F and the AND gate 1202H, respectively.

More specifically, the transmitter 2202 includes NMOS transistors 2202F and 2202G, an AND gate 2202H, an inverter 2202I, and a NOR gate 2202J. As long as equivalent signal logic is derived, the transmitter 2202 is not limited to the structure shown in FIG. 12 and may, for example, further include one or more logical circuits, etc., including a NAND gate, an inverter, and the like. The NMOS transistors 2202F and 2202G, the AND gate 2202H, the inverter 2202I, and the NOR gate 2202J of the transmitter 2202 have the same configurations and functions as those of the NMOS transistors 1202F and 1202G, the AND gate 1202H, the inverter 1202I, and the NOR gate 1202J of the transmitter 1202, respectively. Note that the AND gate 2202H differs from the AND gate 202H in the following respect.

The AND gate 2202H receives one of the voltage VCCq and voltage VCCq+α which is dynamically selected. Among multiple MOS transistors constituting the AND gate 2202H, a PMOS transistor is connected to an output end and a first end of the AND gate 2202H and drives the voltage of the output end. At least another end of this PMOS transistor receives the dynamically selected one of the voltage VCCq and the voltage VCCq+α. The PMOS transistor will be called an "outputting PMOSFET".

While the outputting PMOSFET is in the state of receiving the voltage VCCq and also in the ON state, the output of the AND gate 2202H is driven with a voltage based on the voltage VCCq. On the other hand, while the outputting PMOSFET is in the state of receiving the voltage VCCq+α and also in the ON state, the output of the AND gate 2202H is driven with a voltage based on the voltage VCCq+α. The voltage based on the voltage VCCq+α is higher than the voltage based on the voltage VCCq. Accordingly, the output of the AND gate 2202H while the voltage VCCq+α is being used and the outputting PMOSFET is in the ON state (i.e., the H level at the voltage VCCq+α) is higher than the output of the AND gate 2202H while the voltage VCCq is being used and the outputting PMOSFET is in the ON state (i.e., the H level at the voltage VCCq). As such, the NMOS transistor 2202F is more strongly turned ON if the gate is in the state of receiving the H level at the voltage VCCq+α than in the case of the gate being in the state of receiving the H level at the voltage VCCq. Therefore, the output signal has a greater amplitude with the use of the voltage VCCq+α than with the use of the voltage VCCq.

The transmitter 2202, similar to the transmitter 1202, uses the NMOS transistors 2202F and 2202G, the AND gate 2202H, the inverter 2202I, and the NOR gate 2202J, for transmitting the signal LVSTL_IN2. Here, this form additionally involves a supply of the voltage VCCq to the AND gate 2202H. Meanwhile, the transmitter 2202 also uses the NMOS transistors 2202F and 2202G, the AND gate 2202H, the inverter 2202I, and the NOR gate 2202J, for transmitting the signal Legacy_IN2. Here, this form additionally involves a supply of the voltage VCCq+α to the AND gate 2202H. That is, the components of the transmitter 2202 are used not only in the instance of transmitting the signal LVSTL_IN2, but also in the instance of transmitting the signal Legacy_IN2.

The AND gate 2202H receives not only the signal OUTEN1 but also the signal OUTEN2 from the enable signal generating circuit 204. As discussed above, while the signal OUTEN1 is at the high level, the signal OUTEN2 is at the low level. Also, while the signal OUTEN1 is at the low level, the signal OUTEN2 is at the high level. Since the signal OUTEN1 and the signal OUTEN2 are not turned to the high level at the same time, the inverter 2202I can receive both the signal OUTEN1 and the signal OUTEN2. Therefore, the AND gate 2202H is usable in both the instances of transmitting the signal Legacy_IN2 and transmitting the signal LVSTL_IN2.

In sum, the transmitter 2202 employs all the components of the LVSTL transmitter 202Y for common use so that the legacy transmitter 202X is omitted. Since the legacy transmitter 202X can be omitted, the transmitter 2202 can downsize its circuit area as compared to the transmitter 202 and even the transmitter 1202.

Figure 13:
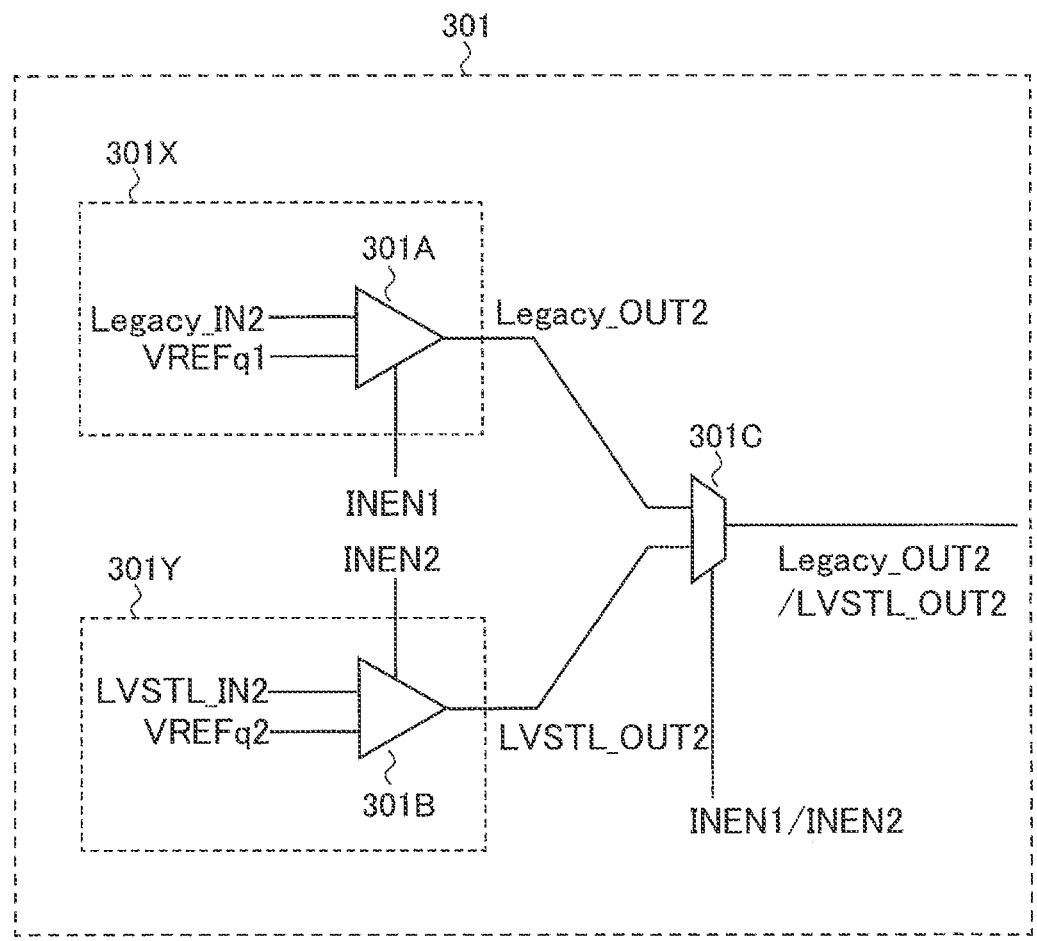
FIG. 13 is a circuit diagram showing an exemplary configuration of a receiver 301 for the semiconductor memory device 200 according to the first embodiment.

FIG. 13 is a circuit diagram showing an exemplary configuration of the receiver 301 for the semiconductor memory device 200 according to the first embodiment. FIG. 13 shows a detailed circuit structure of the receiver 301 described with reference to FIG. 5. As discussed above, the receiver 301 performs an operation associated with the receiving of the signal DQ based on the enable signals INEN1 and INEN2. The receiver 301 receives the signal Legacy_IN2 or the signal LVSTL_IN2 from the transmitter 202. In response to the transmitter 202 transmitting the signal Legacy_IN2, the enable signal generating circuit 304 transmits the high-level enable signal INEN1 and the low-level enable signal INEN2 to the receiver 301. Also, in response to the transmitter 202 transmitting the signal LVSTL_IN2, the enable signal generating circuit 304 transmits the low-level enable signal INEN1 and the high-level enable signal INEN2 to the receiver 301.

The receiver 301 includes a legacy receiver 301X, an LVSTL receiver 301Y, and a selector 301C. The receiver 301 is capable of selecting, based on the type of the signal to be received from the transmitter 202, whether to use the legacy receiver 301X or the LVSTL receiver 301Y. More specifically, in response to the transmitter 202 transmitting the signal Legacy_IN2, the receiver 301 uses the legacy receiver 301X to receive the signal Legacy_IN2. In response to the transmitter 202 transmitting the signal LVSTL_IN2, the receiver 301 uses the LVSTL receiver 301Y to receive the signal LVSTL_IN2.

The legacy receiver 301X includes a differential amplifier circuit 301A. The differential amplifier circuit 301A receives the signal Legacy_IN2 at its first input end. The differential amplifier circuit 301A receives application of the reference voltage VREFq1 at its second input end. The differential amplifier circuit 301A receives the enable signal INEN1 from the enable signal generating circuit 304. With the enable signal INEN1 being at the high level, the differential amplifier circuit 301A is placed in the enabled state. The differential amplifier circuit 301A performs differential amplification of the received signal Legacy_IN2 with the reference voltage VREFq1 to generate a signal Legacy_OUT2. The differential amplifier circuit 301A transmits the signal Legacy_OUT2 from its output end to the selector 301C. The differential amplifier circuit 301A will be described in more detail later.

The LVSTL receiver 301Y includes a differential amplifier circuit 301B. The differential amplifier circuit 301B receives the signal LVSTL_IN2 at its first input end. The differential amplifier circuit 301B receives application of the reference voltage VREFq2 at its second input end. The differential amplifier circuit 301B receives the enable signal INEN2 from the enable signal generating circuit 304. With the enable signal INEN2 being at the high level, the differential amplifier circuit 301B is placed in the enabled state. The differential amplifier circuit 301B performs differential amplification of the received signal LVSTL_IN2 with the reference voltage VREFq2 to generate a signal LVSTL_OUT2. The differential amplifier circuit 301B transmits the signal LVSTL_OUT2 from its output end to the selector 301C. The differential amplifier circuit 301B will be described in more detail later.

The selector 301C receives the signal Legacy_OUT2 and the signal LVSTL_OUT2. The selector 301C receives the enable signals INEN1 and INEN2 from the enable signal generating circuit 304. The selector 301C outputs the received signal Legacy_OUT2 to another component in the memory controller 300 if the enable signal INEN1 is at the high level. The selector 301C outputs the received signal LVSTL_OUT2 to another component in the memory controller 300 if the enable signal INEN2 is at the high level.

In this manner, according to the type of a signal DQ transmitted from the transmitter 202, the receiver 301 switches between the legacy receiver 301X and the LVSTL receiver 301Y to receive the signal DQ. For this switching, the low/high level adjustments of the enable signals INEN1 and INEN2 are performed. In other words, the receiver 301 has two reception modes, and which reception mode is selected is determined according to the type of the signal DQ.

Since the output signal LVSTL_OUT2 given using the LVSTL receiver 301Y is based on the signal LVSTL_IN2, it has a smaller amplitude than the output signal Legacy_OUT2 given using the Legacy receiver 301X (i.e., a signal based on the signal Legacy_IN2).

Next, the circuit structure of the receiver 201 will be described. FIG. 14 is a circuit diagram showing an exemplary configuration of the receiver 201 for the semiconductor memory device 200 according to the first embodiment. FIG. 14 shows a detailed circuit structure of the receiver 201 described with reference to FIG. 5. As discussed above, the receiver 201 performs an operation associated with the receiving of the signal DQ based on the enable signals INEN1 and INEN2. The receiver 201 has the same structure and function as the receiver 201.

The receiver 201 receives the signal Legacy_IN1 or the signal LVSTL_IN1 from the transmitter 302. In response to the transmitter 302 transmitting the signal Legacy_IN1, the enable signal generating circuit 204 transmits the high-level enable signal INEN1 and the low-level enable signal INEN2 to the receiver 201. Also, in response to the transmitter 302 transmitting the signal LVSTL_IN1, the enable signal generating circuit 204 transmits the low-level enable signal INEN1 and the high-level enable signal INEN2 to the receiver 201.

The receiver 201 includes a legacy receiver 201X, an LVSTL receiver 201Y, and a selector 201C. The receiver 201 is capable of selecting, based on the type of the signal to be received from the transmitter 302, whether to use the legacy receiver 201X or the LVSTL receiver 201Y. More specifically, in response to the transmitter 302 transmitting the signal Legacy_IN1, the receiver 201 uses the legacy receiver 201X to receive the signal Legacy_IN1. In response to the transmitter 302 transmitting the signal LVSTL_IN1, the receiver 201 uses the LVSTL receiver 201Y to receive the signal LVSTL_IN1.

The legacy receiver 201X includes a differential amplifier circuit 201A. The differential amplifier circuit 201A receives the signal Legacy_IN1 at its first input end. The differential amplifier circuit 201A receives application of the reference voltage VREFq1 at its second input end. The differential amplifier circuit 201A receives the enable signal INEN1 from the enable signal generating circuit 204. With the enable signal INEN1 being at the high level, the differential amplifier circuit 201A is placed in the enabled state. The differential amplifier circuit 201A performs differential amplification of the received signal Legacy_IN1 with the reference voltage VREFq1 to generate a signal Legacy_OUT1. The differential amplifier circuit 201A transmits the signal Legacy_OUT1 from its output end to the selector 201C. The differential amplifier circuit 201A will be described in more detail later.

The LVSTL receiver 201Y includes a differential amplifier circuit 201B. The differential amplifier circuit 201B receives the signal LVSTL_IN1 at its first input end. The differential amplifier circuit 201B receives application of the reference voltage VREFq2 at its second input end. The differential amplifier circuit 201B receives the enable signal INEN2 from the enable signal generating circuit 204. With the enable signal INEN2 being at the high level, the differential amplifier circuit 201B is placed in the enabled state. The differential amplifier circuit 201B performs differential amplification of the received signal LVSTL_IN1 with the reference voltage VREFq2 to generate a signal LVSTL_OUT1. The differential amplifier circuit 201B transmits the signal LVSTL_OUT1 from its output end to the selector 201C. The differential amplifier circuit 201B will be described in more detail later.

The selector 201C receives the signal Legacy_OUT1 and the signal LVSTL_OUT1. The selector 201C receives the enable signals INEN1 and INEN2 from the enable signal generating circuit 204. The selector 201C outputs the received signal Legacy_OUT1 to the latch circuit 206 if the enable signal INEN1 is at the high level. The selector 201C outputs the received signal LVSTL_OUT1 to the latch circuit 206 if the enable signal INEN2 is at the high level.

In this manner, according to the type of a signal DQ transmitted from the transmitter 302, the receiver 201 switches between the legacy receiver 201X and the LVSTL receiver 201Y to receive the signal DQ. For this switching, the low/high level adjustments of the enable signals INEN1 and INEN2 are performed. In other words, the receiver 201 has two reception modes, and which reception mode is selected is determined according to the type of the signal DQ.

Since the output signal LVSTL_OUT1 given using the LVSTL receiver 201Y is based on the signal LVSTL_IN1, it has a smaller amplitude than the output signal Legacy_OUT1 given using the Legacy receiver 201X (i.e., a signal based on the signal Legacy_IN1). The receivers 212 to 214, 221, 306, and 307 each have the same configuration and function as the receivers 201 and 301, so their description will be omitted.

The circuit diagrams of the receivers 301 and 201 shown in FIG. 14, etc. each represent an example of the configuration. Thus, the circuit configurations of the receivers 301 and 201 may include other structures as long as functions comparable to those described with reference to FIG. 14, etc. are retained. Note that the functions of the receivers for the semiconductor memory device 200 according to the first embodiment involve aspects wherein two reception modes are available and wherein which reception mode is selected is determined according to the type of the signal DQ.

FIG. 15 is a circuit diagram showing an exemplary configuration of the differential amplifier circuit 201A in the receiver 201 according to the first embodiment. FIG. 15 shows a detailed circuit structure of the differential amplifier circuit 201A described with reference to FIG. 14. The differential amplifier circuits 301A and 301B described with reference to FIG. 13, and the differential amplifier circuit 201B described with reference to FIG. 14, all have the same structure and function as the differential amplifier circuit 201A. Thus, the description here will be given only of the differential amplifier circuit 201A as a representative example.

As described above, the differential amplifier circuit 201A performs differential amplification of the signal Legacy_IN1 with the reference voltage VREFq1 based on the enable signal INEN1 to output the result as the signal Legacy_OUT1. The differential amplifier circuit 201A includes PMOS transistors 201a, 201b, 201c, and 201d, NMOS transistors 201e, 201f, and 201g, and an inverter circuit group 201h. As long as equivalent signal logic is derived, the differential amplifier circuit 201A may, for example, further include one or more logical circuits, etc., including a NAND gate, an inverter, and the like.

First ends of the PMOS transistors 201a and 201b are electrically connected to a node of the supply voltage VCCq. Control terminals of the PMOS transistors 201a and 201b are connected to the enable signal generating circuit 204 and receive the enable signal INEN1.

Second ends of the PMOS transistors 201a and 201b are connected to the first ends of the PMOS transistors 201c and 201d, respectively. A control terminal of the PMOS transistor 201c is connected to a control terminal of the PMOS transistor 201d. These control terminals of the PMOS transistors 201c and 201d are connected to a second end of the PMOS transistor 201c. The second end of the PMOS transistor 201c is also connected to a first end of the NMOS transistor 201e. A second end of the PMOS transistor 201d is connected to a first end of the NMOS transistor 201f. A control terminal of the NMOS transistor 201e is connected to the reference voltage generating circuit 205 and receives application of the reference voltage VREFq1. A control terminal of the NMOS transistor 201f is connected to the node DQI and receives the signal Legacy_IN1.

Second ends of the NMOS transistors 201e and 201f are connected to a first end of the NMOS transistor 201g. A control terminal of the NMOS transistor 201g receives application of a bias voltage Vbias. The bias voltage Vbias is a voltage to turn ON the NMOS transistor 201g. A second end of the NMOS transistor 201g is connected to a node of the ground voltage VSSq. The second end of the PMOS transistor 201d and the first end of the NMOS transistor 201f are also connected to an input end of the inverter circuit group 201h. An output end of the inverter circuit group 201h is connected to the latch circuit 206 for transmitting the signal Legacy_OUT1.

The differential amplifier circuit 201A enters the enabled state upon receiving the high-level enable signal INEN1 and performs differential amplification of the signal Legacy_IN1 with the reference voltage VREFq1. The inverter circuit group 201h shapes the waveform of the signal that has undergone the differential amplification, and outputs the signal Legacy_OUT1.

FIG. 16 sets forth a concrete example of the configurations that may be adopted other than the configurations shown in FIGS. 13 and 14. FIG. 16 is a circuit diagram showing an exemplary configuration of a receiver for the semiconductor memory device 200 according to the first embodiment. As noted with reference to FIG. 14, the receiver 201 has the same structure and function as the receiver 301. Thus, the description here will only assume the receiver 201 as a representative example.

One example of the configuration of the receiver 201 is given in FIG. 16. The receiver 201 shown in FIG. 16 will be called a "receiver 1201" for distinction from the receiver 201 shown in FIG. 14. The description of the receiver 1201 will mainly focus on differences from the transmitter 201.

The receiver 1201, similar to the receiver 201, has two reception modes, and selects the reception mode according to the type of a signal DQ to receive. The selection of the reception mode is based on the level of the enable signal INEN1 or INEN2. Here, the signal Legacy_IN1 output from the receiver 1201 based on the enable signal INEN1 is called a "signal Legacy_OUT1". The signal LVSTL_IN1 output from the receiver 1201 based on the enable signal INEN2 is called a "signal LVSTL_OUT1".

The receiver 1201 receives the signal Legacy_IN1 or the signal LVSTL_IN1 from the transmitter 302. In response to the transmitter 302 transmitting the signal Legacy_IN1, the enable signal generating circuit 204 transmits the high-level enable signal INEN1 and the low-level enable signal INEN2 to the receiver 201. Also, in response to the transmitter 302 transmitting the signal LVSTL_IN1, the enable signal generating circuit 204 transmits the low-level enable signal INEN1 and the high-level enable signal INEN2 to the receiver 201.

The receiver 1201 includes a differential amplifier circuit 1201A and a selector 2101B. The differential amplifier circuit 1201A has the same structure and function as the differential amplifier circuit 201A, so its description will be omitted. The selector 1201B receives the reference voltage VREFq1 and the reference voltage VREFq2. The selector 1201B receives the enable signals INEN1 and INEN2 from the enable signal generating circuit 204. The selector 1201B outputs the received reference voltage VREFq1 to a second input end of the differential amplifier circuit 1201A if the enable signal INEN1 is at the high level. The selector 1201B outputs the received reference voltage VREFq2 to the second input end of the differential amplifier circuit 1201A if the enable signal INEN2 is at the high level.

The differential amplifier circuit 1201A receives the signal Legacy_IN1 or the signal LVSTL_IN1 at its first input end. The differential amplifier circuit 1201A receives application of the reference voltage VREFq1 or the reference voltage VREFq2 at its second input end. The differential amplifier circuit 1201A receives the enable signals INEN1 and INEN2 from the enable signal generating circuit 204.

In the event where the differential amplifier circuit 1201A receives the signal Legacy_IN1, the enable signal INEN1 is at the high level and the enable signal INEN2 is at the low level. With the enable signal INEN1 being at the high level, the reference voltage VREFq1 is applied to the second input end of the differential amplifier circuit 1201A. The differential amplifier circuit 1201A then performs differential amplification of the received signal Legacy_IN1 with the reference voltage VREFq1 to generate the signal Legacy_OUT1. The differential amplifier circuit 1201A transmits the signal Legacy_OUT1 from its output end to the latch circuit 206.

In the event where the differential amplifier circuit 1201A receives the signal LVSTL_IN1, the enable signal INEN2 is at the high level and the enable signal INEN1 is at the low level. With the enable signal INEN2 being at the high level, the reference voltage VREFq2 is applied to the second input end of the differential amplifier circuit 1201A. The differential amplifier circuit 1201A then performs differential amplification of the received signal LVSTL_IN1 with the reference voltage VREFq2 to generate the signal LVST- L_OUT1. The differential amplifier circuit 1201A transmits the signal LVSTL_OUT1 from its output end to the latch circuit 206.

In this manner, according to the type of a signal DQ transmitted from the transmitter 302, the receiver 1201 switches between generation of the signal Legacy_OUT1 and generation of the signal LVSTL_OUT1. For this switching, the low/high level adjustments of the enable signals INEN1 and INEN2 are performed. In other words, the receiver 1201 has two reception modes, and which reception mode is selected is determined according to the type of the signal DQ.

Since the output signal LVSTL_OUT1 is based on the signal LVSTL_IN1, it has a smaller amplitude than the output signal Legacy_OUT1 which is based on the signal Legacy_IN1.

The receiver 201 includes two differential amplifier circuits which are used separately depending on the signals, such that the differential amplifier circuit 201A is used in the case of receiving the signal Legacy_IN1 and the differential amplifier circuit 201B is used in the case of receiving the signal LVSTL_IN1. In contrast, the receiver 1201 uses the differential amplifier circuit 1201A in both the case of receiving the signal Legacy_IN1 and the case of receiving the signal LVSTL_IN1 so that its components are simplified. In the event where the receiver 201 receives the signal Legacy_IN1, the enable signal INEN1 is at the high level, and in the event where the differential amplifier circuit 1201A receives the signal LVSTL_IN1, the enable signal INEN2 is at the high level. Accordingly, selection of the reference voltage for use is possible. The reference voltage can be selected with the use of the enable signals INEN, and this allows the receiver 1201 to utilize the differential amplifier circuit 1201A in both the cases of receiving the signal Legacy_IN1 and receiving the signal LVSTL_IN1. As such, since some of the components can be thereby omitted, the receiver 1201 can downsize its circuit area as compared to the receiver 201.

Figure 17:
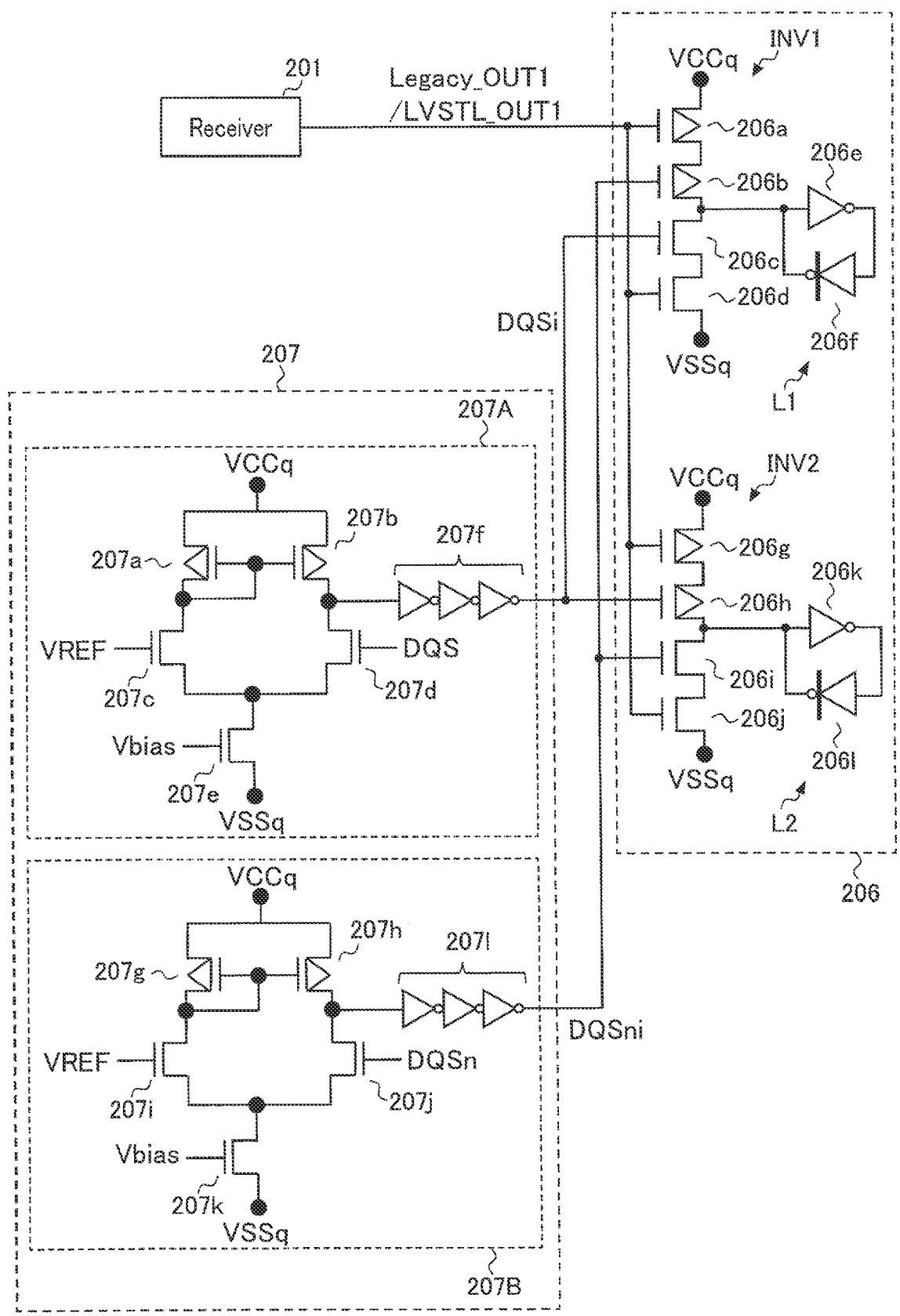
FIG. 17 is a circuit diagram showing exemplary configurations of the receiver 201, a latch circuit 206, and a differential amplifier circuit 207 in the semiconductor memory device 200 according to the first embodiment.

FIG. 17 is a circuit diagram showing exemplary configurations of the receiver 201, the latch circuit 206, and the differential amplifier circuit 207 in the semiconductor memory device 200 according to the first embodiment. FIG. 17 shows a detailed circuit structure of the latch circuit 206 and the differential amplifier circuit 207 described with reference to FIG. 6. As described above, the latch circuit 206 holds the signal DQ received from the receiver 201. The latch circuit 206 transmits the signal DQ to the transmitter 202. The differential amplifier circuit 207 controls the latch circuit 206 according to the signals DQS and DQSn received from the receivers 212 and 213.

First, an exemplary configuration of the differential amplifier circuit 207 will be described. The differential amplifier circuit 207 includes a first differential amplifier circuit 207A and a second differential amplifier circuit 207B. As long as equivalent signal logic is derived, the differential amplifier circuit 207 or the first differential amplifier circuit 207A and the second differential amplifier circuit 207B are not limited to the structure shown in FIG. 17 and may, for example, further include one or more logical circuits, etc., including a NAND gate, an inverter, and the like. The first differential amplifier circuit 207A performs differential amplification of the signal DQS with the reference voltage VREF to output the result referred to as a "signal DQSi" to the latch circuit 206. The reference voltage VREF is a voltage serving as a reference for the signal DQS.

The first differential amplifier circuit 207A includes PMOS transistors 207a and 207b, NMOS transistors 207c, 207d, and 207e, and an inverter circuit group 207f. As long as equivalent signal logic is derived, the first differential amplifier circuit 207A may, for example, further include one or more logical circuits, etc., including a NAND gate, an inverter, and the like.

First ends of the PMOS transistors 207a and 207b are electrically connected to a node of the supply voltage VCCq. A control terminal of the PMOS transistor 207a is connected to a control terminal of the PMOS transistor 207b. These control terminals of the PMOS transistors 207a and 207b are connected to a second end of the PMOS transistor 207a. The second end of the PMOS transistor 207a is also connected to a first end of the NMOS transistor 207c. A second end of the PMOS transistor 207b is connected to a first end of the NMOS transistor 207d. A control terminal of the NMOS transistor 207c receives application of the reference voltage VREF. A control terminal of the NMOS transistor 207d is connected to the receiver 212 and receives the signal DQS.

Second ends of the NMOS transistors 207c and 207d are connected to a first end of the NMOS transistor 207e. A control terminal of the NMOS transistor 207e receives application of a bias voltage Vbias. The bias voltage Vbias is a voltage to turn ON the NMOS transistor 207e. A second end of the NMOS transistor 207e is connected to a node of the ground voltage VSSq. The second end of the PMOS transistor 207b and the first end of the NMOS transistor 207d are also connected to an input end of the inverter circuit group 207f. An output end of the inverter circuit group 207f is connected to the latch circuit 206 for transmitting the signal DQSi.

With the application of the bias voltage Vbias, the first differential amplifier circuit 207A is placed in the enabled state and performs differential amplification of the signal DQS with the reference voltage VREF. The inverter circuit group 207f shapes the waveform of the signal that has undergone the differential amplification, and outputs the signal DQSi to the latch circuit 206.

The second differential amplifier circuit 207B performs differential amplification of the signal DQSn with the reference voltage VREF to output the result referred to as a "signal DQSni" to the latch circuit 206. The reference voltage VREF is a voltage serving as a reference for the signal DQSn. The second differential amplifier circuit 207B has the same structure and function as the first differential amplifier circuit 207A.

The second differential amplifier circuit 207B includes PMOS transistors 207g and 207h, NMOS transistors 207i, 207j, and 207k, and an inverter circuit group 207l. As long as equivalent signal logic is derived, the second differential amplifier circuit 207B may, for example, further include one or more logical circuits, etc., including a NAND gate, an inverter, and the like.

First ends of the PMOS transistors 207g and 207h are electrically connected to a node of the supply voltage VCCq. A control terminal of the PMOS transistor 207g is connected to a control terminal of the PMOS transistor 207h. These control terminals of the PMOS transistors 207g and 207h are connected to a second end of the PMOS transistor 207g. The second end of the PMOS transistor 207g is also connected to a first end of the NMOS transistor 207i. A second end of the PMOS transistor 207h is connected to a first end of the NMOS transistor 207j. A control terminal of the NMOS transistor 207i receives application of the reference voltage VREF. A control terminal of the NMOS transistor 207j is connected to the receiver 213 and receives the signal DQSn.

Second ends of the NMOS transistors 207i and 207j are connected to a first end of the NMOS transistor 207k. A control terminal of the NMOS transistor 207*k* receives application of a bias voltage Vbias. The bias voltage Vbias is a voltage to turn ON the NMOS transistor 207*k*. A second end of the NMOS transistor 207*k* is connected to a node of the ground voltage VSSq. The second end of the PMOS transistor 207*h* and the first end of the NMOS transistor 207*j* are also connected to an input end of the inverter circuit group 207*l*. An output end of the inverter circuit group 207*l* is connected to the latch circuit 206 for transmitting the signal DQSni. Here, as the signal DQSn is a signal corresponding to the signal DQS with its high/low level inverted, the signal DQSni is a signal corresponding to the signal DQSi with its high/low level inverted.

With the application of the bias voltage Vbias, the second differential amplifier circuit 207B is placed in the enabled state and performs differential amplification of the signal DQSn with the reference voltage VREF. The inverter circuit group 207*l* shapes the waveform of the signal that has undergone the differential amplification, and outputs the signal DQSni to the latch circuit 206.

Next, an exemplary configuration of the latch circuit 206 will be described. The latch circuit 206 includes inverters INV1 and INV2, a first latch circuit L1, and a second latch circuit L2. As long as equivalent signal logic is derived, the latch circuit 206 is not limited to the structure shown in FIG. 17 and may, for example, further include one or more logical circuits, etc., including a NAND gate, an inverter, and the like.

The inverter INV1 includes PMOS transistors 206*a* and 206*b*, and NMOS transistors 206*c* and 206*d*. The PMOS transistors 206*a* and 206*b*, and the NMOS transistors 206*c* and 206*d* are connected in series. A first end of the PMOS transistor 206*a* is connected to a node of the supply voltage VCCq. A first end of the PMOS transistor 206*b* is connected to a second end of the PMOS transistor 206*a*. A first end of the NMOS transistor 206*c* is connected to a second end of the PMOS transistor 206*b*. A first end of the NMOS transistor 206*d* is connected to a second end of the NMOS transistor 206*c*. A second end of the NMOS transistor 206*d* is connected to a node of the ground voltage VSSq. The second end of the PMOS transistor 206*b* and the first end of the NMOS transistor 206*c* are also connected to the first latch circuit L1.

Control terminals of the PMOS transistor 206*a* and the NMOS transistor 206*d* are connected to the receiver 201 and receive the signal Legacy_OUT1 or the signal LVST-L_OUT1. A control terminal of the PMOS transistor 206*b* is connected to an output end of the inverter circuit group 207*l* in the second differential amplifier circuit 207B and receives the signal DQSni. A control terminal of the NMOS transistor 206*c* is connected to an output end of the inverter circuit group 207*f* in the first differential amplifier circuit 207A and receives the signal DQSi.

The first latch circuit L1 includes an inverter 206*e* and a clocked inverter 206*f*. The inverter 206*e* and the clocked inverter 206*f* are provided in a cross-connection arrangement. An input end of the inverter 206*e* and an output end of the clocked inverter 206*f* are connected to an output end of the inverter INV1. An output end of the inverter 206*e* is connected to an input end of the clocked inverter 206*f*. The clocked inverter 206*f* is switched between an inverter output state and an inverter output halt state according to the signals DQSi and DQSni. The clocked inverter 206*f* in the inverter output state outputs, from its output end, a signal corresponding to a signal input to its input end, with an inverted logic level. The clocked inverter 206*f* in the inverter output halt state does not output a signal from the output end, regardless of the logic level of the signal input to the input end.

The inverter INV2 includes PMOS transistors 206*g* and 206*h*, and NMOS transistors 206*i* and 206*j*. The PMOS transistors 206*g* and 206*h*, and the NMOS transistors 206*i* and 206*j* are connected in series. A first end of the PMOS transistor 206*g* is connected to a node of the supply voltage VCCq. A first end of the PMOS transistor 206*h* is connected to a second end of the PMOS transistor 206*g*. A first end of the NMOS transistor 206*i* is connected to a second end of the PMOS transistor 206*h*. A first end of the NMOS transistor 206*j* is connected to a second end of the NMOS transistor 206*i*. A second end of the NMOS transistor 206*j* is connected to a node of the ground voltage VSSq. The second end of the PMOS transistor 206*h* and the first end of the NMOS transistor 206*i* are also connected to the second latch circuit L2.

Control terminals of the PMOS transistor 206*g* and the NMOS transistor 206*j* are connected to the receiver 201 and receive the signal Legacy_OUT1 or the signal LVST-L_OUT1. A control terminal of the PMOS transistor 206*h* is connected to an output end of the inverter circuit group 207*f* in the first differential amplifier circuit 207A and receives the signal DQSi. A control terminal of the NMOS transistor 206*i* is connected to an output end of the inverter circuit group 207*l* in the second differential amplifier circuit 207B and receives the signal DQSni.

The second latch circuit L2 includes an inverter 206*k* and a clocked inverter 206*l*. The inverter 206*k* and the clocked inverter 206*l* are provided in a cross connection arrangement. An input end of the inverter 206*k* and an output end of the clocked inverter 206*l* are connected to an output end of the inverter INV2. An output end of the inverter 206*k* is connected to an input end of the clocked inverter 206*l*. The clocked inverter 206*l* has the same function as the clocked inverter 206*f*.

As one example, the behavior of the latch circuit 206 in the case of the signal DQSi being at the high level will be noted. The signal DQSni, which is inversion signal of the signal DQSi, is at the low level here. The control terminals of the NMOS transistor 206*c* and the PMOS transistor 206*h* receive the high-level signal DQSi. The control terminals of the PMOS transistor 206*b* and the NMOS transistor 206*i* receive the low-level signal DQSni. Accordingly, the PMOS transistor 206*b* and the NMOS transistor 206*c* in the inverter INV1 are placed in the ON state, and the signal Legacy_OUT1 or the signal LVSTL_OUT1 received by the PMOS transistor 206*a* and the NMOS transistor 206*d* passes through the inverter INV1. The signal that has passed through the inverter INV1 is held by the first latch circuit L1.

Meanwhile, the PMOS transistor 206*h* and the NMOS transistor 206*i* in the inverter INV2 are placed in the OFF state, and the signal Legacy_OUT1 or the signal LVST-L_OUT1 received by the PMOS transistor 206*g* and the NMOS transistor 206*j* is not permitted to pass through the inverter INV2.

Also as one example, the behavior of the latch circuit 206 in the case of the signal DQSi being at the low level will be noted. Being an inversion signal of the signal DQSi, the signal DQSni is at the high level here. The control terminals of the NMOS transistor 206*c* and the PMOS transistor 206*h* receive the low-level signal DQSi. The control terminals of the PMOS transistor 206*b* and the NMOS transistor 206*i* receive the high-level signal DQSni. Accordingly, the PMOS transistor 206*h* and the NMOS transistor 206*i* in the inverter INV2 are placed in the ON state, and the signal Legacy_OUT1 or the signal LVSTL_OUT1 received by the PMOS transistor 206g and the NMOS transistor 206j passes through the inverter INV2. The signal that has passed through the inverter INV2 is held by the second latch circuit L2.

Meanwhile, the PMOS transistor 206b and the NMOS transistor 206c in the inverter INV1 are placed in the OFF state, and the signal Legacy_OUT1 or the signal LVSTL_OUT1 received by the PMOS transistor 206a and the NMOS transistor 206d is not permitted to pass through the inverter INV1.

In this manner, the latch circuit 206 can hold the signal LVSTL_OUT1 or the signal Legacy_OUT1 based on the signals DQSi and DQSni shaped by the differential amplifier circuit 207.

(1-2) Operations

The foregoing descriptions of the transmission and reception modes and the termination modes for the semiconductor memory device 200 have assumed, by way of example, the case of the NAND chip A 200A included in the semiconductor memory device 200 (described with reference to FIG. 2). The NAND chip B 200B, the NAND chip C 200C, and the NAND chip D 200D also adopt similar transmission and reception modes and termination modes.

As discussed earlier, selection of the NAND chip A 200A (i.e., a case of the NAND chip A 200A being a selected NAND chip) may be accompanied by either or both of the enabling of the terminating circuit or circuits of the selected NAND chip and the enabling of the terminating circuit or circuits of non-selected NAND chips. The first embodiment will assume the instances where the selected NAND chip is the NAND chip A 200A and the terminating circuit or circuits of the NAND chip A 200A are enabled.

Here, the NAND chip A 200A and the NAND chip B 200B are chips each receiving the chip enable signal CEn1 and transmitting the signal RBn1. The NAND chip C 200C and the NAND chip D 200D are chips each receiving the chip enable signal CEn2 and transmitting the signal RBn2.

A description will be given of the termination modes for the semiconductor memory device 200 and the memory controller 300 according to the first embodiment to receive a signal DQ. FIG. 18 illustrates a given mode of terminating a signal DQ in the semiconductor memory device 200 and the memory controller 300 according to the first embodiment. As shown in FIG. 18, the terminating circuit 303 terminates the node DQO in the case of the receiver 301 receiving the signal LVSTL_IN2. In the case of the receiver 301 receiving the signal Legacy_IN2, the terminating circuit 303 does not terminate the node DQO.

Also, the terminating circuit 203 terminates the node DQI in the case of the receiver 201 receiving the signal LVSTL_IN1. In the case of the receiver 201 receiving the signal Legacy_IN1, the terminating circuit 203 does not terminate the node DQI.

As described so far, the semiconductor memory device 200 according to the first embodiment has two transmission modes for each of the signals DQ, DQS, and DQSn, and two reception modes for each of the signals DQ, DQS, DQSn, REn, and RE. Which transmission and reception modes should be selected is determined according to the type of the signal DQ. The semiconductor memory device 200 can also select the termination mode according to the transmission and reception modes. The terminating circuit 203 of the NAND chip A 200A is used for terminating the node DQI. Similarly, the memory controller 300 according to the first embodiment has two transmission modes for each of the signals DQ, DQS, DQSn, REn, and RE, and two reception modes for each of the signals DQ, DQS, and DQSn. Which transmission and reception modes should be selected is determined according to the type of the signal DQ. The memory controller 300 can also select the termination mode according to the transmission and reception modes.

In one example, the types of the signal DQ may include six types, namely, a command or an address, a status, a parallel status, FeatureData, a DataOutput, and a DataInput. The type status is information sent in response to a status read command and related to a specific status of the semiconductor memory device 200. The type parallel status is information sent in response to a parallel status read command and related to the status of each of the multiple NAND chips. The type FeatureData is information related to internal setting parameters of the NAND chips. The FeatureData as a setting parameter is transmitted along with a SetFeature command. The transmission and reception modes and the termination modes for the signals DQ, DQS, DQSn, REn, and RE, in the instances of transmitting and receiving these six types of signals DQ, will be described.

FIG. 19 sets forth, as one example, the transmission and reception modes and the termination modes for signals DQ, DQS, and RE. Although FIG. 19 illustrates the signal DQS from among the signals DQS and DQSn, the signal DQSn corresponds to an inverted logic signal of the signal DQS, and therefore, what is shown for the signal DQS is likewise applicable to it. Also, although FIG. 19 illustrates the signal RE from among the signals REn and RE, the signal REn corresponds to an inverted logic signal of the signal RE, and therefore, what is shown for the signal RE is likewise applicable to it. As mentioned in relation to FIG. 18, the first embodiment assumes the use of only the terminating circuit or circuits 203, 218, 219, 220, and/or 222 of the NAND chip A 200A, i.e., the selected NAND chip, among the terminating circuits in the semiconductor memory device 200. As shown in FIG. 19, if the type of the signal DQ is a command or an address, the signal Legacy_IN1 is transmitted as the signal DQ from the memory controller 300 and received by the NAND chip A 200A and the NAND chip B 200B. Signals transmitted as the signals DQS and RE from the memory controller 300 are fixed at the low level.

Referring to the next, if the type of the signal DQ is a status, the signal Legacy_IN2 is transmitted as the signal DQ from the NAND chip A 200A and received by the memory controller 300. Also, the signal Legacy_DQS2 is transmitted as the signal DQS from the NAND chip A 200A and received by the memory controller 300. The signal Legacy_RE1 is transmitted as the signal RE from the memory controller 300 and received by the NAND chip A 200A.

Referring to the next, if the type of the signal DQ is a parallel status, the signal Legacy_IN2 is transmitted as the signal DQ from the NAND chip A 200A and the NAND chip B 200B, and received by the memory controller 300. Also, the signal Legacy_DQS2 is transmitted as the signal DQS from the NAND chip A 200A and the NAND chip B 200B, and received by the memory controller 300. The signal Legacy_RE1 is transmitted as the signal RE from the memory controller 300 and received by the NAND chip A 200A and the NAND chip B 200B.

Referring to the next, if the type of the signal DQ is FeatureData, the signal LVSTL_IN1 is transmitted as the signal DQ from the memory controller 300 and received by the NAND chip A 200A. Here, the terminating circuit 203 of the NAND chip A 200A terminates the node DQI. Also, the signal LVSTL_DQS1 is transmitted as the signal DQS from the memory controller 300 and received by the NAND chip A 200A. Here, the terminating circuits 218 and 219 of the NAND chip A 200A terminate the nodes DQSI and DQSnI. A signal transmitted as the signal RE from the memory controller 300 is fixed at the low level.

Referring to the next, if the type of the signal DQ is DataOutput, the signal LVSTL_IN2 is transmitted as the signal DQ from the NAND chip A 200A and received by the memory controller 300. Here, the terminating circuit 303 of the memory controller 300 terminates the node DQO. Also, the signal LVSTL_DQS2 is transmitted as the signal DQS from the NAND chip A 200A and received by the memory controller 300. Here, the terminating circuits 312 and 313 of the memory controller 300 terminate the nodes DQSO and DQSnO. Also, the signal LVSTL_RE1 is transmitted as the signal RE from the memory controller 300 and received by the NAND chip A 200A. Here, the terminating circuits 220 and 222 of the NAND chip A 200A terminate the nodes REnI and REI.

Referring to the next, if the type of the signal DQ is DataInput, the signal LVSTL_IN1 is transmitted as the signal DQ from the memory controller 300 and received by the NAND chip A 200A. Here, the terminating circuit 203 of the NAND chip A 200A terminates the node DQI. Also, the signal LVSTL_DQS1 is transmitted as the signal DQS from the memory controller 300 and received by the NAND chip A 200A. Here, the terminating circuits 218 and 219 of the NAND chip A 200A terminate the nodes DQSI and DQSnI. A signal transmitted as the signal RE from the memory controller 300 is fixed at the low level.

As illustrated in FIG. 19, the memory controller 300 and/or the semiconductor memory device 200 according to the first embodiment conduct the node termination in the instance where the type of the signal DQ is any of FeatureData, DataOutput, and DataInput. The timing to place the terminating circuits in the enabled state will be explained.

FIG. 20 is one exemplary timing chart for signals in the memory system 100 according to the first embodiment. FIG. 20 shows the timing to place the terminating circuits in the enabled state, assuming that the type of the signal DQ is FeatureData. In the timing chart of FIG. 20, the signals CEn1, CEn2, CLE, ALE, WEn, REn, RE, DQS, DQSn, and DQ are illustrated. FIG. 20 and the subsequent figures indicate the signals REn and DQS by solid lines and the signals RE and DQSn by broken lines. Note that the shaded areas in the figures each represent a "Don't care" value which is not given a particular definition.

At time t1, the memory controller 300 sets the signal CEn1 to the low level. Accordingly, the NAND chip A 200A and the NAND chip B 200B enter the enabled state. For a period including time t2, the memory controller 300 keeps the signal CLE at the high level and transmits a SetFeature command D5*h* as the signal DQ. Along with the transmission of the SetFeature command D5*h*, the memory controller 300 sets the signal WEn to the high level at time t2.

For a period including time t3 and time t4, the memory controller 300 keeps the signal ALE at the high level and transmits, as the signal DQ, the address ADD designating a target of the SetFeature command over, for example, two cycles. Along with the transmission of the address ADD, the memory controller 300 sets the signal WEn to the high level at time t3 and at time t4. At time t5, the memory controller 300 sets the signal DQS to the low level.

For multiple periods including times t6, t7, t8, and t9, respectively, the memory controller 300 transmits, each as the signal DQ, respective parameters W-B0, W-B1, W-B2, and W-B3 set by the FeatureData. Along with the transmission of the of parameters W-B0, W-B1, W-B2, and W-B3, the memory controller 300 sets the signal WEn to the high level at each of the times t6, t7, t8, and t9.

At time t10, the memory controller 300 sets the signal CEn1 to the high level. Accordingly, the NAND chip A 200A and the NAND chip B 200B enter the disabled state.

The NAND chip A 200A places its terminating circuits 203, 218, and 219 in the enabled state at time t5, and places the terminating circuits 203, 218, and 219 in the disabled state at time t10. In other words, the period for which the terminating circuits 203, 218, and 219 are terminating the respective nodes DQI, DQSI, and DQSnI, that is, the period for which the terminating circuits 203, 218, and 219 are in the enabled state, spans from time t5 to time t10. For example, if the NAND chip A 200A receives the SetFeature command D5*h* and subsequently the address ADD while the signal CEn1 is at the low level, it enables the terminating circuits 203, 218, and 219 based on an event wherein the signal ALE has turned to the low level. Further, after receiving the parameters W-B0, W-B1, W-B2, and W-B3, the NAND chip A 200A disables the terminating circuits 203, 218, and 219 based on an event wherein the signal CEn1 has turned to the high level.

FIG. 21 is one exemplary timing chart for signals in the memory system 100 according to the first embodiment. FIG. 21 shows the timing to place the terminating circuits in the enabled state, assuming that the type of the signal DQ is DataOutput. In the timing chart of FIG. 21, the signals CEn1, CEn2, CLE, ALE, WEn, REn, RE, DQS, DQSn, and DQ are illustrated.

At time t1, the memory controller 300 sets the signal CEn1 to the low level. Accordingly, the NAND chip A 200A and the NAND chip B 200B enter the enabled state. For a period including time t2, the memory controller 300 keeps the signal CLE at the high level and transmits a read command 00*h* as the signal DQ. Along with the transmission of the read command ooh, the memory controller 300 sets the signal WEn to the high level at time t2.

For a period including times t3 to t7, the memory controller 300 keeps the signal ALE at the high level. Also, for each of multiple periods including times t3 to t7, respectively, the memory controller 300 transmits the address ADD as the signal DQ. The address ADD designates a target of the data read operation. Along with the transmission of the address ADD, the memory controller 300 sets the signal WEn to the high level at each of the times t3 to t7.

For a period including time t8, the memory controller 300 keeps the signal CLE at the high level and transmits a read execution command 30*h* as the signal DQ. The read operation is thus started. Along with the transmission of the read execution command 30*h*, the memory controller 300 sets the signal WEn to the high level at time t8.

Along with the start of the read operation, the memory controller 300 sets the signal REn to the low level. Subsequently, the memory controller 300 periodically sets the signal REn to the low level, and the semiconductor memory device 200, in response to each of such periodical low level setting, outputs read data D as the signal DQ. In parallel with the output of the read data D, the semiconductor memory device 200 periodically sets the signal DQS to the high level.

Upon completion of the output of the read data, the memory controller 300 sets the signal CEn1 to the high level at time t10. Accordingly, the NAND chip A 200A and the NAND chip B 200B enter the disabled state.

The memory controller 300 places its terminating circuits 303, 312, and 313 in the enabled state at time t9, and places the terminating circuits 303, 312, and 313 in the disabled state at time t10. In other words, the period for which the terminating circuits 303, 312, and 313 are terminating the respective nodes DQO, DQSO, and DQSnO, that is, the period for which the terminating circuits 303, 312, and 313 are in the enabled state, spans from time t9 to time t10. For example, the memory controller 300 enables the terminating circuits 303, 312, and 313 in conjunction with setting the signal REn to the low level after transmitting the read execution command 30h. Further, the memory controller 300 disables the terminating circuits 303, 312, and 313 in conjunction with setting the signal CEn1 to the high level after completing the receipt of the read data D.

The NAND chip A 200A places the terminating circuits 220 and 222 in the enabled state at time t9, and places the terminating circuits 220 and 22 in the disabled state at time t10. In other words, the period for which the terminating circuits 220 and 222 of the NAND chip A 200A are terminating the respective nodes REnI and REI, that is, the period for which these terminating circuits 220 and 222 are in the enabled state, spans from time t9 to time t10. For example, the NAND chip A 200A enables the terminating circuits 220 and 222 based on an event wherein the signal REn has turned to the low level after receipt of the read execution command 30h while the signal CEn1 is at the low level. Further, the NAND chip A 200A disables the terminating circuits 220 and 222 based on an event wherein the signal CEn1 has turned to the high level.

FIG. 22 is one exemplary timing chart for signals in the memory system 100 according to the first embodiment. FIG. 22 shows the timing to place the terminating circuits in the enabled state, assuming that the type of the signal DQ is DataInput. In the timing chart of FIG. 22, the signals CEn1, CEn2, CLE, ALE, WEn, REn, RE, DQS, DQSn, and DQ are illustrated.

At time t1, the memory controller 300 sets the signal CEn1 to the low level. Accordingly, the NAND chip A 200A and the NAND chip B 200B enter the enabled state. For a period including time t2, the memory controller 300 keeps the signal CLE at the high level and transmits a write command 80h as the signal DQ. Along with the transmission of the write command 80h, the memory controller 300 sets the signal WEn to the high level at time t2.

For a period including times t3 to t7, the memory controller 300 keeps the signal ALE at the high level. Also, for each of multiple periods including times t3 to t7, respectively, the memory controller 300 transmits the address ADD as the signal DQ. The address ADD designates a target of the data write operation. Along with the transmission of the address ADD, the memory controller 300 sets the signal WEn to the high level at each of the times t3 to t7.

At time t8, the memory controller 300 sets the signal DQS to the low level. Subsequently, the memory controller 300 transmits write data D as the signal DQ. In parallel with the transmission of the write data D, the memory controller 300 periodically sets the signal DQS to the high level. Upon completion of the transmission of the write data, the memory controller 300 sets the signal CLE to the high level at time t9 and then transmits a write execution command 10h as the signal DQ. Status data (status) "Status Out" is transmitted.

At time t10, the memory controller 300 sets the signal CEn1 to the high level. Accordingly, the NAND chip A 200A and the NAND chip B 200B enter the disabled state.

The NAND chip A 200A places its terminating circuits 203, 218, and 219 in the enabled state at time t8, and places the terminating circuits 203, 218, and 219 in the disabled state at time t9. In other words, the period for which the terminating circuits 203, 218, and 219 are terminating the respective nodes DQI, DQSI, and DQSnI, that is, the period for which the terminating circuits 203, 218, and 219 are in the enabled state, spans from time t8 to time t9. For example, the NAND chip A 200A enables the terminating circuits 203, 218, and 219 based on an event wherein the signal DQS has turned to the low level after receipt of the write command 80h and all the address ADD items while the signal CEn1 is at the low level. Further, the NAND chip A 200A disables the terminating circuits 203, 218, and 219 based on an event wherein the signal CLE has turned to the high level after receipt of all the write data D items.

In view of the above timing charts, the timing to enable one or more terminating circuits in the memory system 100 according to the first embodiment will be summarized. The timing to place the terminating circuit or circuits 203, 218, 219, 220, and/or 222 of the NAND chip A 200A in the enabled state is determined by the memory controller 300 according to a combination of the signals CEn1, CEn2, CLE, ALE, WEn, REn, RE, DQS, DQSn, and DQ, and an instruction of this timing is sent the NAND chip A 200A by the memory controller 300. As such, special commands, etc., dedicated to enabling the terminating circuits are not employed.

(1-3) Advantages (Effects)

According to the memory system 100 as described above for the first embodiment, the semiconductor memory device 200 has two transmission modes and two reception modes, and the memory controller 300 has two transmission modes and two reception modes. The memory system 100 can select transmission and reception modes that are more suitable based on the types of the signal DQ. Also, termination can be performed for a signal having a smaller amplitude among the received signals. The effects of the memory system 100 according to the first embodiment will be described in more detail.

For the purpose of increasing the data transfer speed over a NAND bus, it is beneficial for a NAND to use signals having a small amplitude to transfer data. As one option for such a technique, a termination method such as LVSTL may be used. Use of a termination method such as LVSTL, however, requires a transmitter and a receiver that can transmit and receive signals having a small amplitude. On the other hand, although small-amplitude signals should be used for DataOutput, etc., which are desired to be the subjects of fast (high-frequency) transmission and reception, there is also a demand that signals having a large amplitude should be used for a command, address, etc., for which not so fast transmission and reception are desired, so that the reliability of signals is secured.

To this end, the memory system 100 according to the first embodiment includes the transmitters 202 and 302 and the receivers 201 and 301 which are capable of transmitting and receiving both signals DQ having a large amplitude and signals DQ having a small amplitude. The memory system 100 according to the first embodiment can thus select, according to the type of a signal DQ, whether to use a large-amplitude signal or a small-amplitude signal to perform the transmission and reception. More specifically, the memory system 100 uses small-amplitude signals for transmitting and receiving types of signals DQ for which fast (high-frequency) transmission and reception are considered to be necessary (e.g., types such as FeatureData, DataOutput, and DataInput), and uses highly reliable large-amplitude signals for transmitting and receiving types of signals DQ for which no trouble is expected from non-fast (low frequency) processing (e.g., types such as a command or an address, a status, and a parallel status).

Also, the memory system 100, since it includes the transmitters and the receivers capable of transmitting and receiving small-amplitude signals, can adopt LVSTL terminating circuits. For the receipt of a small-amplitude signal, the memory system 100 enables the corresponding LVSTL terminating circuit so that the impedance in the node that receives the signal can be adjusted. By enabling the LVSTL terminating circuit, the memory system 100 can further reduce the amplitude of the signal, which allows for the realization of even faster transmission and reception processing. Moreover, terminating circuits according to the LVSTL (low-voltage swing terminated logic) method can suppress a flow-through current at the termination parts, and therefore, it is possible to reduce power consumption as compared to terminating circuits according to, for example, a legacy method such as the center tapped termination (CTT) method or the pseudo open drain (POD) method.

(2) Second Embodiment

A memory controller 300 and a semiconductor memory device 200 according to the second embodiment will be described.
(2-1) Configurations (Structures)

As described above, according to the first embodiment, the memory controller 300 has two transmission modes and two reception modes, and the semiconductor memory device 200 has two transmission modes and two reception modes. In contrast, according to the second embodiment, the memory controller 300 has two transmission modes and one reception mode, and the semiconductor memory device 200 has one transmission mode and two reception modes. The other aspects of the second embodiment are substantially the same as the first embodiment.

Figure 23:
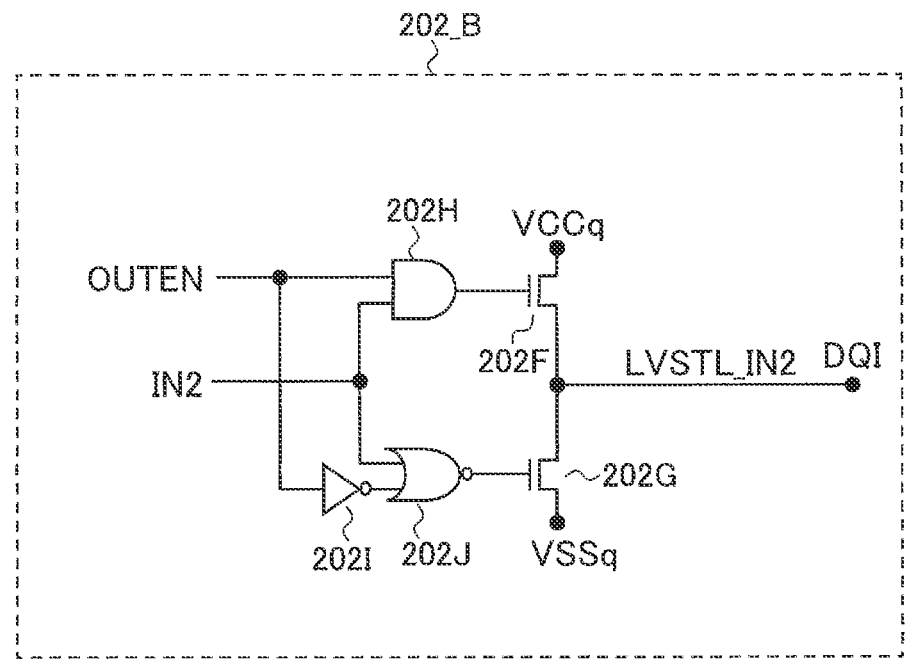
FIG. 23 is a circuit diagram showing an exemplary configuration of a transmitter 202_B for a semiconductor memory device 200 according to a second embodiment.

More specifically, the memory system 100 according to the second embodiment differs from the first embodiment in the configurations of the transmitters 202, 215, and 216, and the receivers 301, 306, and 307. The transmitters 202, 215, and 216, and the receivers 301, 306, and 307 according to the second embodiment will be called "transmitters 202_B, 215_B, and 216_B" and "receivers 301_B, 306_B, and 307_B", respectively, for distinction from the transmitters 202, 215, and 216, and the receivers 301, 306, and 307 according to the first embodiment. The transmitters 302, 309 to 311, and 314 and the receivers 201, 212 to 214, and 221 in the memory system 100 according to the second embodiment have the same configurations as those described for the first embodiment, so their description will be omitted. The description of the memory system 100 according to the second embodiment will mainly focus on differences from the first embodiment.
(2-1-1) Circuit Configurations of Memory System FIG. 23 is a circuit diagram showing an exemplary configuration of the transmitter 202_B for the semiconductor memory device 200 according to the second embodiment. FIG. 23 shows a detailed circuit structure of the transmitter 202 described with reference to FIG. 6, applied to the second embodiment. Similar to the transmitter 202, the transmitter 202_B controls the voltage of the node DQI based on a signal transmitted as the signal DQ. Hereinafter, the signal transmitted as the signal DQ for the transmitter 202_B will be called a "signal IN2".

The transmitter 202_B, unlike the transmitter 202, has only one transmission mode so that it transmits a signal having a small amplitude (described later) regardless of the type of the received signal DQ. Thus, the type of the enable signal received by the transmitter 202_B from the enable signal generating circuit 204 is also one, and the signal is transmitted based on such an enable signal OUTEN. Here, the signal IN2 transmitted from the transmitter 202_B based on the enable signal OUTEN will be called a "signal LVSTL_IN2". The signal LVSTL_IN2 has a smaller amplitude than, for example, the signal Legacy_IN1 transmitted by the transmitter 302.

The transmitter 202_B includes NMOS transistors 202F and 202G, an AND gate 202H, an inverter 202I, and a NOR gate 202J. The NMOS transistor 202F has its first end electrically connected to a node of the supply voltage VCCq. A second end of the NMOS transistor 202F is connected to the node DQI.

The NMOS transistor 202G has its first end connected to the node DQI. A second end of the NMOS transistor 202G is electrically connected to a node of the ground voltage VSSq. A first input end of the AND gate 202H receives the enable signal OUTEN from the enable signal generating circuit 204. A second input end of the AND gate 202H receives the signal IN2 from the latch circuit 206. An output end of the AND gate 202H is connected to a control terminal of the NMOS transistor 202F. The AND gate 202H transmits the logical product obtained using the signal received at the first input end and the signal received at the second input end, from the output end to the control terminal of the NMOS transistor 202F.

The inverter 202I receives, at its input end, the enable signal OUTEN from the enable signal generating circuit 204. The inverter 202I transmits the logical inversion of the received signal OUTEN, from its output end to a first input end of the NOR gate 202J.

The first input end of the NOR gate 202J is connected to the output end of the inverter 202I. A second input end of the NOR gate 202J receives the signal IN2 from the latch circuit 206. An output end of the NOR gate 202J is connected to a control terminal of the NMOS transistor 202G. The NOR gate 202J transmits the negative logical sum obtained using the signal received at the first input end and the signal received at the second input end, from the output end to the control terminal of the NMOS transistor 202G.

In this manner, unlike the transmitter 202, the transmitter 202_B having only one transmission mode transmits the signal LVSTL_IN2 regardless of the type of the received signal DQ. The reason why the amplitude of the signal LVSTL_IN2 is smaller is that the voltage VCCq is transferred via the NMOS transistor 202F, and accordingly, the transferred voltage is lower than the voltage VCCq by a threshold voltage of the NMOS transistor 202F.

The transmitters 215_B and 216_B each have the same configuration and function as the transmitter 202_B, so their description will be omitted.

The circuit diagram of the transmitter 202_B shown in FIG. 23 represents an example of the configuration. Thus, the circuit configuration of the transmitter 202_B may include other structures as long as functions comparable to those described with reference to FIG. 23 are retained. Note that the functions of the transmitters in the memory system 100 according to the second embodiment involve the following aspects: while the memory controller 300 has two transmission modes, the semiconductor memory device 200 has one transmission mode; and while the transmission mode of the memory controller 300 is suitably determined according to the type of the signal DQ, the transmission mode of the semiconductor memory device 200 does not depend on the type of the signal DQ.

Figure 24:
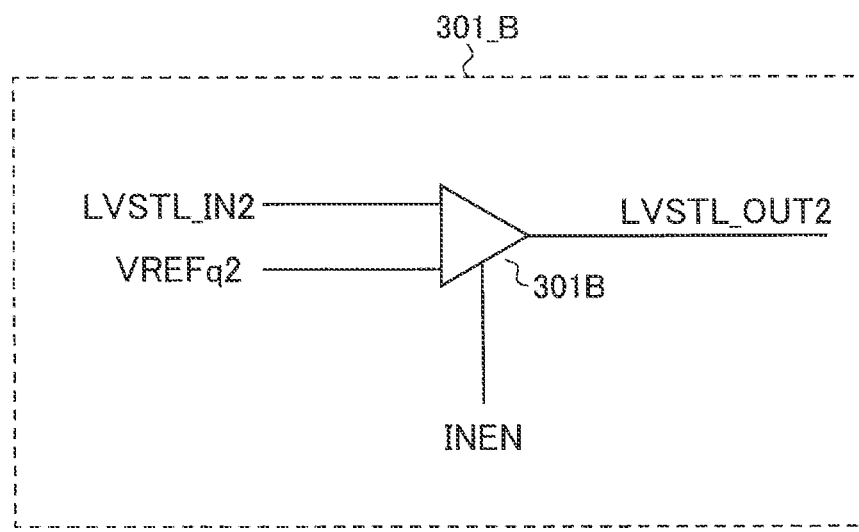
FIG. 24 is a circuit diagram showing an exemplary configuration of a receiver 301_B for the semiconductor memory device 200 according to the second embodiment.

FIG. 24 is a circuit diagram showing an exemplary configuration of the receiver 301_B for the semiconductor memory device 200 according to the second embodiment. FIG. 24 shows a detailed circuit structure of the receiver 301 described with reference to FIG. 5, applied here. The receiver 301_B, unlike the receiver 301, has only one reception mode so that it receives a signal having a small amplitude (described later) regardless of the type of the signal DQ to receive. Thus, the type of the enable signal received by the receiver 301_B from the enable signal generating circuit 304 is also one, and an operation associated with the receiving of the signal DQ is performed based on such an enable signal INEN.

The receiver 301_B receives the signal LVSTL_IN2 from the transmitter 202_B. The signal LVSTL_IN2 has a smaller amplitude than, for example, the signal Legacy_IN1 received by the receiver 201.

The receiver 301_B includes a differential amplifier circuit 301B. The differential amplifier circuit 301B receives the signal LVSTL_IN2 at its first input end. The differential amplifier circuit 301B receives application of the reference voltage VREFq2 at its second input end.

The differential amplifier circuit 301B receives the enable signal INEN from the enable signal generating circuit 304. With the enable signal INEN being at the high level, the differential amplifier circuit 301B is placed in the enabled state. The differential amplifier circuit 301B performs differential amplification of the received signal LVSTL_IN2 with the reference voltage VREFq2 to generate a signal LVSTL_OUT2 and outputs it to another component in the memory controller 300.

In this manner, unlike the receiver 301, the receiver 301_B having only one reception mode outputs the signal LVSTL_OUT2 regardless of the type of the received signal DQ. Since the output signal LVSTL_OUT2 is based on the signal LVSTL_IN2, it has a smaller amplitude than, for example, the output signal Legacy_OUT2 from the receiver 201 (i.e., a signal based on the signal Legacy_IN2).

The receivers 306_B and 307_B each have the same configuration and function as the receivers 301_B, so their description will be omitted. Here, similar to the signal LVSTL_IN2, the signal transmitted from the transmitter 215_B and received by the receiver 306_B may be called "LVSTL_DQS2". The signal LVSTL_DQS2 has a smaller amplitude than, for example, the signal Legacy_DQS1 received by the receiver 212.

The circuit diagram of the receiver 301_B shown in FIG. 24 represents an example of the configuration. Thus, the circuit configuration of the receiver 301_B may include other structures as long as functions comparable to those described with reference to FIG. 24 are retained. Note that the functions of the receivers in the memory system 100 according to the second embodiment involve the following aspects: the memory controller 300 has one reception mode while the semiconductor memory device 200 has two reception modes; and the reception mode of the memory controller 300 does not depend on the type of the signal DQ while the reception mode of the semiconductor memory device 200 is suitably determined according to the type of the signal DQ.

(2-2) Operations

In the semiconductor memory device 200 according to the second embodiment, each of the NAND chip B 200B, the NAND chip C 200C, and the NAND chip D 200D also has the same transmission and reception modes and termination modes as those of the NAND chip A 200A (as shown in FIG. 2), as in the first embodiment.

As discussed in relation to the first embodiment, if the NAND chip A 200A is a selected NAND chip, the terminating circuit or circuits of the NAND chip A 200A may be enabled, and/or the terminating circuit or circuits of the non-selected NAND chips may be enabled. The second embodiment will assume the instances where the selected NAND chip is the NAND chip A 200A and the terminating circuit or circuits of the NAND chip A 200A are enabled.

A description will be given of the termination modes for the semiconductor memory device 200 and the memory controller 300 according to the second embodiment to receive a signal DQ. FIG. 25 illustrates a mode of terminating a signal DQ in the semiconductor memory device 200 and the memory controller 300 according to the second embodiment. As shown in FIG. 25, the terminating circuit 303 of the memory controller 300 terminates the node DQO in the case of the receiver 301_B receiving the signal LVSTL_IN2.

Also, the terminating circuit 203 of the NAND chip A 200A terminates the node DQI in the case of the receiver 201 receiving the signal LVSTL_IN1, as in the first embodiment. In the case of the receiver 201 receiving the signal Legacy_IN1, the terminating circuit 203 does not terminate the node DQI.

The semiconductor memory device 200 according to the second embodiment has one transmission mode for each of the signals DQ, DQS, and DQSn, and two reception modes for each of the signals DQ, DQS, DQSn, REn, and RE. Which reception mode should be selected is determined according to the type of the signal DQ. The semiconductor memory device 200 can also select the termination mode according to the transmission and reception modes. The terminating circuit 203 of the NAND chip A 200A is used for terminating the node DQI. Also, the memory controller 300 according to the second embodiment has two transmission modes for each of the signals DQ, DQS, DQSn, REn, and RE, and one reception mode for each of the signals DQ, DQS, and DQSn. Which transmission mode should be selected is determined according to the type of the signal DQ. The memory controller 300 can also select the termination mode according to the transmission and reception modes.

A description will be given of the transmission and reception modes and the termination modes for the signals DQ, DQS, DQSn, REn, and RE in the instances of transmitting and receiving six types of signals DQ, namely, a command or an address, a status, a parallel status, Feature-Data, DataOutput, and DataInput.

FIG. 26 sets forth, as one example, the transmission and reception modes and the termination modes for signals DQ, DQS, and RE. Although FIG. 26 illustrates the signal DQS from among the signals DQS and DQSn, the signal DQSn corresponds to an inverted logic signal of the signal DQS, and therefore, what is shown for the signal DQS is likewise applicable. Also, although FIG. 26 illustrates the signal RE from among the signals REn and RE, the signal REn corresponds to an inverted logic signal of the signal RE, and therefore, what is shown for the signal RE is likewise applicable to it. As mentioned in relation to FIG. 25, the second embodiment assumes the use of only the terminating circuit or circuits 203, 218, 219, 220, and/or 222 of the NAND chip A 200A, i.e., the selected NAND chip, as the terminating circuits in the semiconductor memory device 200. As indicated in FIG. 26, the case where the type of the signal DQ is a command or an address is the same as the case in the first embodiment (cf. FIG. 19).

Referring to the next, if the type of the signal DQ is a status, the signal LVSTL_IN2 is transmitted as the signal DQ from the NAND chip A 200A and received by the memory controller 300. Here, the terminating circuit 303 of the memory controller 300 terminates the node DQO. Also, the signal LVSTL_DQS2 is transmitted as the signal DQS from the NAND chip A 200A and is received by the memory controller 300. Here, the terminating circuits 312 and 313 of the memory controller 300 terminate the respective nodes DQSO and DQSnO. Also, the signal LVSTL_RE1 is transmitted as the signal RE from the memory controller 300 and received by the NAND chip A 200A. Here, the terminating circuits 220 and 222 of the NAND chip A 200A terminate the nodes REnI and REI.

Referring to the next, if the type of the signal DQ is a parallel status, the signal LVSTL_IN2 is transmitted as the signal DQ from the NAND chip A 200A and the NAND chip B 200B, and received by the memory controller 300. Here, the terminating circuit 303 of the memory controller 300 terminates the node DQO. Also, the signal LVSTL_DQS2 is transmitted as the signal DQS from the NAND chip A 200A and the NAND chip B 200B, and received by the memory controller 300. Here, the terminating circuits 312 and 313 of the memory controller 300 terminate the nodes DQSO and DQSnO. The signal Legacy_RE1 is transmitted as the signal RE from the memory controller 300 and received by the NAND chip A 200A and the NAND chip B 200B.

The case of the type of the signal DQ being FeatureData, being DataOutput, and being DataInput are the same as the corresponding cases in the first embodiment, respectively (cf. FIG. 19).

As illustrated in FIG. 26, the memory controller 300 and/or the semiconductor memory device 200 according to the second embodiment conduct the node termination in the instance where the type of the signal DQ is any of a status, a parallel status, FeatureData, DataOutput, and DataInput. The timing to place the terminating circuits in the enabled state will be explained.

Figure 27:
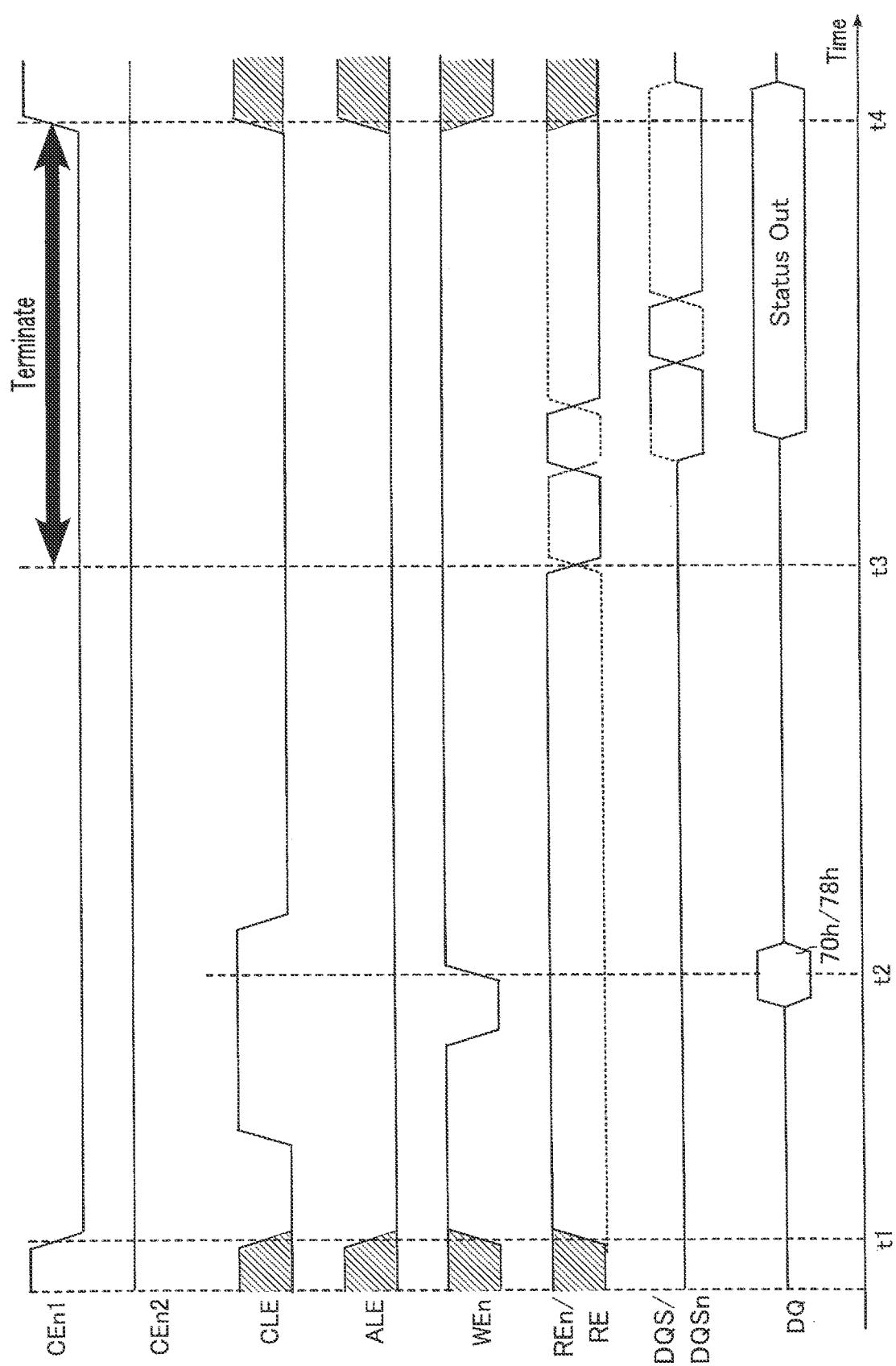
FIG. 27 is one exemplary timing chart for signals in a memory system 100 according to the second embodiment.

FIG. 27 is one exemplary timing chart for signals in the memory system 100 according to the second embodiment. FIG. 27 shows the timing to place the terminating circuits in the enabled state, assuming that the type of the signal DQ is one of a status and a parallel status. The same timing chart is applicable to the case of the type being a status and the case of the type being a parallel status, and as such, these cases will be explained using the same FIG. 27. In the timing chart of FIG. 27, the signals CEn1, CEn2, CLE, ALE, WEn, REn, RE, DQS, DQSn, and DQ are illustrated.

At time t1, the memory controller 300 sets the signal CEn1 to the low level. Accordingly, the NAND chip A 200A and the NAND chip B 200B enter the enabled state. For a period including time t2, the memory controller 300 keeps the signal CLE at the high level and transmits a status read command 70h or 78h as the signal DQ. The status read commands 70h and 78h instruct output of status information. Along with the transmission of the status read command 70h or 78h, the memory controller 300 sets the signal WEn to the high level at time t2.

At time t3, the memory controller 300 sets the signal REn to the low level. Subsequently, status "Status Out" is transmitted as the signal DQ.

At time t4, the memory controller 300 sets the signal CEn1 to the high level. Accordingly, the NAND chip A 200A and the NAND chip B 200B enter the disabled state.

First, assuming that the type of the signal DQ is a status, the timing to place the terminating circuits in the enabled state will be described. The memory controller 300 places its terminating circuits 303, 312, and 313 in the enabled state at time t3, and places the terminating circuits 303, 312, and 313 in the disabled state at time t4. In other words, the period for which the terminating circuits 303, 312, and 313 are terminating the respective nodes DQO, DQSO, and DQSnO, that is, the period for which the terminating circuits 303, 312, and 313 are in the enabled state, spans from time t3 to time t4. For example, the memory controller 300 enables the terminating circuits 303, 312, and 313 in conjunction with setting the signal REn to the low level after transmitting the status read command 70h. Further, the memory controller 300 disables the terminating circuits 303, 312, and 313 in conjunction with setting the signal CEn1 to the high level after completing the receipt of the status "Status Out".

Also, the NAND chip A 200A places its terminating circuits 220 and 222 in the enabled state at time t3, and places the terminating circuits 220 and 222 in the disabled state at time t4. In other words, the period for which the terminating circuits 220 and 222 are terminating the respective nodes REnI and REI, that is, the period for which the terminating circuits 220 and 222 are in the enabled state, spans from time t3 to time t4.

For example, the NAND chip A 200A enables the terminating circuits 220 and 222 based on an event wherein the signal REn has turned to the low level after receipt of the status read command 70h while the signal CEn1 is at the low level. Further, the NAND chip A 200A disables the terminating circuits 220 and 222 based on an event wherein the signal CEn1 has turned to the high level.

For the case of the type of the signal DQ being a parallel status, the timing chart and the timing to place the terminating circuits in the enabled state are the same as those in the case of the type being a status as described so far with reference to FIG. 27, except for the contents of the status data.

The timing chart and the timing to place the terminating circuits in the enabled state in the case of the type of the signal DQ being one of FeatureData, DataOutput, and DataInput are the same as the corresponding timing chart and timing in the first embodiment. That is, the timing chart and the timing to place the terminating circuits in the enabled state in the case of the type of the signal DQ being FeatureData are the same as those shown in FIG. 20. The timing chart and the timing to place the terminating circuits in the enabled state in the case of the type of the signal DQ being DataOutput are the same as those shown in FIG. 21. The timing chart and the timing to place the terminating circuits in the enabled state in the case of the type of the signal DQ being DataInput are the same as those shown in FIG. 22.

As described above, in the second embodiment as in the first embodiment, the timing to place the terminating circuit or circuits 203, 218, 219, 220, and/or 222 of the NAND chip A 200A in the enabled state is determined by the memory controller 300 according to a combination of the signals CEn1, CEn2, CLE, ALE, WEn, REn, RE, DQS, DQSn, and DQ, and an instruction of this timing is sent to the NAND chip A 200A by the memory controller 300. As such, special commands, etc., dedicated to enabling the terminating circuits are not employed.

(2-3) Advantages (Effects)

With the memory system 100 according to the second embodiment described above, it is possible to downsize the circuit area, reduce the parasitic capacitance at the input and output pins, save the time required for control, and so on, as compared to the memory system 100 according to the first embodiment. Also, as in the first embodiment, the memory system 100 according to the second embodiment can perform termination for a signal having a smaller amplitude among the received signals. The effects of the memory system 100 according to the second embodiment will be described in more detail.

In the memory system according to the second embodiment, the memory controller 300 has two transmission modes and one reception mode, and the semiconductor memory device 200 has one transmission mode and two reception modes. Therefore, the memory system 100 according to the second embodiment can simplify the configurations of the transmitters and the receivers as compared to the first embodiment in which the memory controller 300 and the semiconductor memory device 200 each have two transmission modes and two reception modes. With the simplified configurations of the transmitters and the receivers, the memory system 100 according to the second embodiment can further downsize the circuit area and also reduce the parasitic capacitance at the input and output pins, as compared to the memory system 100 according to the first embodiment.

Also, in the memory system 100 according to the first embodiment, the memory controller 300 and the semiconductor memory device 200 each have two transmission modes and two reception modes. Due to this, the memory system 100 according to the first embodiment uses two types of enable signals and two types of reference voltages for controlling which transmission and reception modes are used, and further, selectively controls whether or not to enable the terminating circuits.

In the memory system 100 according to the second embodiment, the signal transmitted from the transmitter 202_B and received by the receiver 301_B is only one type, namely, the signal LVSTL_OUT2. Therefore, only one type of the enable signal and one type of the reference voltage VREFq are used, and also the terminating circuits are constantly in the enabled state, whereby the control is performed more easily than in the first embodiment.

Moreover, the memory system 100 according to the second embodiment includes the transmitter 302 and the receiver 201 which are capable of transmitting and receiving both signals DQ having a large amplitude and signals DQ having a small amplitude. The memory system 100 according to the second embodiment can thus select, according to the type of a signal DQ, whether to use a large-amplitude signal or a small-amplitude signal to perform the transmission and reception at the time of transmitting the signal from the memory controller 300 to the semiconductor memory device 200. More specifically, the memory system 100 is capable of using small-amplitude signals for transmitting and receiving types of signals DQ such as a status, a parallel status, FeatureData, DataOutput, and DataInput, and using highly reliable large-amplitude signals for transmitting and receiving types of signals DQ such as a command or an address. For transmission and reception of a command, an address, etc., use of large-amplitude signals can secure the signal reliability.

Also, similar to the memory system 100 according to the first embodiment, the memory system 100 according to the second embodiment, since it includes the transmitters and the receivers capable of transmitting and receiving small-amplitude signals, can adopt LVSTL terminating circuits. By enabling the LVSTL terminating circuit, the memory system 100 according to the second embodiment can further reduce the amplitude of the signal, which allows for the realization of even faster transmission and reception processing. Moreover, terminating circuits according to the LVSTL method can suppress a flow-through current at the termination parts, and therefore, it is possible to reduce power consumption as compared to terminating circuits according to, for example, a legacy method such as the CTT method or the POD method.

(3) Third Embodiment

A memory controller 300 and a semiconductor memory device 200 according to the third embodiment will be described.

(3-1) Configurations (Structures)

As discussed above, according to the second embodiment, the memory controller 300 has two transmission modes and one reception mode, and the semiconductor memory device 200 has one transmission mode and two reception modes. In contrast, according to the third embodiment, the memory controller 300 has one transmission mode and one reception mode, and the semiconductor memory device 200 has one transmission mode and one reception mode. The other aspects of the third embodiment are substantially the same as the second embodiment.

More specifically, the memory system 100 according to the third embodiment differs from the second embodiment in the configurations of the transmitters 302, 309 to 311, and 314, and the receivers 201, 212 to 212, and 221. The transmitters 302, 309 to 311, and 314, and the receivers 201, 212 to 214, and 221 according to the third embodiment will be called "transmitters 302_C, 309_C to 311_C, and 314_C", and "receivers 201_C, 212_C to 214_C, and 221_C", respectively, for distinction from the transmitters 302, 309 to 311, and 314, and the receivers 201, 212 to 214, and 221 according to the second embodiment. The transmitters 202, 215, and 216 and the receivers 301, 306, and 307 in the memory system 100 according to the third embodiment have the same configurations as those of the transmitters 202_B, 215_B, and 216_B and the receivers 301_B, 306_B, and 307_B in the memory system 100 according to the second embodiment, so their description will be omitted. However, for distinction from the second embodiment, the transmitters 202, 215, and 216 and the receivers 301, 306, and 307 according to the third embodiment will be called "transmitters 202_C, 215_C, and 216_C", and "receivers 301_C, 306_C, and 307_C", respectively. The description of the memory system 100 according to the third embodiment will mainly focus on differences from the second embodiment.

(3-1-1) Circuit Configurations of Memory System

FIG. 28 is a circuit diagram showing an exemplary configuration of the transmitter 302_C for the semiconductor memory device 200 according to the third embodiment. FIG. 28 shows a detailed circuit structure of the transmitter 302 described with reference to FIG. 5, applied to the third embodiment. Similar to the transmitter 302, the transmitter 302_C controls the voltage of the node DQO based on a signal transmitted as the signal DQ. The transmitter 302_C has the same structure and function as the transmitter 202_B. Hereinafter, the signal transmitted as the signal DQ for the transmitter 302_C will be called a "signal IN1".

The transmitter 302_C, unlike the transmitter 302, has only one transmission mode so that it transmits a signal having a small amplitude (described later) regardless of the type of the received signal DQ. Thus, the type of the enable signal received by the transmitter 302_C from the enable signal generating circuit 304 is also one, and the signal is transmitted based on such an enable signal OUTEN. Here, the signal IN1 transmitted from the transmitter 302_C based on the enable signal OUTEN will be called a "signal LVSTL_IN1". The signal LVSTL_IN1 has a smaller amplitude than, for example, the signal Legacy_IN1 transmitted by the transmitter 302.

The transmitter 302_C includes NMOS transistors 302F and 302G, an AND gate 302H, an inverter 302I, and a NOR gate 302J. The NMOS transistor 302F has its first end electrically connected to a node of the supply voltage VCCq. A second end of the NMOS transistor 302F is connected to the node DQO.

The NMOS transistor 302G has its first end connected to the node DQO. A second end of the NMOS transistor 302G is electrically connected to a node of the ground voltage VSSq. A first input end of the AND gate 302H receives the enable signal OUTEN from the enable signal generating circuit 304. A second input end of the AND gate 302H receives the signal IN1 from another component (not illustrated) in the memory controller 300. An output end of the AND gate 302H is connected to a control terminal of the NMOS transistor 302F. The AND gate 302H transmits the logical product obtained using the signal received at the first input end and the signal received at the second input end, from the output end to the control terminal of the NMOS transistor 302F.

The inverter 302I receives, at its input end, the enable signal OUTEN from the enable signal generating circuit 304. The inverter 302I transmits the logical inversion of the received signal OUTEN1, from its output end to a first input end of the NOR gate 302J.

The first input end of the NOR gate 302J is connected to the output end of the inverter 302I. A second input end of the NOR gate 302J receives the signal IN1 from another component (not illustrated) in the memory controller 300. An output end of the NOR gate 302J is connected to a control terminal of the NMOS transistor 302G. The NOR gate 302J transmits the negative logical sum obtained using the signal received at the first input end and the signal received at the second input end, from the output end to the control terminal of the NMOS transistor 302G.

In this manner, unlike the transmitter 302, the transmitter 302_C having only one transmission mode transmits the signal LVSTL_IN1 regardless of the type of the received signal DQ. The reason why the amplitude of the signal LVSTL_IN1 is smaller is that the voltage VCCq is transferred via the NMOS transistor 302F, and accordingly, the transferred voltage is lower than the voltage VCCq by a threshold voltage of the NMOS transistor 302F.

The transmitters 309_C to 311_C and 314_C each have the same configuration and function as the transmitter 302_C, so their description will be omitted.

The circuit diagram of the transmitter 302_C shown in FIG. 28 represents an example of the configuration. Thus, the circuit configuration of the transmitter 302_C may include other structures as long as functions comparable to those described with reference to FIG. 28 are retained. Note that the functions of the transmitters in the memory system 100 according to the third embodiment involve aspects wherein the memory controller 300 has one transmission mode and also the semiconductor memory device 200 has one transmission mode, and wherein the transmission modes of the memory controller 300 and the semiconductor memory device 200 do not depend on the type of the signal DQ.

FIG. 29 is a circuit diagram showing an exemplary configuration of the receiver 201_C for the semiconductor memory device 200 according to the third embodiment. FIG. 29 shows a detailed circuit structure of the receiver 201 described with reference to FIG. 6, applied here. The receiver 201_C, unlike the receiver 201, has only one reception mode so that it receives a signal having a small amplitude (described later) regardless of the type of the signal DQ to receive. Thus, the type of the enable signal received by the receiver 201_C from the enable signal generating circuit 204 is also one, and an operation associated with the receiving of the signal DQ is performed based on such an enable signal INEN.

The receiver 201_C receives the signal LVSTL_IN1 from the transmitter 302_C. The signal LVSTL_IN1 has a smaller amplitude than, for example, the signal Legacy_IN1 received by the receiver 201.

The receiver 201_C includes a differential amplifier circuit 201B. The differential amplifier circuit 201B receives the signal LVSTL_IN1 at its first input end. The differential amplifier circuit 201B receives application of the reference voltage VREFq2 at its second input end.

The differential amplifier circuit 201B receives the enable signal INEN from the enable signal generating circuit 204. With the enable signal INEN being at the high level, the differential amplifier circuit 201B is placed in the enabled state. The differential amplifier circuit 201B performs differential amplification of the received signal LVSTL_IN1 with the reference voltage VREFq2 to generate a signal LVSTL_OUT1, and outputs the signal LVSTL_OUT1 to the latch circuit 206.

In this manner, unlike the receiver 201, the receiver 201_C having only one reception mode outputs the signal LVSTL_OUT1 regardless of the type of the received signal DQ. Since the output signal LVSTL_OUT1 is based on the signal LVSTL_IN1, it has a smaller amplitude than, for example, the output signal Legacy_OUT1 from the receiver 201 (i.e., a signal based on the signal Legacy_IN1).

The receivers 212_C to 214_C and 221_C each have the same configuration and function as the receivers 201_C, so their description will be omitted. Here, similar to the signal LVSTL_IN1, the signal transmitted from the transmitter 309_C and received by the receiver 212_C may be called a "signal LVSTL_DQS1". The signal LVSTL_DQS1 has a smaller amplitude than, for example, the signal Legacy_DQS1 received by the receiver 212.

The signal transmitted from the transmitter 314_C and received by the receiver 221_C may be called a "signal LVSTL_RE1". The signal LVSTL_RE1 has a smaller amplitude than, for example, the signal Legacy_RE1 received by the receiver 221.

The circuit diagram of the receiver 201_C shown in FIG. 29 represents an example of the configuration. Thus, the circuit configuration of the receiver 201_C may include other structures as long as functions comparable to those described with reference to FIG. 29 are retained. Note that the functions of the receivers in the memory system 100 according to the third embodiment involve aspects wherein the memory controller 300 has one reception mode and also the semiconductor memory device 200 has one reception mode, and wherein the reception modes of the memory controller 300 and the semiconductor memory device 200 do not depend on the type of the signal DQ.

(3-2) Operations

In the semiconductor memory device 200 according to the third embodiment, each of the NAND chip B 200B, the NAND chip C 200C, and the NAND chip D 200D also has the same transmission and reception modes and termination modes as those of the NAND chip A 200A (as shown in FIG. 2), as in the first embodiment.

As discussed in relation to the first embodiment, if the NAND chip A 200A is a selected NAND chip, the terminating circuit or circuits of the NAND chip A 200A may be enabled, and/or the terminating circuit or circuits of the non-selected NAND chips may be enabled. The third embodiment will assume the instances where the selected NAND chip is the NAND chip A 200A and the terminating circuit or circuits of the NAND chip A 200A are enabled.

A description will be given of the termination modes for the semiconductor memory device 200 and the memory controller 300 according to the third embodiment to receive a signal DQ. FIG. 30 illustrates a mode of terminating a signal DQ in the semiconductor memory device 200 and the memory controller 300 according to the third embodiment. As shown in FIG. 30, the terminating circuit 303 terminates the node DQO in the case of the receiver 301_C receiving the signal LVSTL_IN2, as in the second embodiment.

Also, the terminating circuit 203 terminates the node DQI in the case of the receiver 201_C receiving the signal LVSTL_IN1.

The semiconductor memory device 200 according to the third embodiment has one transmission mode for each of the signals DQ, DQS, and DQSn, and also one reception mode for each of the signals DQ, DQS, DQSn, REn, and RE. The transmission and reception modes always use a signal having a small amplitude for transmission and reception, regardless of the type of the signal DQ. Also, in the semiconductor memory device 200, while the receiver 201_C receives a signal, the terminating circuit 203 of the NAND chip A 200A is terminating the node DQI at all times.

The memory controller 300 according to the third embodiment has one transmission mode for each of the signals DQ, DQS, DQSn, REn, and RE, and also one reception mode for each of the signals DQ, DQS, and DQSn. The transmission and reception modes always use a signal having a small amplitude for transmission and reception, regardless of the type of the signal DQ. Also, in the memory controller 300, while the receiver 301_C receives a signal, the terminating circuit 303 is terminating the node DQO at all times.

A description will be given of the transmission and reception modes and the termination modes for the signals DQ, DQS, DQSn, REn, and RE in the instances of transmitting and receiving six types of signals DQ, namely, a command or an address, a status, a parallel status, FeatureData, DataOutput, and DataInput.

FIG. 31 sets forth, as one example, the transmission and reception modes and the termination modes for signals DQ, DQS, and RE. Although FIG. 31 illustrates the signal DQS from among the signals DQS and DQSn, the signal DQSn corresponds to an inverted logic signal of the signal DQS, and therefore, what is shown for the signal DQS is likewise applicable to it. Also, although FIG. 31 illustrates the signal RE from among the signals REn and RE, the signal REn corresponds to an inverted logic signal of the signal RE, and therefore, what is shown for the signal RE is likewise applicable to it. As mentioned in relation to FIG. 30, the third embodiment assumes the use of only the terminating circuit or circuits of the NAND chip A 200A, i.e., the selected NAND chip, as the terminating circuits in the semiconductor memory device 200. As shown in FIG. 31, if the type of the signal DQ is a command or an address, the signal LVSTL_IN1 is transmitted as the signal DQ from the memory controller 300 and received by the NAND chip A 200A and the NAND chip B 200B. Here, the terminating circuit 203 of the NAND chip A 200A terminates the node DQI. The signals DQS and RE transmitted from the memory controller 300 are fixed at the low level.

The case where the type of the signal DQ is a status is the same as the case in the second embodiment (cf. FIG. 26).

Referring to the next, if the type of the signal DQ is a parallel status, the signal LVSTL_IN2 is transmitted as the signal DQ from the NAND chip A 200A and the NAND chip B 200B, and received by the memory controller 300. Here, the terminating circuit 303 of the memory controller 300 terminates the node DQO. Also, the signal LVSTL_DQS2 is transmitted as the signal DQS from the NAND chip A 200A and the NAND chip B 200B, and received by the memory controller 300. Here, the terminating circuits 312 and 313 of the memory controller 300 terminate the nodes DQSO and DQSnO. The signal LVSTL_RE1 is transmitted as the signal RE from the memory controller 300 and received by the NAND chip A 200A and the NAND chip B 200B. Here, the terminating circuits 220 and 222 of the NAND chip A 200A terminate the nodes REnI and REI.

The case of the type of the signal DQ being FeatureData, being DataOutput, and being DataInput are the same as the corresponding cases in the first embodiment, respectively (cf. FIG. 19).

As illustrated in FIG. 31, the memory controller 300 and/or the semiconductor memory device 200 according to the third embodiment conduct the node termination in the instance where the type of the signal DQ is any of a command or an address, a status, a parallel status, FeatureData, DataOutput, and DataInput. The timing to place the terminating circuits in the enabled state will be explained.

FIG. 32 is one exemplary timing chart for signals in the memory system 100 according to the third embodiment. FIG. 32 shows the timing to place the terminating circuits in the enabled state, assuming that the type of the signal DQ is one of a command, an address, and DataInput. In the timing chart of FIG. 32, the signals CEn1, CEn2, CLE, ALE, WEn, REn, RE, DQS, DQSn, and DQ are illustrated. By way of example, FIG. 32 shows data write. In the case where the type of the signal DQ is one of a command, an address, and DataInput, the timing chart conforms to that in the case of DataInput in the first embodiment (FIG. 22), but the timing to enable the terminating circuits differs from that in the case of DataInput in the first embodiment. Accordingly, in relation to FIG. 32, only the timing to place the terminating circuits in the enabled state will be discussed for the case where the type of the signal DQ is one of a command, an address, and DataInput.

The NAND chip A 200A places its terminating circuits 203, 218, and 219 in the enabled state at time t1, and places the terminating circuits 203, 218, and 219 in the disabled state at time t10. In other words, the period for which the terminating circuits 203, 218, and 219 are terminating the respective nodes DQI, DQSI, and DQSnI, that is, the period for which the terminating circuits 203, 218, and 219 are in the enabled state, spans from time t1 to time t10. This is because the third embodiment assumes one type of signal for transmission and reception, and as such, the terminating circuits may be constantly in the enabled state for a period where the memory controller 300 keeps the NAND chip A 200A in the enabled state for communicating with the NAND chip A 200A. For example, the NAND chip A 200A enables the terminating circuits 203, 218, and 219 based on an event wherein the signal CEn1 has turned to the low level. Further, the NAND chip A 200A disables the terminating circuits 203, 218, and 219 based on an event wherein the signal CEn1 has turned to the high level.

In the case where the type of the signal DQ is one of a status, a parallel status, FeatureData, and DataOutput, the timing chart conforms to that in the second embodiment, but the timing to enable the terminating circuits differs from that in the second embodiment. Accordingly, only the timing to place the terminating circuits in the enabled state will be discussed for the case where the type of the signal DQ is one of a status, a parallel status, FeatureData, and DataOutput.

Figure 33:
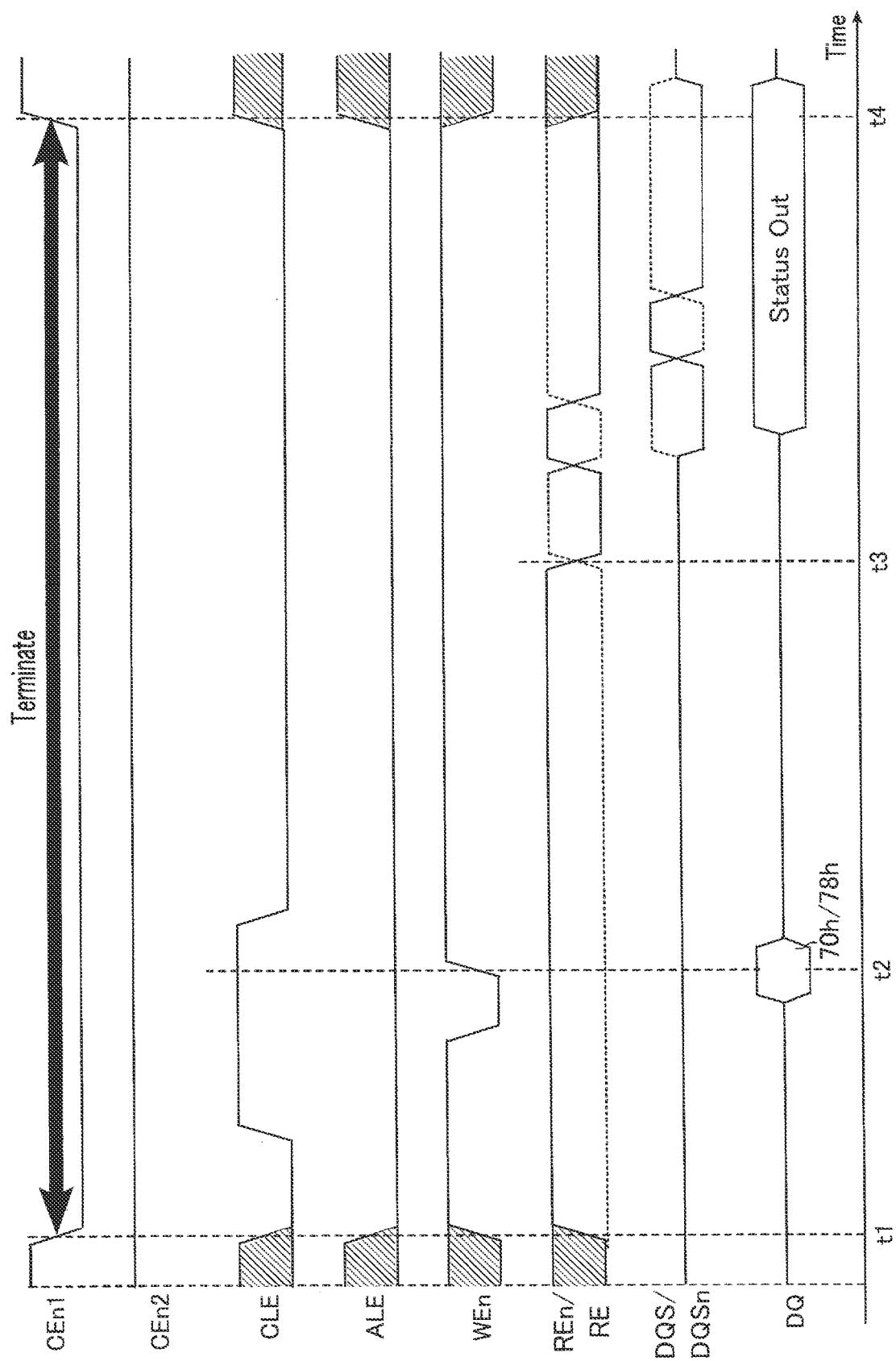
FIG. 33 is one exemplary timing chart for signals in the memory system 100 according to the third embodiment.

FIG. 33 is one exemplary timing chart for signals in the memory system 100 according to the third embodiment. FIG. 33 shows the timing to place the terminating circuits in the enabled state, assuming that the type of the signal DQ is one of a status and a parallel status. The timing chart in the case where the type of the signal DQ is one of a status and a parallel status conforms to FIG. 27.

The memory controller 300 places its terminating circuits 303, 312, and 313 in the enabled state at time t3, and places the terminating circuits 303, 312, and 313 in the disabled state at time t4. In other words, the period for which the terminating circuits 303, 312, and 313 are terminating the respective nodes DQO, DQSO, and DQSnO, that is, the period for which the terminating circuits 303, 312, and 313 are in the enabled state, spans from time t3 to time t4. For example, the memory controller 300 enables the terminating circuits 303, 312, and 313 in conjunction with setting the signal REn to the low level after transmitting the status read command 70h or 78h. Further, the memory controller 300 disables the terminating circuits 303, 312, and 313 in conjunction with setting the signal CEn1 to the high level after completing the receipt of the status "Status Out".

The NAND chip A 200A places its terminating circuits 220 and 222 in the enabled state at time t3, and places the terminating circuits 220 and 222 in the disabled state at time t4. In other words, the period for which the terminating circuits 220 and 222 are terminating the respective nodes REnI and REI, that is, the period for which the terminating circuits 220 and 222 are in the enabled state, spans from time t3 to time t4. For example, the NAND chip A 200A enables the terminating circuits 220 and 222 based on an event wherein the signal REn has turned to the low level after receipt of the status read command 70h or 78h while the signal CEn1 is at the low level. Further, the NAND chip A 200A disables the terminating circuits 220 and 222 based on an event wherein the signal CEn1 has turned to the high level after completing the transmission of the status "Status Out". Note that, as discussed with reference to FIG. 32, the terminating circuit 203 of the NAND chip A 200A is terminating the node DQI for a period including the period for transmitting the command (the status read command 70h or 78h), that is, for a period from time t1 to time t3.

Figure 34:
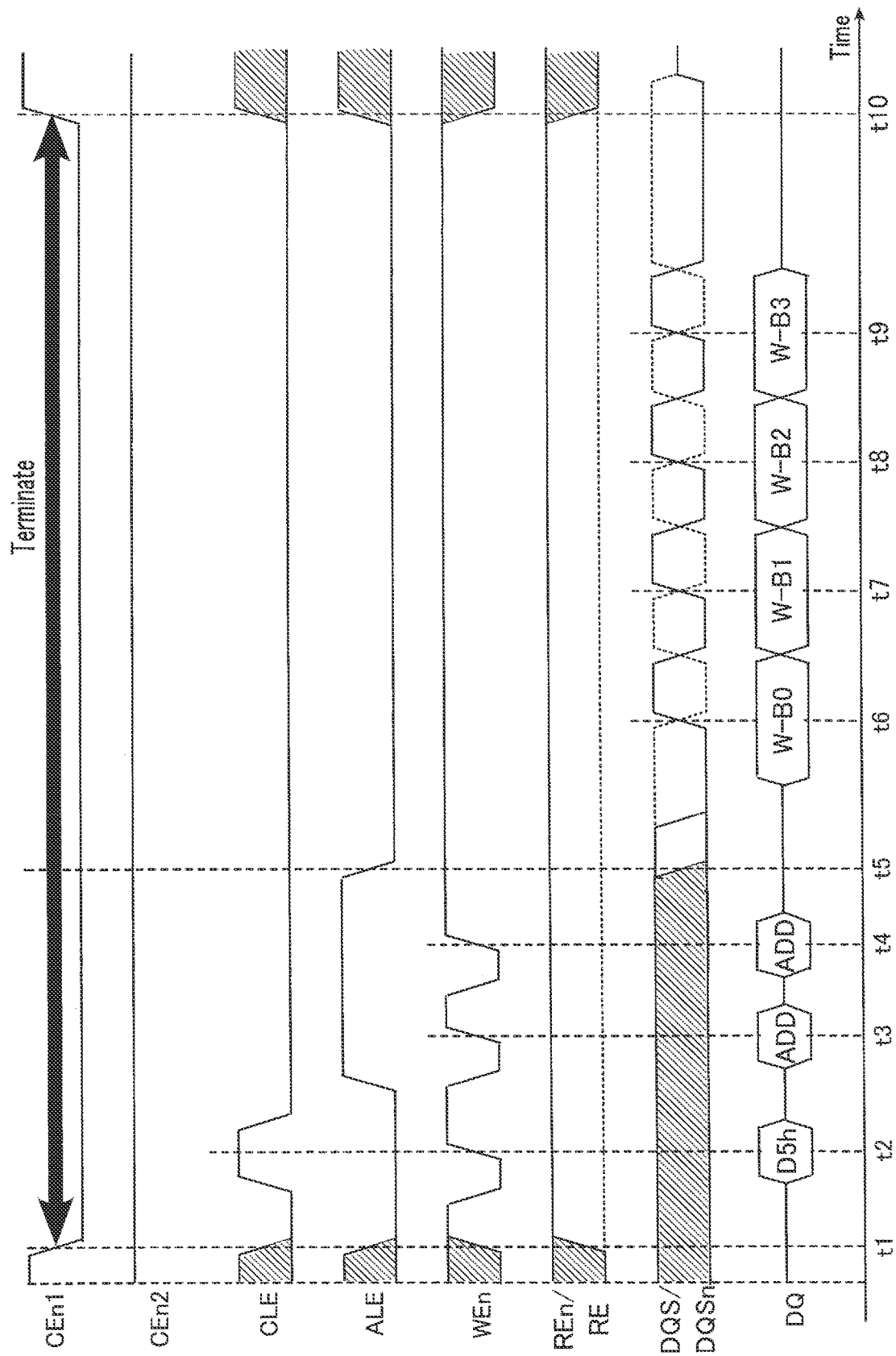
FIG. 34 is one exemplary timing chart for signals in the memory system 100 according to the third embodiment.

FIG. 34 is one exemplary timing chart for signals in the memory system 100 according to the third embodiment. FIG. 34 shows the timing to place the terminating circuits in the enabled state, assuming that the type of the signal DQ is FeatureData. The timing chart in the case where the type of the signal DQ is SetFeature conforms to FIG. 20.

The NAND chip A 200A places its terminating circuits 203, 218, and 219 in the enabled state at time t5, and places the terminating circuits 203, 218, and 219 in the disabled state at time t10. In other words, the period for which the terminating circuits 203, 218, and 219 are terminating the respective nodes DQI, DQSI, and DQSnI, that is, the period for which the terminating circuits 203, 218, and 219 are in the enabled state, spans from time t5 to time t10. For example, if the NAND chip A 200A receives a SetFeature command D5h and subsequently the address ADD, it enables the terminating circuits 203, 218, and 219 based on an event wherein the signal ALE has turned to the low level. Further, after receiving parameters W-B0, W-B1, W-B2, and W-B3, the NAND chip A 200A disables the terminating circuits 203, 218, and 219 based on an event wherein the signal CEn1 has turned to the high level. Note that, as discussed with reference to FIG. 32, the terminating circuit 203 of the NAND chip A 200A is terminating the node DQI for a period including the period for transmitting the Set-Feature command D5h and the address ADD, that is, for a period from time t1 to time t5.

Figure 35:
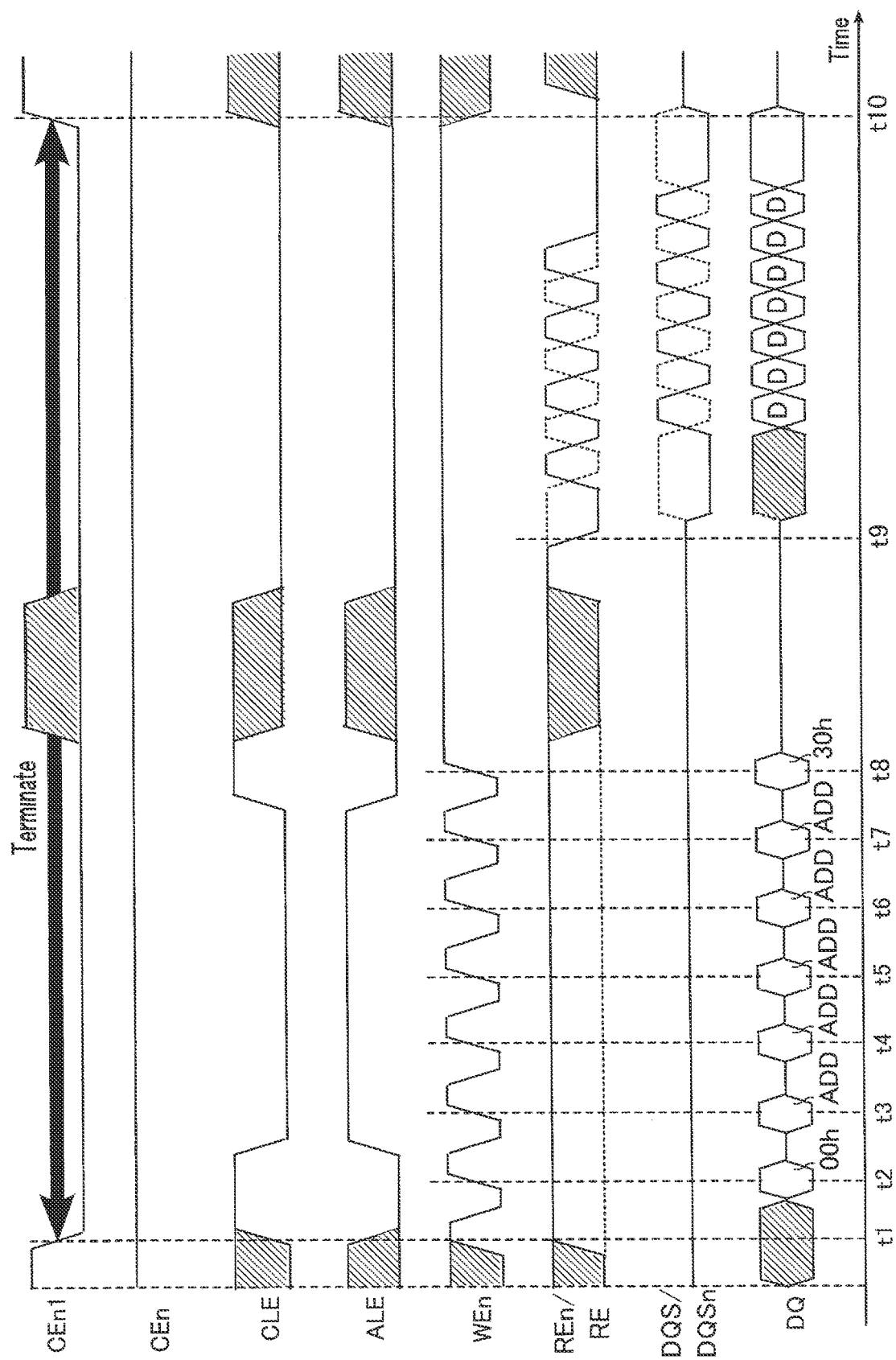
FIG. 35 is one exemplary timing chart for signals in the memory system 100 according to the third embodiment.

FIG. 35 is one exemplary timing chart for signals in the memory system 100 according to the third embodiment. FIG. 35 shows the timing to place the terminating circuits in the enabled state, assuming that the type of the signal DQ is DataOutput. The timing chart in the case where the type of the signal DQ is DataOutput conforms to FIG. 21.

The memory controller 300 places its terminating circuits 303, 312, and 313 in the enabled state at time t9, and places the terminating circuits 303, 312, and 313 in the disabled state at time t10. In other words, the period for which the terminating circuits 303, 312, and 313 are terminating the respective nodes DQO, DQSO, and DQSnO, that is, the period for which the terminating circuits 303, 312, and 313 are in the enabled state, spans from time t9 to time t10. For example, the memory controller 300 enables the terminating circuits 303, 312, and 313 in conjunction with setting the signal REn to the low level after transmitting a read execution command 30h. Further, the memory controller 300 disables the terminating circuits 303, 312, and 313 in conjunction with setting the signal CEn1 to the high level after completing the receipt of read data D.

The NAND chip A 200A places the terminating circuits 220 and 222 in the enabled state at time t9, and places the terminating circuits 220 and 22 in the disabled state at time t10. In other words, the period for which the terminating circuits 220 and 222 are terminating the respective nodes REnI and REI, that is, the period for which the terminating circuits 220 and 222 are in the enabled state, spans from time t9 to time t10. For example, the NAND chip A 200A enables the terminating circuits 220 and 222 based on an event wherein the signal REn has turned to the low level after receipt of the read execution command 30h while the signal CEn1 is at the low level. Further, the NAND chip A 200A disables the terminating circuits 220 and 222 based on an event wherein the signal CEn1 has turned to the high level. Note that, as discussed with reference to FIG. 32, the terminating circuit 203 of the NAND chip A 200A is terminating the node DQI for a period including the period for transmitting a read command ooh, an address ADD, and the read execution command 30h, that is, for a period from time t1 to time t9.

As described above, in the third embodiment as in the first and second embodiments, the timing to place the terminating circuit or circuits 203, 218, 219, 220, and/or 222 of the NAND chip A 200A in the enabled state is determined by the memory controller 300 according to a combination of the signals CEn1, CEn2, CLE, ALE, WEn, REn, RE, DQS, DQSn, and DQ, and an instruction of this timing is sent to the NAND chip A 200A by the memory controller 300. As such, special commands, etc., dedicated to enabling the terminating circuits are not employed.

(3-3) Advantages (Effects)

With the memory system 100 according to the third embodiment described above, it is possible to further enhance the effects of downsizing the circuit area, reducing the parasitic capacitance at the input and output pins, saving the time required for control, and so on, as compared to the memory system 100 according to the second embodiment. Also, as in the second embodiment, the memory system 100 according to the third embodiment can perform termination for a signal having a smaller amplitude among the received signals. The effects of the memory system 100 according to the third embodiment will be described in more detail.

In the memory system according to the third embodiment, the memory controller 300 has one transmission mode and one reception mode, and the semiconductor memory device 200 also has one transmission mode and one reception mode. Therefore, the memory system 100 according to the third embodiment can simplify the configurations of the transmitters and the receivers as compared to the second embodiment. With the simplified configurations of the transmitters and the receivers, the memory system 100 according to the third embodiment can further downsize the circuit area and also reduce the parasitic capacitance at the input and output pins, as compared to the memory system 100 according to the second embodiment.

Also, the memory system 100 according to the second embodiment has two transmission modes for the transmitter 302 and two reception modes for the receiver 201. Due to this, the memory system 100 according to the second embodiment uses two types of enable signals and two types of reference voltages for controlling which transmission and reception modes are used by them, and further, selectively controls whether or not to enable the terminating circuits.

In the memory system 100 according to the third embodiment, the signal transmitted from the transmitter 302_C and received by the receiver 201_C is only one type, namely, the signal LVSTL_OUT1, and the signal transmitted from the transmitter 202_C and received by the receiver 301_C is also only one type, namely, the signal LVSTL_OUT2. Therefore, the memory system 100 according to the third embodiment has only one type of the enable signal and one type of the reference voltage VREFq, and constantly keeps the terminating circuits in the enabled state, thereby allowing the control to be performed more easily than in the second embodiment.

Moreover, the memory system 100 according to the third embodiment performs transmission and reception of only signals DQ having a small amplitude. The memory system 100 according to the third embodiment is thus suited to high-speed transmission and reception.

Also, similar to the memory systems 100 according to the first and second embodiments, the memory system 100 according to the third embodiment, since it includes the transmitters and the receivers capable of transmitting and receiving small-amplitude signals, can adopt LVSTL terminating circuits. By enabling the LVSTL terminating circuit, the memory system 100 according to the third embodiment can further reduce the amplitude of the signal, which allows for the realization of even faster transmission and reception processing. Moreover, terminating circuits according to the LVSTL method can suppress a flow-through current at the termination parts, and therefore, it is possible to reduce power consumption as compared to terminating circuits according to, for example, a legacy method such as the CTT method or the POD method. The memory system 100 according to the third embodiment, employing the terminating circuits according to the LVSTL method which requires a low power consumption, can maintain the terminating circuits in the enabled state for a long time.

(4) Fourth Embodiment

A memory controller 300 and a semiconductor memory device 200 according to the fourth embodiment will be described.

(4-1) Configurations (Structures)

The memory controller 300 and the semiconductor memory device 200 according to the fourth embodiment are similar in structure to those of the first embodiment, while differing in the following one respect. The memory controller 300 according to the fourth embodiment does not include the terminating circuit 303.

The memory system 100 according to the fourth embodiment involves a further difference from the first embodiment in the mode of terminating interconnects in the semiconductor memory device 200. The other aspects of the fourth embodiment are the same as the first embodiment. The description of the memory system 100 according to the fourth embodiment will mainly focus on differences from the first embodiment.

In the first embodiment, termination of the node DQI for communication between the memory controller 300 and the NAND chip A 200A is conducted using the terminating circuit 203 of the NAND chip A 200A. In contrast, the fourth embodiment utilizes the terminating circuit 203 of the NAND chip C 200C to terminate the node DQI for communication between the memory controller 300 and the NAND chip A 200A. In the following description, the terminating circuit 203 of the NAND chip C 200C may be called a "terminating circuit 203_C" for distinction from the terminating circuit 203 of the NAND chip A 200A. Similarly, the terminating circuits 218 to 220 and 222 of the NAND chip C 200C may be called "terminating circuits 218_C to 220_C and 222_C" for distinction from the terminating circuits 218 to 220 and 222 of the NAND chip A 200A. The fourth embodiment utilizes the terminating circuits 218_C to 220_C and 222_C to terminate the respective nodes DQSI, DQSnI, REnI, and REI for communication between the memory controller 300 and the NAND chip A 200A.

The terminating circuit 203_C has the same structure and function as the terminating circuit 203 of the NAND chip A 200A. The fourth embodiment is similar to the first embodiment except for the respects discussed so far. For example, the transmitters 202, 215, 216, 302, 309 to 311, and 314 and the receivers 201, 212 to 214, 221, 301, 306, and 307 according to the fourth embodiment have the same structures and functions as those in the first embodiment.

(4-2) Operations

In the semiconductor memory device 200 according to the fourth embodiment, each of the NAND chip B 200B, the NAND chip C 200C, and the NAND chip D 200D also has the same transmission and reception modes and termination modes as those of the NAND chip A 200A (as shown in FIG. 2), as in the first embodiment.

As discussed in relation to the first embodiment, if the NAND chip A 200A is a selected NAND chip, the terminating circuit or circuits of the NAND chip A 200A may be enabled, and/or the terminating circuit or circuits of the non-selected NAND chips may be enabled. The fourth embodiment will assume the instances where the selected NAND chip is the NAND chip A 200A, and the terminating circuit or circuits 203_C, 218_C to 220_C, and/or 222_C of the non-selected NAND chip C 200C are enabled.

Figure 36:
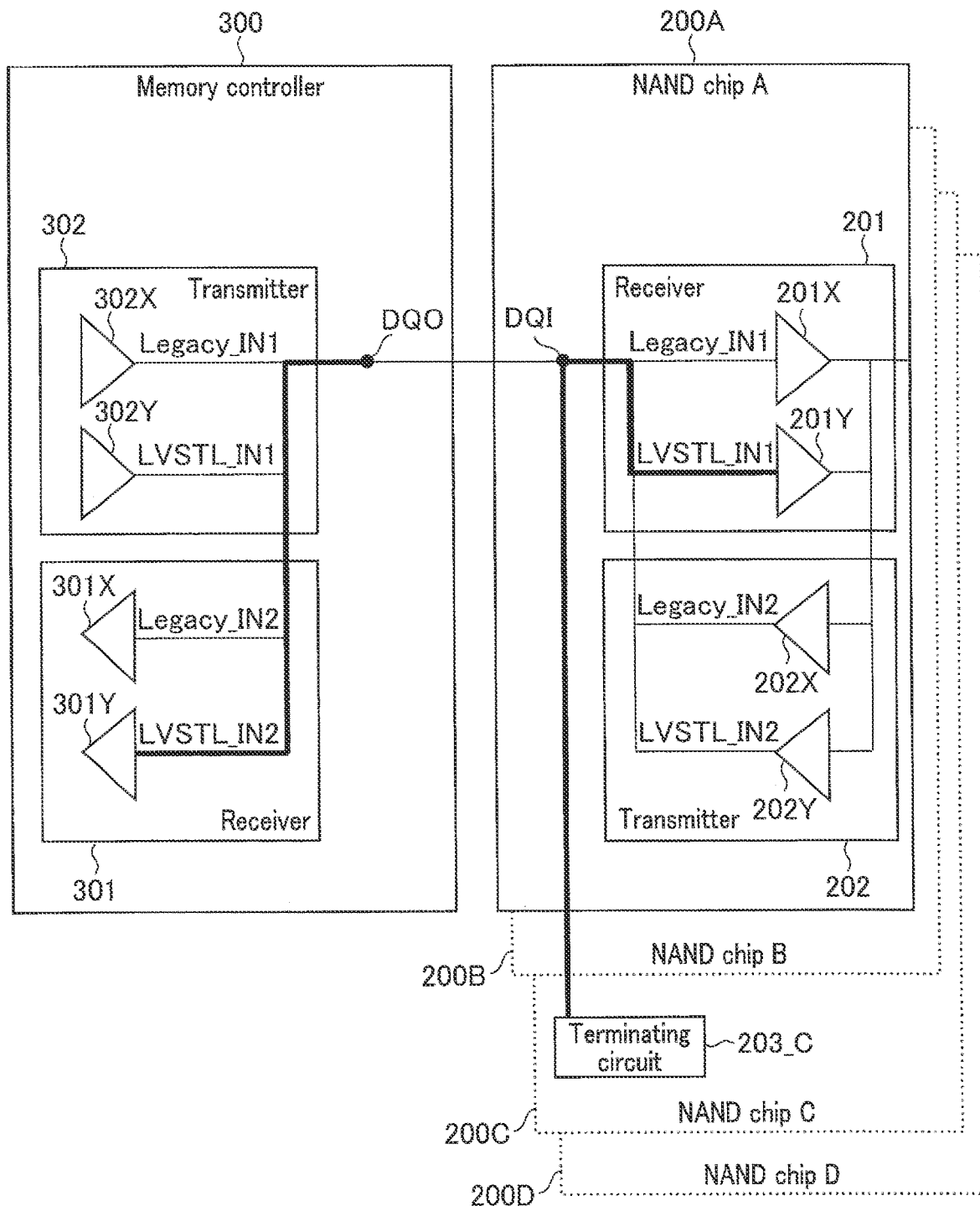
FIG. 36 illustrates a mode of terminating a signal DQ in a semiconductor memory device 200 and a memory controller 300 according to a fourth embodiment.

A description will be given of the termination modes for the semiconductor memory device 200 and the memory controller 300 according to the fourth embodiment to receive a signal DQ. FIG. 36 illustrates a mode of terminating a signal DQ in the semiconductor memory device 200 and the memory controller 300 according to the fourth embodiment. As shown in FIG. 36, the terminating circuit 203_C of the NAND chip C 200C terminates the node DQI in each of the case of the receiver 201 receiving the signal LVSTL_IN1 and the case of the receiver 301 receiving the signal LVSTL_IN2. In each of the case of the receiver 201 receiving the signal Legacy_IN1 and the case of the receiver 301 receiving the signal Legacy_IN2, the terminating circuit 203_C does not terminate the node DQI.

The semiconductor memory device 200 according to the fourth embodiment has two transmission modes for each of the signals DQ, DQS, and DQSn, and two reception modes for each of the signals DQ, DQS, DQSn, REn, and RE as in the first embodiment. Which transmission and reception modes should be selected is determined according to the type of the signal DQ. The semiconductor memory device 200 can also select the termination mode according to the transmission and reception modes. The terminating circuit 203_C of the NAND chip C 200C is used for terminating the node DQI. Similarly, the memory controller 300 according to the fourth embodiment has two transmission modes for each of the signals DQ, DQS, DQSn, REn, and RE, and two reception modes for each of the signals DQ, DQS, and DQSn as in the first embodiment. Which transmission and reception modes should be selected is determined according to the type of the signal DQ. The memory controller 300 can also select the termination mode according to the transmission and reception modes.

A description will be given of the transmission and reception modes and the termination modes for the signals DQ, DQS, DQSn, REn, and RE in the instances of transmitting and receiving six types of signals DQ, namely, a command or an address, a status, a parallel status, SetFeature, DataOutput, and DataInput.

FIG. 37 sets forth, as one example, the transmission and reception modes and the termination modes for signals DQ, DQS, and RE. Although FIG. 37 illustrates the signal DQS from among the signals DQS and DQSn, the signal DQSn corresponds to an inverted logic signal of the signal DQS, and therefore, what is shown for the signal DQS is likewise applicable to it. Also, although FIG. 37 illustrates the signal RE from among the signals REn and RE, the signal REn corresponds to an inverted logic signal of the signal RE, and therefore, what is shown for the signal RE is likewise applicable to it. As mentioned in relation to FIG. 36, the fourth embodiment assumes the use of only the terminating circuit or circuits 203_C, 218_C, 219_C, 220_C, and/or 222_C of the NAND chip C 200C, i.e., the non-selected NAND chip, as the terminating circuits. As indicated in FIG. 37, the case where the type of the signal DQ is one of a command, an address, a status, and a parallel status is the same as the corresponding case in the first embodiment (cf. FIG. 19).

Referring to the next, if the type of the signal DQ is FeatureData, the signal LVSTL_IN1 is transmitted as the signal DQ from the memory controller 300 and received by the NAND chip A 200A. Here, the terminating circuit 203_C of the NAND chip C 200C terminates the node DQI. Also, the signal LVSTL_DQS1 is transmitted as the signal DQS from the memory controller 300 and received by the NAND chip A 200A. Here, the terminating circuits 218_C and 219_C of the NAND chip C 200C terminate the nodes DQSI and DQSnI.

Referring to the next, if the type of the signal DQ is DataOutput, the signal LVSTL_IN2 is transmitted as the signal DQ from the NAND chip A 200A and received by the memory controller 300. Here, the terminating circuit 203_C of the NAND chip C 200C terminates the node DQI. Also, the signal LVSTL_DQS2 is transmitted as the signal DQS from the NAND chip A 200A and received by the memory controller 300. Here, the terminating circuits 218_C and 219_C of the NAND chip C 200C terminate the nodes DQSI and DQSnI. In this manner, for the memory controller 300 to receive a signal, the terminating circuits included in the memory controller 300 do not perform interconnect termination unlike in the first embodiment, but the terminating circuit or circuits 203_C, 218_C, 219_C, 220_C, and/or 222_C included in the NAND chip C 200C perform interconnect termination. Also, the signal LVSTL_RE1 is transmitted as the signal RE from the memory controller 300 to the NAND chip A 200A. Here, the terminating circuits 220_C and 222_C of the NAND chip C 200C terminate the respective nodes REnI and REI.

Referring to the next, if the type of the signal DQ is DataInput, the signal LVSTL_IN1 is transmitted as the signal DQ from the memory controller 300 to the NAND chip A 200A. Here, the terminating circuit 203_C of the NAND chip C 200C terminates the node DQI. Also, the signal LVSTL_DQS1 is transmitted as the signal DQS from the memory controller 300 to the NAND chip A 200A. Here, the terminating circuits 218_C and 219_C of the NAND chip C 200C terminate the nodes DQSI and DQSnI.

As illustrated in FIG. 37, the memory controller 300 and/or the semiconductor memory device 200 according to the fourth embodiment conduct the node termination in the instance where the type of the signal DQ is any of FeatureData, DataOutput, and DataInput. The timing to place the terminating circuits in the enabled state will be explained.

FIG. 38 is one exemplary timing chart for signals in the memory system 100 according to the fourth embodiment. FIG. 38 shows the timing to place the terminating circuits in the enabled state, assuming that the type of the signal DQ is FeatureData. Similar to FIG. 20, in the timing chart of FIG. 38, the signals CEn1, CEn2, CLE, ALE, WEn, REn, RE, DQS, DQSn, and DQ are illustrated.

For the period from time t2 to time t9, the timing chart for the signals CEn1, CLE, ALE, WEn, REn, RE, DQS, DQSn, and DQ conforms to FIG. 20 illustrating the first embodiment, and therefore, a corresponding description will be omitted. The description will mainly focus on the signal CEn2, and also on the signals CEn1, CLE, ALE, WEn, REn, RE, DQS, DQSn, and DQ for a period from time ta to time td and a period from time te to time th.

As discussed above, the memory systems 100 according to the first to third embodiments do not employ special commands, etc., dedicated to enabling the terminating circuit or circuits 203, 218, 219, 220, and/or 222 included in the NAND chip A 200A. In contrast, the memory system 100 according to the fourth embodiment employs a special command for enabling the terminating circuit or circuits 203_C, 218_C, 219_C, 220_C, and/or 222_C included in the NAND chip C 200C.

More specifically, the memory controller 300 transmits an ODT command 95h, an address ADD, and an ODT stop command 9Bh by means of the signal DQ and also controls the signal CEn2, so as to control the timing to enable the terminating circuit or circuits 203_C, 218_C, 219_C, 220_C, and/or 222_C of the NAND chip C 200C.

At time ta, the memory controller 300 sets the signal CEn2 to the low level. Accordingly, the NAND chip C 200C and the NAND chip D 200D enter the enabled state. For a period including times tb and tc, the memory controller 300 keeps the signal CLE at the high level and transmits each of the ODT command 95h and the address ADD as the signal DQ. The ODT command 95h is for placing the terminating circuit or circuits 203_C, 218_C, 219_C, 220_C, and/or 222_C included in the NAND chip 200 designated by the address ADD in the enabled state for a period during which this NAND chip 200 is in the enabled state. The ODT command 95h instructs the target NAND chip 200 to enable its terminating circuits 203, 218, and 219. In the fourth embodiment, the terminating circuit or circuits 203_C, 218_C, 219_C, 220_C, and/or 222_C included in the NAND chip C 200C designated by the address ADD are in the enabled state for a period of the signal CEn2 being at the low level. Along with the transmission of the ODT command 95h and the address ADD, the memory controller 300 sets the signal WEn to the high level at time tb and at time tc.

At time td, the memory controller 300 sets the signal CEn1 to the low level and the signal CEn2 to the high level. Accordingly, the NAND chip A 200A and the NAND chip B 200B enter the enabled state, and the NAND chip C 200C and the NAND chip D 200D enter the disabled state.

For a period from time t5 to time te, the memory controller 300 keeps the signal CEn2 at the low level. The NAND chip C 200C and the NAND chip D 200D are accordingly in the enabled state. At time te, the memory controller 300 sets each of the signals CEn1 and CEn2 to the high level. Accordingly, the NAND chip A 200A, the NAND chip B 200B, the NAND chip C 200C, and the NAND chip D 200D enter the disabled state.

For a period from time tf to time th, the memory controller 300 keeps the signal CEn2 at the low level. The NAND chip C 200C and the NAND chip D 200D are accordingly in the enabled state. At time tg, the memory controller 300 transmits the ODT stop command 9Bh as the signal DQ. The ODT stop command 9Bh is a command for invalidating the instruction to enable the terminating circuit or circuits 203_C, 218_C, 219_C, 220_C, and/or 222_C included in the NAND chip C 200C, for a period of the signal CEn2 being at the low level. After the transmission of the ODT command 95h and the address ADD, and up to the transmission of the ODT stop command 9Bh, the terminating circuit or circuits 203_C, 218_C, 219_C, 220_C, and/or 222_C included in the NAND chip C 200C are placed in the enabled state while the signal CEn2 is at the low level, that is, for a period between time t5 and time te and for a period between time tf and time tg. Along with the transmission of the ODT stop command 9Bh, the memory controller 300 sets the signal WEn to the high level at time tg.

At time th, the memory controller 300 sets the signal CEn2 to the high level. Accordingly, the NAND chip C 200C and the NAND chip D 200D enter the disabled state.

In this manner, the memory controller 300 controls the timing to enable the terminating circuit or circuits 203_C, 218_C, 219_C, 220_C, and/or 222_C of the NAND chip C 200C by transmitting the ODT command 95h, the address ADD, and the ODT stop command 9Bh using the signal DQ and by controlling the signal CEn2. Based on the instructions from the memory controller 300, the NAND chip C 200C places its terminating circuits 203_C, 218_C, and 219_C in the enabled state at time t5 and places the terminating circuits 203_C, 218_C, and 219_C in the disabled state at time te. In other words, the period for which the terminating circuits 203_C, 218_C, and 219_C are terminating the respective nodes DQI, DQSI, and DQSnI, that is, the period for which the terminating circuits 203_C, 218_C, and 219_C are in the enabled state, spans from time t5 to time te.

Similarly, the NAND chip C 200C places its terminating circuits 203_C, 218_C, and 219_C in the enabled state for a period from time tf to time tg as well, based on the instructions from the memory controller 300. Note, however, that this enabling of the terminating circuits is only a result of unintentionally satisfying the conditions for enabling the terminating circuits in the course of the processing period until the ODT stop command 9Bh becomes valid. That is, the nodes DQi, DQSI, and DQSnI are not intentionally terminated, and this termination from time tf to time tg may be precluded.

Figure 39:
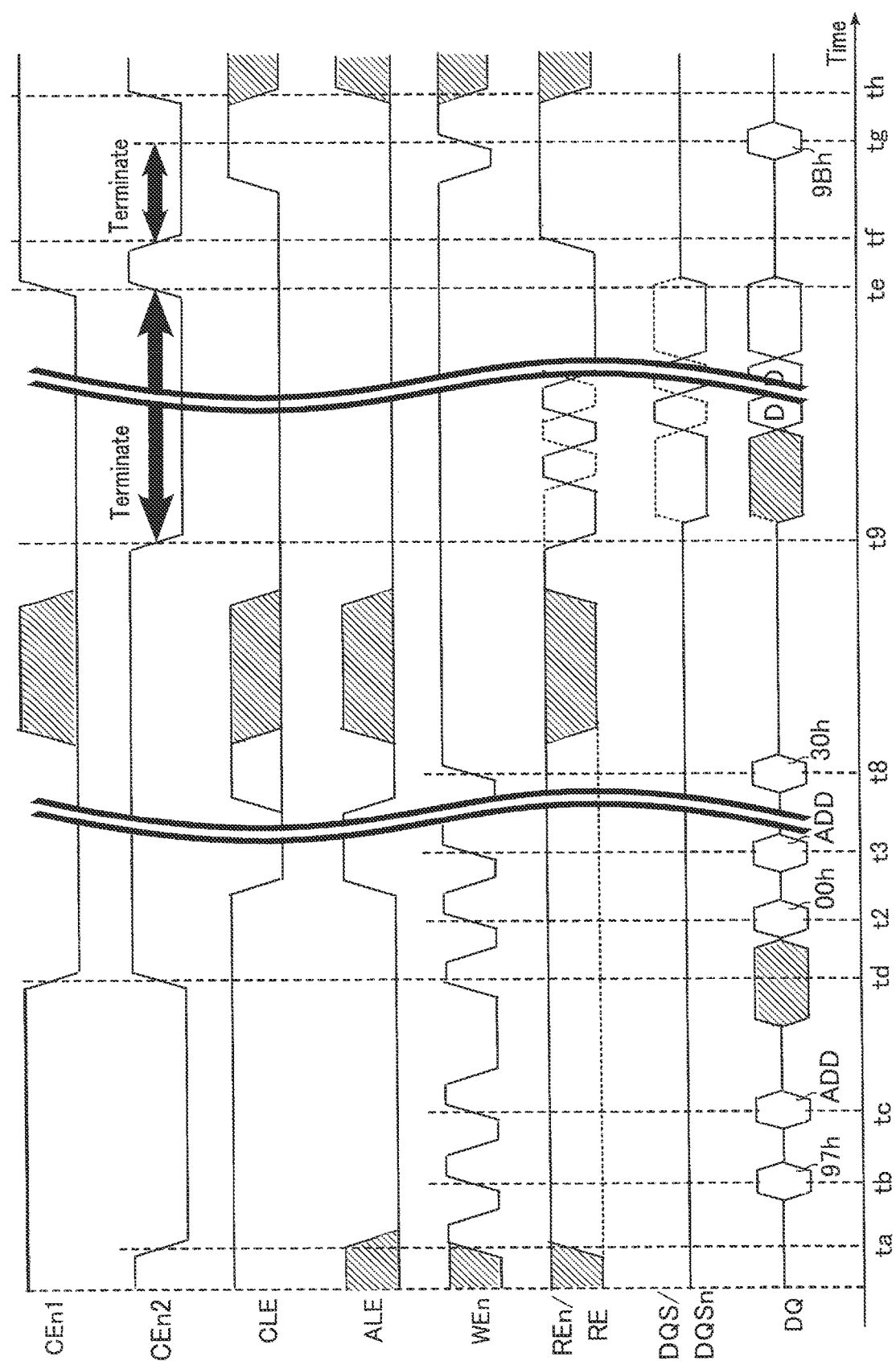
FIG. 39 is one exemplary timing chart for signals in the memory system 100 according to the fourth embodiment.

FIG. 39 is one exemplary timing chart for signals in the memory system 100 according to the fourth embodiment. FIG. 39 shows the timing to place the terminating circuits in the enabled state, assuming that the type of the signal DQ is DataOutput. Similar to FIG. 21, in the timing chart of FIG. 39, the signals CEn1, CEn2, CLE, ALE, WEn, REn, RE, DQS, DQSn, and DQ are illustrated.

For the period from time t2 to time t9, the timing chart for the signals CEn1, CLE, ALE, WEn, REn, RE, DQS, DQSn, and DQ conforms to FIG. 21 illustrating the first embodiment, and therefore, a corresponding description will be omitted. The description will mainly focus on the signal CEn2, and also on the signals CEn1, CLE, ALE, WEn, REn, RE, DQS, DQSn, and DQ for a period from time ta to time td and a period from time te to time th.

FIG. 39, similar to FIG. 38, assumes the use of a special command for enabling the terminating circuit or circuits 203_C, 218_C, 219_C, 220_C, and/or 222_C included in the NAND chip C 200C. More specifically, the memory controller 300 transmits an ODT command 97h, an address ADD, and an ODT stop command 9Bh by means of the signal DQ and also controls the signal CEn2, so as to control the timing to enable the terminating circuit or circuits 203_C, 218_C, 219_C, 220_C, and/or 222_C of the NAND chip C 200C. Similar to the ODT command 95h in the foregoing description, the ODT command 97h is a command for placing a terminating circuit or circuits included in a chip designated by the address ADD in the enabled state for a period during which this chip is in the enabled state. The ODT command 97h instructs the target NAND chip 200 to enable its terminating circuits 203, 218, 219, 220, and 222.

At time ta, the memory controller 300 sets the signal CEn2 to the low level. Accordingly, the NAND chip C 200C and the NAND chip D 200D enter the enabled state. For a period including times tb and tc, the memory controller 300 keeps the signal CLE at the high level and transmits each of the ODT command 97h and the address ADD as the signal DQ. Accordingly, the terminating circuit or circuits 203_C, 218_C, 219_C, 220_C, and/or 222_C included in the NAND chip C 200C designated by the address ADD are placed in the enabled state for a period of the signal CEn2 being at the low level. Along with the transmission of the ODT command 97h and the address ADD, the memory controller 300 sets the signal WEn to the high level at time tb and at time tc.

At time td, the memory controller 300 sets the signal CEn1 to the low level and the signal CEn2 to the high level. Accordingly, the NAND chip A 200A and the NAND chip B 200B enter the enabled state, and the NAND chip C 200C and the NAND chip D 200D enter the disabled state.

For a period from time t9 to time te, the memory controller 300 keeps the signal CEn2 at the low level. The NAND chip C 200C and the NAND chip D 200D are accordingly in the enabled state. At time te, the memory controller 300 sets each of the signals CEn1 and CEn2 to the high level. Accordingly, the NAND chip A 200A, the NAND chip B 200B, the NAND chip C 200C, and the NAND chip D 200D enter the disabled state.

For a period from time tf to time th, the memory controller 300 keeps the signal CEn2 at the low level. The NAND chip C 200C and the NAND chip D 200D are accordingly in the enabled state. At time tg, the memory controller 300 transmits the ODT stop command 9Bh as the signal DQ. Using the ODT stop command 9Bh, the memory controller 300 disables the terminating circuit or circuits 203_C, 218_C, 219_C, 220_C, and/or 222_C of the NAND chip C 200C. Along with the transmission of the ODT stop command 9Bh, the memory controller 300 sets the signal WEn to the high level at time tg.

At time th, the memory controller 300 sets the signal CEn2 to the high level. Accordingly, the NAND chip C 200C and the NAND chip D 200D enter the disabled state.

In this manner, the memory controller 300 controls the timing to enable the terminating circuit or circuits 203_C, 218_C, 219_C, 220_C, and/or 222_C of the NAND chip C 200C by transmitting the ODT command 97h, the address ADD, and the ODT stop command 9Bh using the signal DQ and by controlling the signal CEn2.

Also, based on the instructions from the memory controller 300, the NAND chip C 200C places its terminating circuits 203_C, 218_C to 220_C, and 222_C in the enabled state at time t9, and places the terminating circuits 203_C, 218_C to 220_C, and 222_C in the disabled state at time te. In other words, the period for which the terminating circuits 203_C, 218_C to 220_C, and 222_C are terminating the respective nodes DQI, DQSI, DQSnI, REnI, and REI, that is, the period for which the terminating circuits 203_C, 218_C to 220_C, and 222_C are in the enabled state, spans from time t9 to time te.

Similarly, the NAND chip C 200C places its terminating circuits 203_C, 218_C to 220_C, and 222_C in the enabled state for a period from time tf to time tg as well, based on the instructions from the memory controller 300. Note, however, that this enabling of the terminating circuits is only a result of unintentionally satisfying the conditions for enabling the terminating circuits in the course of the processing period until the ODT stop command 9Bh becomes valid. That is, the nodes DQI, DQSI, DQSnI, REnI, and REI are not intentionally terminated, and this termination from time tf to time tg may be precluded.

FIG. 40 is one exemplary timing chart for signals in the memory system 100 according to the fourth embodiment. FIG. 40 shows the timing to place the terminating circuits in the enabled state, assuming that the type of the signal DQ is DataInput. Similar to FIG. 22, in the timing chart of FIG. 40, the signals CEn1, CEn2, CLE, ALE, WEn, REn, RE, DQS, DQSn, and DQ are illustrated.

For the period from time t2 to time t9, the timing chart for the signals CEn1, CLE, ALE, WEn, REn, RE, DQS, DQSn, and DQ conforms to FIG. 22 illustrating the first embodiment, and therefore, a corresponding description will be omitted. The description will mainly focus on the signal CEn2, and also on the signals CEn1, CLE, ALE, WEn, REn, RE, DQS, DQSn, and DQ for a period from time ta to time td and a period from time te to time th.

FIG. 40, similar to FIG. 38, assumes the use of a special command for enabling the terminating circuit or circuits 203_C, 218_C, 219_C, 220_C, and/or 222_C included in the NAND chip C 200C.

At time ta, the memory controller 300 sets the signal CEn2 to the low level. Accordingly, the NAND chip C 200C and the NAND chip D 200D enter the enabled state. For a period including times tb and tc, the memory controller 300 keeps the signal CLE at the high level and transmits each of the ODT command 95h and the address ADD as the signal DQ. Accordingly, the terminating circuit or circuits 203_C, 218_C, 219_C, 220_C, and/or 222_C included in the NAND chip C 200C designated by the address ADD are placed in the enabled state for a period of the signal CEn2 being at the low level. Along with the transmission of the ODT command 95h and the address ADD, the memory controller 300 sets the signal WEn to the high level at time tb and at time tc.

At time td, the memory controller 300 sets the signal CEn1 to the low level and the signal CEn2 to the high level. Accordingly, the NAND chip A 200A and the NAND chip B 200B enter the enabled state, and the NAND chip C 200C and the NAND chip D 200D enter the disabled state.

For a period from time t8 to time t9, the memory controller 300 keeps the signal CEn2 at the low level. The NAND chip C 200C and the NAND chip D 200D are accordingly in the enabled state. At time t9, the memory controller 300 sets the signal CEn2 to the high level. Accordingly, the NAND chip C 200C and the NAND chip D 200D enter the disabled state. At time te, the memory controller 300 sets the signal CEn1 to the high level. Accordingly, the NAND chip A 200A and the NAND chip B 200B enter the disabled state.

For a period from time tf to time th, the memory controller 300 keeps the signal CEn2 at the low level. The NAND chip C 200C and the NAND chip D 200D are accordingly in the enabled state. At time tg, the memory controller 300 transmits the ODT stop command 9Bh as the signal DQ. Using the ODT stop command 9Bh, the memory controller 300 disables the terminating circuit or circuits 203_C, 218_C, 219_C, 220_C, and/or 222_C of the NAND chip C 200C. Along with the transmission of the ODT stop command 9Bh, the memory controller 300 sets the signal WEn to the high level at time tg.

At time th, the memory controller 300 sets the signal CEn2 to the high level. Accordingly, the NAND chip C 200C and the NAND chip D 200D enter the disabled state.

Based on the instructions from the memory controller 300, the NAND chip C 200C places its terminating circuits 203_C, 218_C, and 219_C in the enabled state at time t8 and places the terminating circuits 203_C, 218_C, and 219_C in the disabled state at time t9. In other words, the period for which the terminating circuits 203_C, 218_C, and 219_C are terminating the nodes DQI, DQSI, and DQSnI, that is, the period for which the terminating circuits 203_C, 218_C, and 219_C are in the enabled state, spans from time t8 to time t9.

Similarly, the NAND chip C 200C places its terminating circuits 203_C, 218_C, and 219_C in the enabled state for a period from time tf to time tg as well, based on the instructions from the memory controller 300. Note, however, that this enabling of the terminating circuits is only a result of unintentionally satisfying the conditions for enabling the terminating circuits in the course of the processing period until the ODT stop command 9Bh becomes valid. That is, the nodes DQi, DQSI, and DQSnI are not intentionally terminated, and this termination from time tf to time tg may be precluded.

In view of the above timing charts, the timing to enable one or more terminating circuits in the memory system 100 according to the fourth embodiment will be summarized. The timing to enable the terminating circuit or circuits 203_C, 218_C, 219_C, 220_C, and/or 222_C of the NAND chip C 200C is controlled by the memory controller 300 through the actions of transmitting the ODT command 95h or 97h, the address ADD, and the ODT stop command 9Bh using the signal DQ and also controlling the signal CEn2. That is, a special command for enabling the terminating circuits is used.

(4-3) Advantages (Effects)

The memory system 100 according to the fourth embodiment described above includes the transmitters 202 and 302 and the receivers 201 and 301 as in the first embodiment. Therefore, the same effects as those of the first embodiment can be attained.

Differing from the first embodiment, the memory system 100 according to the fourth embodiment involves use of a terminating circuit or circuits included in the non-selected NAND chip, for the interconnect termination in the semiconductor memory device 200. By employing a terminating circuit of the non-selected NAND chip as the terminating circuit for performing the interconnect termination, reflection of a signal that occurs with the propagation of the signal in the interconnect can be suppressed as compared to the case of employing a terminating circuit of the selected NAND chip.

Therefore, the memory system 100 according to the fourth embodiment may realize the state where the impedance matching for an interconnect is high at the interconnect termination, and consequently, the received signal has more improved characteristics than that in the memory system 100 according to the first embodiment.

The fourth embodiment has assumed the exemplary cases where only the terminating circuit or circuits 203_C, 218_C, 219_C, 220_C, and/or 222_C included in the NAND chip C 200C are used for interconnect termination, but the terminating circuit or circuits included in other NAND chips may be used in combination. For example, the termination of the node DQI may be conducted not only by the use of the terminating circuit 203_C of the NAND chip C 200C alone, but also by the simultaneous use of the terminating circuit 203 of the NAND chip A 200A together with the terminating circuit 203_C.

(5) Fifth Embodiment

A memory controller 300 and a semiconductor memory device 200 according to the fifth embodiment will be described.

(5-1) Configurations (Structures)

The memory controller 300 and the semiconductor memory device 200 according to the fifth embodiment are similar in structure to those of the second embodiment, while differing in the following one respect. The memory controller 300 according to the fifth embodiment does not include the terminating circuit 303.

The memory system 100 according to the fifth embodiment involves a further difference from the second embodiment in the mode of terminating interconnects in the semiconductor memory device 200. The other aspects of the fifth embodiment are the same as the second embodiment. The description of the memory system 100 according to the fifth embodiment will mainly focus on differences from the second embodiment.

In the second embodiment, termination of the node DQI for communication between the memory controller 300 and the NAND chip A 200A is conducted using the terminating circuit 203 of the NAND chip A 200A. In contrast, the fifth embodiment utilizes, as in the fourth embodiment, the terminating circuit 203_C of the NAND chip C 200C to terminate the node DQI for communication between the memory controller 300 and the NAND chip A 200A. Similarly, the fifth embodiment utilizes the terminating circuits 218_C to 220_C and 222_C to terminate the nodes DQSI, DQSnI, REnI, and REI for communication between the memory controller 300 and the NAND chip A 200A.

The fifth embodiment is similar to the second embodiment except for the respects discussed so far. For example, the transmitters 202_B, 215_B, 216_B, 302, 309 to 311, and 314 and the receivers 201, 212 to 214, 221, 301_B, 306_B, and 307_B according to the fifth embodiment have the same structures and functions as those in the second embodiment.

(5-2) Operations

In the semiconductor memory device 200 according to the fifth embodiment, each of the NAND chip B 200B, the NAND chip C 200C, and the NAND chip D 200D also has the same transmission and reception modes and termination modes as those of the NAND chip A 200A (as shown in FIG. 2), as in the first embodiment.

As discussed in relation to the first embodiment, if the NAND chip A 200A is a selected NAND chip, the terminating circuit or circuits of the NAND chip A 200A may be enabled, and/or the terminating circuit or circuits of the non-selected NAND chips may be enabled. The fifth embodiment will assume the instances where the selected NAND chip is the NAND chip A 200A, and the terminating circuit or circuits of the non-selected NAND chip C 200C are enabled.

Figure 41:
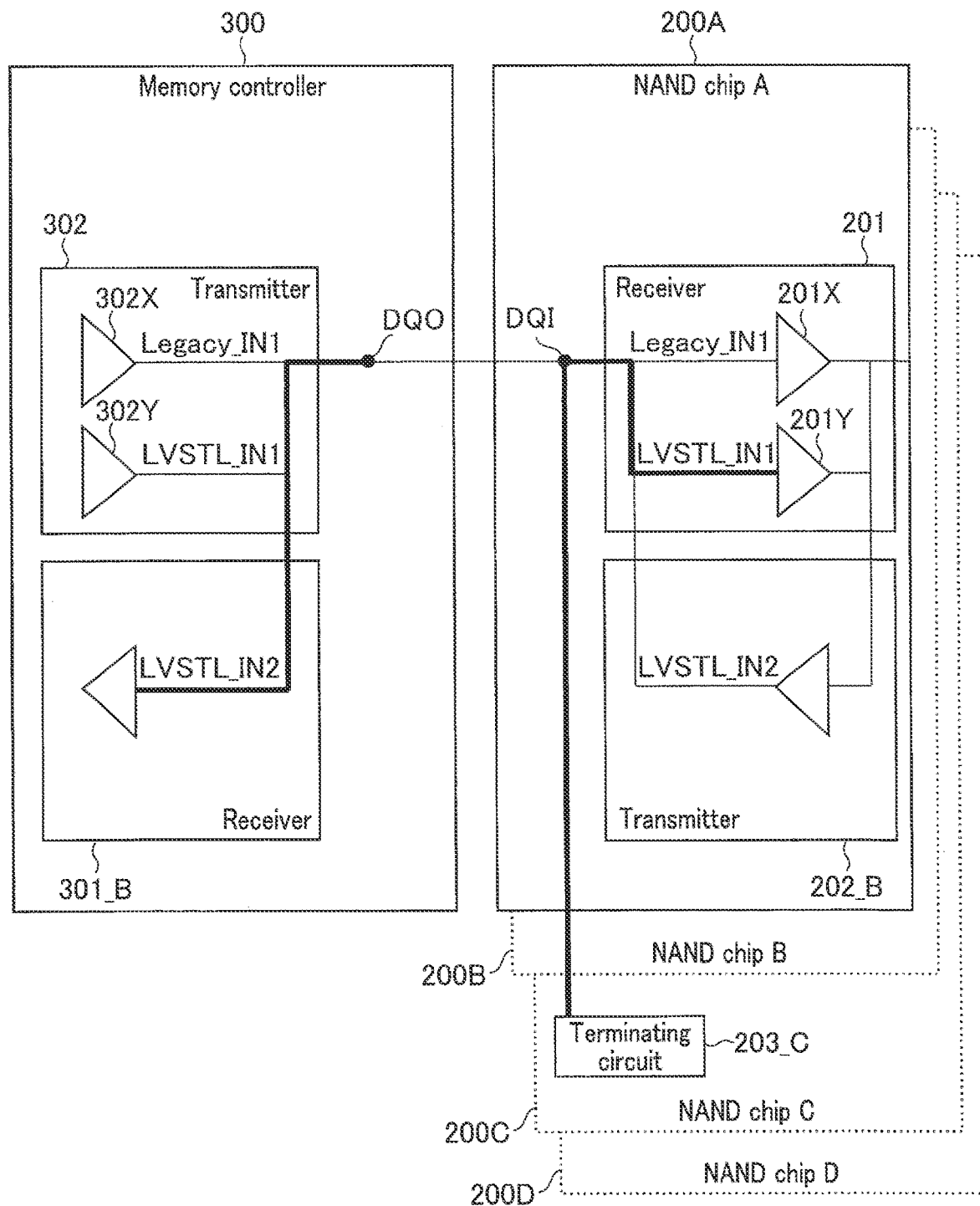
FIG. 41 illustrates a mode of terminating a signal DQ in a semiconductor memory device 200 and a memory controller 300 according to a fifth embodiment.

A description will be given of the termination modes for the semiconductor memory device 200 and the memory controller 300 according to the fifth embodiment to receive a signal DQ. FIG. 41 illustrates a mode of terminating a signal DQ in the semiconductor memory device 200 and the memory controller 300 according to the fifth embodiment. As shown in FIG. 41, the terminating circuit 203_C of the NAND chip C 200C terminates the node DQI in each of the case of the receiver 201 receiving the signal LVSTL_IN1 and the case of the receiver 301_B receiving the signal LVSTL_IN2. In the case of the receiver 201 receiving the signal Legacy_IN1, the terminating circuit 203_C does not terminate the node DQI.

As in the second embodiment, the semiconductor memory device 200 according to the fifth embodiment has one transmission mode for each of the signals DQ, DQS, and DQSn, and two reception modes for each of the signals DQ, DQS, DQSn, REn, and RE. Which reception mode should be selected is determined according to the type of the signal DQ. The semiconductor memory device 200 can also select the termination mode according to the transmission and reception modes. The terminating circuit 203_C of the NAND chip C 200C is used for terminating the node DQI. Also as in the second embodiment, the memory controller 300 according to the fifth embodiment has two transmission modes for each of the signals DQ, DQS, DQSn, REn, and RE, and one reception mode for each of the signals DQ, DQS, and DQSn. Which transmission mode should be selected is determined according to the type of the signal DQ. The memory controller 300 can select the termination mode according to the transmission and reception modes.

A description will be given of the transmission and reception modes and the termination modes for the signals DQ, DQS, DQSn, REn, and RE in the instances of transmitting and receiving six types of signals DQ, namely, a command or an address, a status, a parallel status, Feature-Data, DataOutput, and DataInput.

FIG. 42 sets forth, as one example, the transmission and reception modes and the termination modes for signals DQ, DQS, and RE. Although FIG. 42 illustrates the signal DQS from among the signals DQS and DQSn, the signal DQSn corresponds to an inverted logic signal of the signal DQS, and therefore, what is shown for the signal DQS is likewise applicable to it. Also, although FIG. 42 illustrates the signal RE from among the signals REn and RE, the signal REn corresponds to an inverted logic signal of the signal RE, and therefore, what is shown for the signal RE is likewise applicable to it. As mentioned in relation to FIG. 41, the fifth embodiment assumes the use of only the terminating circuit or circuits 203_C, 218_C, 219_C, 220_C, and/or 222_C of the NAND chip C 200C, i.e., the non-selected NAND chip, as the terminating circuits. As indicated in FIG. 42, the case where the type of the signal DQ is a command or an address is the same as the case in the second embodiment (cf. FIG. 26).

Referring to the next, if the type of the signal DQ is a status, the signal LVSTL_IN2 is transmitted as the signal DQ from the NAND chip A 200A and received by the memory controller 300. Here, the terminating circuit 203_C of the NAND chip C 200C terminates the node DQI. Also, the signal LVSTL_DQS2 is transmitted as the signal DQS from the NAND chip A 200A and received by the memory controller 300. Here, the terminating circuits 218_C and 219_C of the NAND chip C 200C terminate the nodes DQSI and DQSnI. Also, the signal LVSTL_RE1 is transmitted as the signal RE from the memory controller 300 and received by the NAND chip A 200A. Here, the terminating circuits 220_C and 222_C of the NAND chip C 200C terminate the nodes REnI and REI.

Referring to the next, if the type of the signal DQ is a parallel status, the signal LVSTL_IN2 is transmitted as the signal DQ from the NAND chip A 200A and the NAND chip B 200B, and received by the memory controller 300. Here, the terminating circuit 203_C of the NAND chip C 200C terminates the node DQI. Also, the signal LVSTL_DQS2 is transmitted as the signal DQS from the NAND chip A 200A and the NAND chip B 200B, and received by the memory controller 300. Here, the terminating circuits 218_C and 219_C of the NAND chip C 200C terminate the nodes DQSI and DQSnI. The signal LVSTL_RE1 is transmitted as the signal RE from the memory controller 300 and received by the NAND chip A 200A and the NAND chip B 200B. Here, the terminating circuits 220_C and 222_C of the NAND chip C 200C terminate the nodes REnI and REI.

The case of the type of the signal DQ being FeatureData, being DataOutput, and being DataInput are the same as the corresponding cases in the fourth embodiment, respectively (cf. FIG. 37).

As illustrated in FIG. 42, the memory controller 300 and/or the semiconductor memory device 200 according to the fifth embodiment conduct the node termination in the instance where the type of the signal DQ is any of a status, a parallel status, FeatureData, DataOutput, and DataInput. The timing to place the terminating circuits in the enabled state will be explained.

Figure 43:
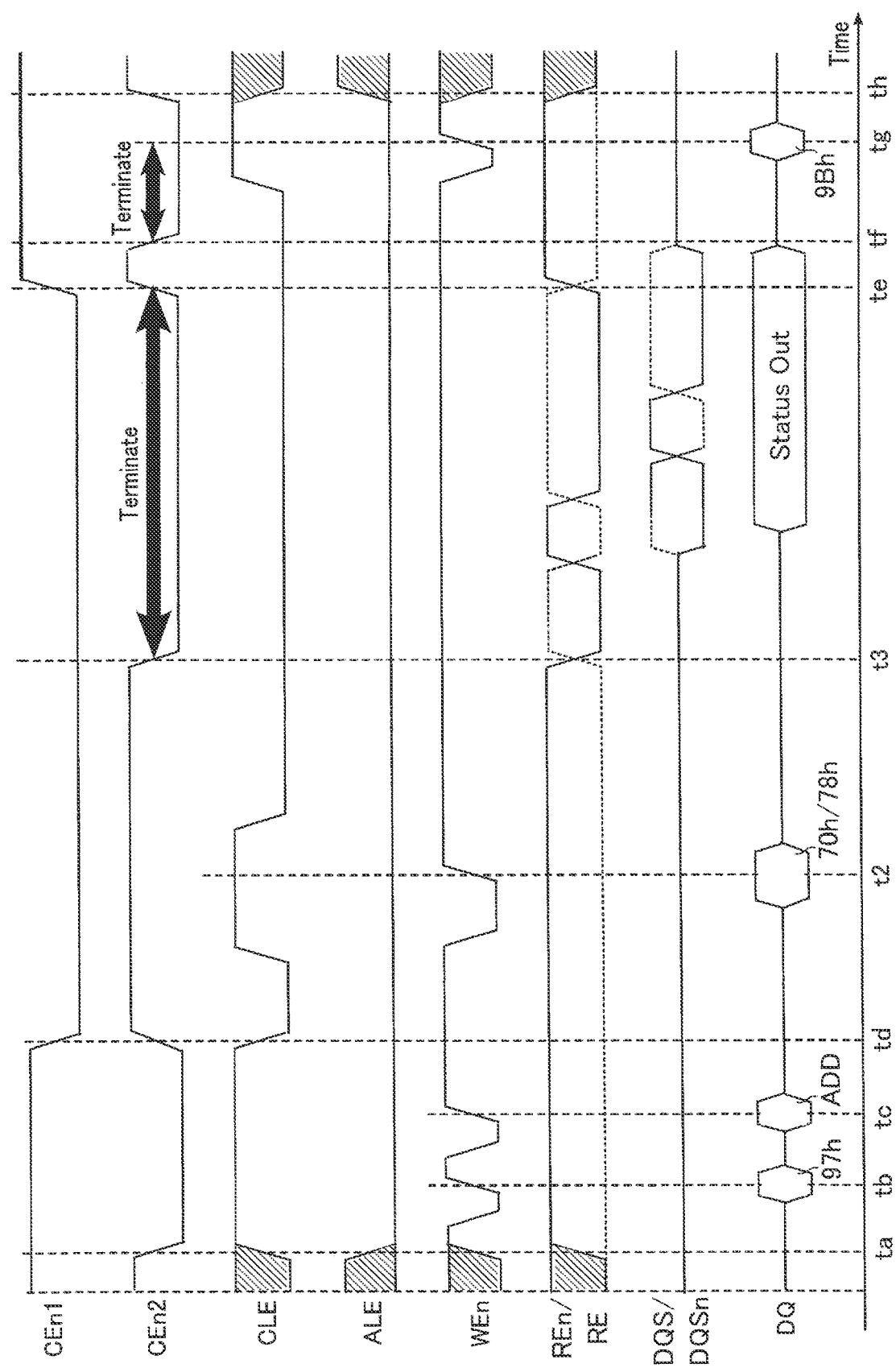
FIG. 43 is one exemplary timing chart for signals in a memory system 100 according to the fifth embodiment.

FIG. 43 is one exemplary timing chart for signals in the memory system 100 according to the fifth embodiment. FIG. 43 shows the timing to place the terminating circuits in the enabled state, assuming that the type of the signal DQ is one of a status and a parallel status. The same timing chart is applicable to the case of the type being a status and the case of the type being a parallel status, and as such, these cases will be explained using the same FIG. 43. Similar to FIG. 27, in the timing chart of FIG. 43, the signals CEn1, CEn2, CLE, ALE, WEn, REn, RE, DQS, DQSn, and DQ are illustrated.

For the period from time t2 to time t3, the timing chart for the signals CEn1, CLE, ALE, WEn, REn, RE, DQS, DQSn, and DQ conforms to FIG. 27 illustrating the second embodiment, and therefore, a corresponding description will be omitted. The description will mainly focus on the signal CEn2, and also on the signals CEn1, CLE, ALE, WEn, REn, RE, DQS, DQSn, and DQ for a period from time ta to time td and a period from time te to time th.

As in the fourth embodiment, the memory system 100 according to the fifth embodiment employs a special command for enabling the terminating circuit or circuits 203_C, 218_C, 219_C, 220_C, and/or 222_C included in the NAND chip C 200C. More specifically, the memory controller 300 transmits an ODT command 97h, an address ADD, and an ODT stop command 9Bh by means of the signal DQ and also controls the signal CEn2, so as to control the timing to enable the terminating circuit or circuits 203_C, 218_C, 219_C, 220_C, and/or 222_C of the NAND chip C 200C.

At time ta, the memory controller 300 sets the signal CEn2 to the low level. Accordingly, the NAND chip C 200C and the NAND chip D 200D enter the enabled state. For a period including times tb and tc, the memory controller 300 keeps the signal CLE at the high level and transmits each of the ODT command 97h and the address ADD as the signal DQ. Accordingly, the terminating circuit or circuits 203_C, 218_C, 219_C, 220_C, and/or 222_C included in the NAND chip C 200C designated by the address ADD are placed in the enabled state for a period of the signal CEn2 being at the low level. Along with the transmission of the ODT command 97h and the address ADD, the memory controller 300 sets the signal WEn to the high level at time tb and at time tc.

At time td, the memory controller 300 sets the signal CEn1 to the low level and the signal CEn2 to the high level. Accordingly, the NAND chip A 200A and the NAND chip B 200B enter the enabled state, and the NAND chip C 200C and the NAND chip D 200D enter the disabled state.

For a period from time t3 to time te, the memory controller 300 keeps the signal CEn2 at the low level. The NAND chip C 200C and the NAND chip D 200D are accordingly in the enabled state. At time te, the memory controller 300 sets each of the signals CEn1 and CEn2 to the high level. Accordingly, the NAND chip A 200A, the NAND chip B 200B, the NAND chip C 200C, and the NAND chip D 200D enter the disabled state.

For a period from time tf to time th, the memory controller 300 keeps the signal CEn2 at the low level. The NAND chip C 200C and the NAND chip D 200D are accordingly in the enabled state. At time tg, the memory controller 300 transmits the ODT stop command 9Bh as the signal DQ. After the transmission of the ODT command 97h and the address ADD, and up to the transmission of the ODT stop command 9Bh, the terminating circuit or circuits 203_C, 218_C, 219_C, 220_C, and/or 222_C included in the NAND chip C 200C are placed in the enabled state while the signal CEn2 is at the low level, that is, for a period between time t3 and time te and for a period between time tf and time tg. Along with the transmission of the ODT stop command 9Bh, the memory controller 300 sets the signal WEn to the high level at time tg.

At time th, the memory controller 300 sets the signal CEn2 to the high level. Accordingly, the NAND chip C 200C and the NAND chip D 200D enter the disabled state.

In this manner, the memory controller 300 controls the timing to enable the terminating circuit or circuits 203_C, 218_C, 219_C, 220_C, and/or 222_C of the NAND chip C 200C by transmitting the ODT command 97h, the address ADD, and the ODT stop command 9Bh using the signal DQ and by controlling the signal CEn2.

Based on the instructions from the memory controller 300, the NAND chip C 200C places its terminating circuits 203_C, 218_C to 220_C, and 222_C in the enabled state at time t3, and places the terminating circuits 203_C, 218_C to 220_C, and 222_C in the disabled state at time te. In other words, the period for which the terminating circuits 203_C, 218_C to 220_C, and 222_C are terminating the respective nodes DQI, DQSI, DQSnI, REnI, and REI, that is, the period for which the terminating circuits 203_C, 218_C to 220_C, and 222_C are in the enabled state, spans from time t3 to time te.

Similarly, the NAND chip C 200C places its terminating circuits 203_C, 218_C to 220_C, and 222_C in the enabled state for a period from time tf to time tg as well, based on the instructions from the memory controller 300. Note, however, that this enabling of the terminating circuits is only a result of unintentionally satisfying the conditions for enabling the terminating circuits in the course of the processing period until the ODT stop command 9Bh becomes valid. That is, the nodes DQI, DQSI, DQSnI, REnI, and REI are not intentionally terminated, and this termination from time tf to time tg may be precluded.

For the case of the type of the signal DQ being a parallel status, the timing chart and the timing to place the terminating circuits in the enabled state are the same as those in the case of the type being a status as described so far with reference to FIG. 43, except for the contents of the status data.

The timing chart and the timing to place the terminating circuits in the enabled state in the case of the type of the signal DQ being one of FeatureData, DataOutput, and DataInput are the same as the corresponding timing chart and timing in the fourth embodiment. That is, the timing chart and the timing to place the terminating circuits in the enabled state in the case of the type of the signal DQ being FeatureData are the same as those shown in FIG. 38. The timing chart and the timing to place the terminating circuits in the enabled state in the case of the type of the signal DQ being DataOutput are the same as those shown in FIG. 39. The timing chart and the timing to place the terminating circuits in the enabled state in the case of the type of the signal DQ being DataInput are the same as those shown in FIG. 40.

In view of the above timing charts, the timing to enable one or more terminating circuits in the memory system 100 according to the fifth embodiment will be summarized. The timing to enable the terminating circuit or circuits 203_C, 218_C, 219_C, 220_C, and/or 222_C of the NAND chip C 200C is controlled by the memory controller 300 through the actions of transmitting the ODT command 95h or 97h, the address ADD, and the ODT stop command 9Bh using the signal DQ and also controlling the signal CEn2. That is, a special command for enabling the terminating circuits is used.

(5-3) Advantages (Effects)

The memory system 100 according to the fifth embodiment described above includes the transmitters 202_B and 302 and the receivers 201 and 301_B as in the second embodiment. Therefore, the same effects as those of the second embodiment can be attained.

Also, similar to the fourth embodiment while differing from the second embodiment, the memory system 100 according to the fifth embodiment involves use of a terminating circuit or circuits included in the non-selected NAND chip, for the interconnect termination in the semiconductor memory device 200. Therefore, as compared to the second embodiment, the reflection of a signal that occurs with the propagation of the signal in the interconnect can be suppressed.

The fifth embodiment has assumed the exemplary cases where only the terminating circuit or circuits 203_C, 218_C, 219_C, 220_C, and/or 222_C included in the NAND chip C 200C are used for interconnect termination, but the terminating circuit or circuits included in other NAND chips may be used in combination. For example, the termination of the node DQI may be conducted not only by the use of the terminating circuit 203_C of the NAND chip C 200C alone, but also by the simultaneous use of the terminating circuit 203 of the NAND chip A 200A together with the terminating circuit 203_C.

(6) Sixth Embodiment

A memory controller 300 and a semiconductor memory device 200 according to the sixth embodiment will be described.

(6-1) Configurations (Structures)

The memory controller 300 and the semiconductor memory device 200 according to the sixth embodiment are similar in structure to those of the third embodiment, while differing in the following one respect. The memory controller 300 according to the sixth embodiment does not include the terminating circuit 303.

The memory system 100 according to the sixth embodiment involves a further difference from the third embodiment in the mode of terminating interconnects in the semiconductor memory device 200. The other aspects of the sixth embodiment are the same as the third embodiment. The description of the memory system 100 according to the sixth embodiment will mainly focus on differences from the third embodiment.

In the third embodiment, termination of the node DQI for communication between the memory controller 300 and the NAND chip A 200A is conducted using the terminating circuit 203 of the NAND chip A 200A. In contrast, the sixth embodiment utilizes, as in the fourth and fifth embodiments, the terminating circuit 203_C of the NAND chip C 200C to terminate the node DQI for communication between the memory controller 300 and the NAND chip A 200A. Similarly, the sixth embodiment utilizes the terminating circuits 218_C to 220_C and 222_C to terminate the nodes DQSI, DQSnI, REnI, and REI for communication between the memory controller 300 and the NAND chip A 200A.

The sixth embodiment is similar to the third embodiment except for the respects discussed so far. For example, the transmitters 202_C, 215_C, 216_C, 302_C, 309_C to 311_C, and 314_C and the receivers 201_C, 212_C to 214_C, 221_C, 301_C, 306_C, and 307_C according to the sixth embodiment have the same structures and functions as those in the third embodiment.

(6-2) Operations

In the semiconductor memory device 200 according to the sixth embodiment, each of the NAND chip B 200B, the NAND chip C 200C, and the NAND chip D 200D also has the same transmission and reception modes and termination modes as those of the NAND chip A 200A (as shown in FIG. 2), as in the first embodiment.

As discussed in relation to the first embodiment, if the NAND chip A 200A is a selected NAND chip, the terminating circuit or circuits of the NAND chip A 200A may be enabled, and/or the terminating circuit or circuits of the non-selected NAND chips may be enabled. The sixth embodiment will assume the instances where the selected NAND chip is the NAND chip A 200A, and the terminating circuit or circuits of the non-selected NAND chip C 200C are enabled.

A description will be given of the termination modes for the semiconductor memory device 200 and the memory controller 300 according to the sixth embodiment to receive a signal DQ. FIG. 44 illustrates a mode of terminating a signal DQ in the semiconductor memory device 200 and the memory controller 300 according to the sixth embodiment. As shown in FIG. 44, the terminating circuit 203_C of the NAND chip C 200C terminates the node DQI in each of the case of the receiver 201_C receiving the signal LVSTL_IN1 and the case of the receiver 301_C receiving the signal LVSTL_IN2.

As in the third embodiment, the semiconductor memory device 200 according to the sixth embodiment has one transmission mode for each of the signals DQ, DQS, and DQSn, and also one reception mode for each of the signals DQ, DQS, DQSn, REn, and RE. The transmission and reception modes always use a signal having a small amplitude for transmission and reception, regardless of the type of the signal DQ. Also, in the semiconductor memory device 200, while the receiver 201_C receives a signal, the terminating circuit 203_C of the NAND chip C 200C is terminating the node DQI at all times. Similarly, as in the third embodiment, the memory controller 300 according to the sixth embodiment has one transmission mode for each of the signals DQ, DQS, DQSn, REn, and RE, and also one reception mode for each of the signals DQ, DQS, and DQSn. The transmission and reception modes always use a signal having a small amplitude for transmission and reception, regardless of the type of the signal DQ. In the memory controller 300, while the receiver 301_C receives a signal, the terminating circuit 203_C is terminating the node DQI at all times.

A description will be given of the transmission and reception modes and the termination modes for the signals DQ, DQS, DQSn, REn, and RE in the instances of transmitting and receiving six types of signals DQ, namely, a command or an address, a status, a parallel status, FeatureData, DataOutput, and DataInput.

FIG. 45 sets forth, as one example, the transmission and reception modes and the termination modes for signals DQ, DQS, and RE. Although FIG. 45 illustrates the signal DQS from among the signals DQS and DQSn, the signal DQSn corresponds to an inverted logic signal of the signal DQS, and therefore, what is shown for the signal DQS is likewise applicable to it. Also, although FIG. 45 illustrates the signal RE from among the signals REn and RE, the signal REn corresponds to an inverted logic signal of the signal RE, and therefore, what is shown for the signal RE is likewise applicable to it. As mentioned in relation to FIG. 44, the sixth embodiment assumes the use of only the terminating circuit or circuits 203_C, 218_C, 219_C, 220_C, and/or 222_C of the NAND chip C 200C, i.e., the non-selected NAND chip, as the terminating circuits. As shown in FIG. 45, if the type of the signal DQ is a command or an address, the signal LVSTL_IN1 is transmitted as the signal DQ from the memory controller 300 and received by the NAND chip A 200A and the NAND chip B 200B. Here, the terminating circuit 203_C of the NAND chip C 200C terminates the node DQI. In the memory controller 300, the nodes DQSO and DQSnO, the node of the transmitter 311 for outputting the signal REn, and the node of the transmitter 314 for outputting the signal RE are in the electrically floating state. Here, the terminating circuits 218_C to 220_C and 222_C of the NAND chip C 200C terminate the respective nodes DQSI, DQSnI, REnI, and REI. This prevents the interconnects transmitting the respective signals DQS, DQSn, REn, and RE from being in the electrically floating state.

The case of the type of the signal DQ being a status, being a parallel status, and being DataOutput are the same as the corresponding cases in the fifth embodiment, respectively (cf. FIG. 42).

If the type of the signal DQ is FeatureData, particulars about the signals DQ and DQS are the same as what have been shown for the fifth embodiment (cf. FIG. 42). In the memory controller 300, the node of the transmitter 311 for outputting the signal REn, and the node of the transmitter 314 for outputting the signal RE are in the electrically floating state. Here, the terminating circuits 220_C and 222_C of the NAND chip C 200C terminate the nodes REnI and REI. This prevents the interconnects transmitting the signals REn and RE from being in the electrically floating state.

If the type of the signal DQ is DataInput, particulars about the signals DQ and DQS are the same as what have been shown for the fifth embodiment (cf. FIG. 42). In the memory controller 300, the node of the transmitter 311 for outputting the signal REn, and the node of the transmitter 314 for outputting the signal RE are in the electrically floating state. Here, the terminating circuits 220_C and 222_C of the NAND chip C 200C terminate the nodes REnI and REI. This prevents the interconnects transmitting the signals REn and RE from being in the electrically floating state.

As illustrated in FIG. 45, the memory controller 300 and/or the semiconductor memory device 200 according to the sixth embodiment conduct the node termination in the instance where the type of the signal DQ is any of a command or an address, a status, a parallel status, FeatureData, DataOutput, and DataInput. The timing to place the terminating circuits in the enabled state will be explained.

FIG. 46 is one exemplary timing chart for signals in the memory system 100 according to the sixth embodiment. FIG. 46 shows the timing to place the terminating circuits in the enabled state, assuming that the type of the signal DQ is one of a command, an address, and DataInput. In the timing chart of FIG. 46, the signals CEn1, CEn2, CLE, ALE, WEn, REn, RE, DQS, DQSn, and DQ are illustrated. By way of example, FIG. 46 shows data write.

The timing chart for the signals CEn1, CLE, ALE, WEn, REn, RE, DQS, DQSn, and DQ conforms to FIG. 40 illustrating the fourth embodiment, and therefore, a corresponding description will be omitted. The description will mainly focus on the signal CEn2.

As in the fourth and fifth embodiments, the memory system 100 according to the sixth embodiment employs a special command for enabling the terminating circuit or circuits 203_C, 218_C, 219_C, 220_C, and/or 222_C included in the NAND chip C 200C. More specifically, the memory controller 300 transmits an ODT command 97h, an address ADD, and an ODT stop command 9Bh by means of the signal DQ and also controls the signal CEn2, so as to control the timing to enable the terminating circuit or circuits 203_C, 218_C, 219_C, 220_C, and/or 222_C of the NAND chip C 200C.

At time ta, the memory controller 300 sets the signal CEn2 to the low level. Accordingly, the NAND chip C 200C and the NAND chip D 200D enter the enabled state. For a period from time ta to time th, the memory controller 300 keeps the signal CEn2 at the low level. At time th, the memory controller 300 sets the signal CEn2 to the high level. Accordingly, the NAND chip C 200C and the NAND chip D 200D enter the disabled state.

After the transmission of the ODT command 97h and the address ADD, and up to the transmission of the ODT stop command 9Bh, the terminating circuit or circuits 203_C,

218_C, 219_C, 220_C, and/or 222_C included in the NAND chip C 200C are placed in the enabled state while the signal CEn2 is at the low level, that is, for a period between time tc and time tg.

In this manner, the memory controller 300 controls the timing to enable the terminating circuit or circuits 203_C, 218_C, 219_C, 220_C, and/or 222_C of the NAND chip C 200C by transmitting the ODT command 97h, the address ADD, and the ODT stop command 9Bh using the signal DQ and by controlling the signal CEn2. In the sixth embodiment, the signal CEn2 is kept at the low level at all times for at least a period including the span of the memory controller 300 and the NAND chip A 200A transmitting and receiving the signal DQ (i.e., from time td to time te), so that the terminating circuit or circuits 203_C, 218_C, 219_C, 220_C, and/or 222_C of the NAND chip C 200C are constantly in the enabled state for that period.

More specifically, based on the instructions from the memory controller 300, the NAND chip C 200C places its terminating circuits 203_C, 218_C to 220_C, and 222_C in the enabled state at time tc, and places the terminating circuits 203_C, 218_C to 220_C, and 222_C in the disabled state at time tg. In other words, the period for which the terminating circuits 203_C, 218_C to 220_C, and 222_C are terminating the respective nodes DQI, DQSI, DQSnI, REnI, and REI, that is, the period for which the terminating circuits 203_C, 218_C to 220_C, and 222_C are in the enabled state, spans from time tc to time tg. This is because the sixth embodiment assumes one type of signal for transmission and reception, and as such, the terminating circuits may be constantly in the enabled state for a period where the memory controller 300 keeps the NAND chip A 200A in the enabled state for communicating with the NAND chip A 200A.

Figure 47:
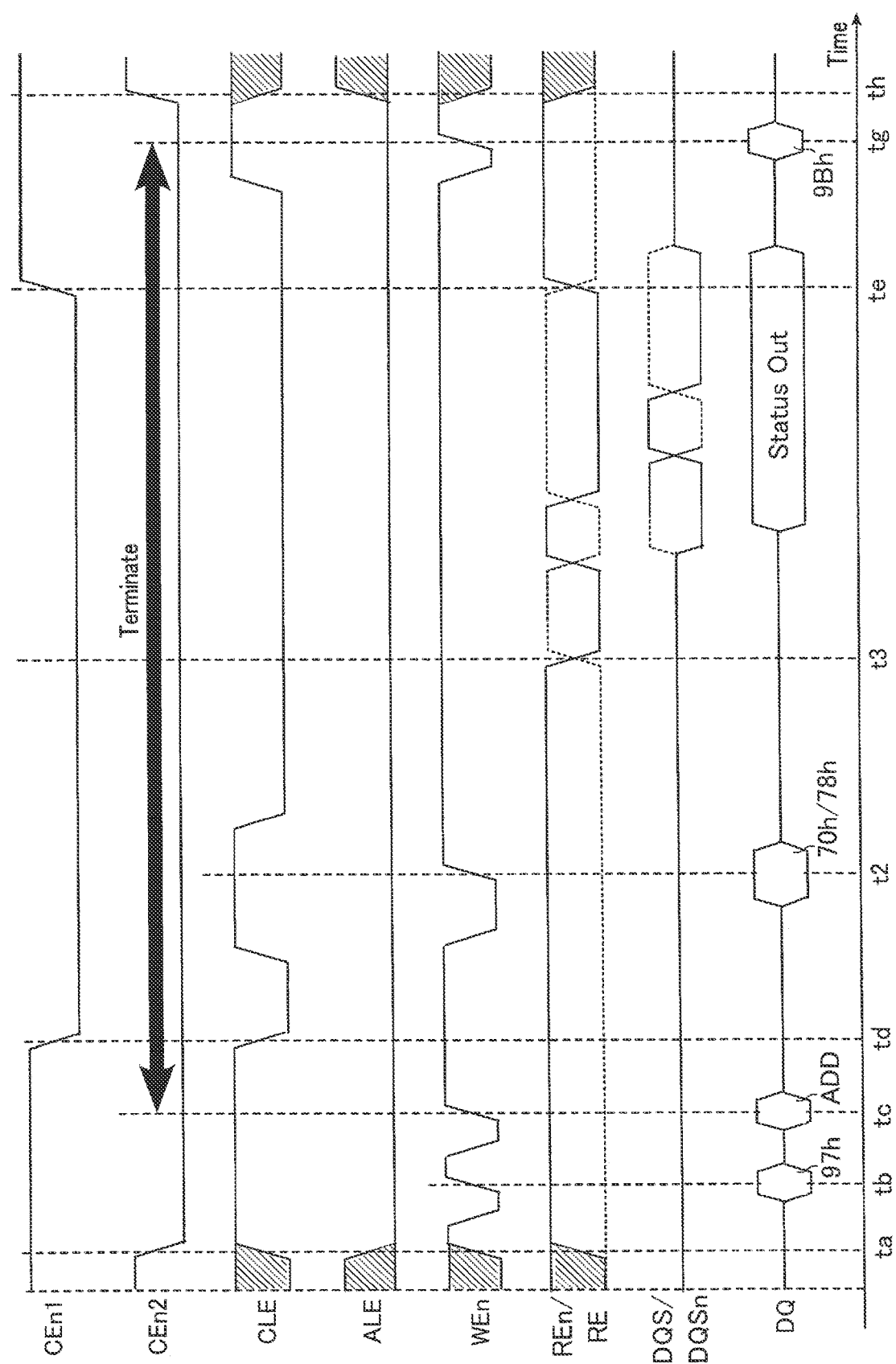
FIG. 47 is one exemplary timing chart for signals in the memory system 100 according to the sixth embodiment.

FIG. 47 is one exemplary timing chart for signals in the memory system 100 according to the sixth embodiment. FIG. 47 shows the timing to place the terminating circuits in the enabled state, assuming that the type of the signal DQ is one of a status and a parallel status. In the timing chart of FIG. 47, the signals CEn1, CEn2, CLE, ALE, WEn, REn, RE, DQS, DQSn, and DQ are illustrated.

The timing chart for the signals CEn1, CLE, ALE, WEn, REn, RE, DQS, DQSn, and DQ conforms to FIG. 43 illustrating the fifth embodiment, and therefore, a corresponding description will be omitted. The description will mainly focus on the signal CEn2.

FIG. 47, similar to FIG. 46, assumes the use of a special command for enabling the terminating circuit or circuits 203_C, 218_C, 219_C, 220_C, and/or 222_C included in the NAND chip C 200C. More specifically, the memory controller 300 transmits an ODT command 97h, an address ADD, and an ODT stop command 9Bh by means of the signal DQ and also controls the signal CEn2, so as to control the timing to enable the terminating circuit or circuits 203_C, 218_C, 219_C, 220_C, and/or 222_C of the NAND chip C 200C.

At time ta, the memory controller 300 sets the signal CEn2 to the low level. Accordingly, the NAND chip C 200C and the NAND chip D 200D enter the enabled state. For a period from time ta to time th, the memory controller 300 keeps the signal CEn2 at the low level. At time th, the memory controller 300 sets the signal CEn2 to the high level. Accordingly, the NAND chip C 200C and the NAND chip D 200D enter the disabled state.

After the transmission of the ODT command 97h and the address ADD, and up to the transmission of the ODT stop command 9Bh, the terminating circuit or circuits 203_C, 218_C, 219_C, 220_C, and/or 222_C included in the NAND chip C 200C are placed in the enabled state while the signal CEn2 is at the low level, that is, for a period between time tc and time tg.

Based on the instructions from the memory controller 300, the NAND chip C 200C places its terminating circuits 203_C, 218_C to 220_C, and 222_C in the enabled state at time tc, and places the terminating circuits 203_C, 218_C to 220_C, and 222_C in the disabled state at time tg. In other words, the period for which the terminating circuits 203_C, 218_C to 220_C, and 222_C are terminating the respective nodes DQI, DQSI, DQSnI, REnI, and REI, that is, the period for which the terminating circuits 203_C, 218_C to 220_C, and 222_C are in the enabled state, spans from time tc to time tg.

FIG. 48 is one exemplary timing chart for signals in the memory system 100 according to the sixth embodiment. FIG. 48 shows the timing to place the terminating circuits in the enabled state, assuming that the type of the signal DQ is FeatureData. In the timing chart of FIG. 48, the signals CEn1, CEn2, CLE, ALE, WEn, REn, RE, DQS, DQSn, and DQ are illustrated.

The timing chart for the signals CEn1, CLE, ALE, WEn, REn, RE, DQS, DQSn, and DQ conforms to FIG. 38 illustrating the fourth embodiment, and therefore, a corresponding description will be omitted. The description will mainly focus on the signal CEn2.

FIG. 48, similar to FIG. 46, assumes the use of a special command for enabling the terminating circuit or circuits 203_C, 218_C, 219_C, 220_C, and/or 222_C included in the NAND chip C 200C. More specifically, the memory controller 300 transmits an ODT command 97h, an address ADD, and an ODT stop command 9Bh by means of the signal DQ and also controls the signal CEn2, so as to control the timing to enable the terminating circuit or circuits 203_C, 218_C, 219_C, 220_C, and/or 222_C of the NAND chip C 200C.

At time ta, the memory controller 300 sets the signal CEn2 to the low level. Accordingly, the NAND chip C 200C and the NAND chip D 200D enter the enabled state. For a period from time ta to time th, the memory controller 300 keeps the signal CEn2 at the low level. At time th, the memory controller 300 sets the signal CEn2 to the high level. Accordingly, the NAND chip C 200C and the NAND chip D 200D enter the disabled state.

After the transmission of the ODT command 97h and the address ADD, and up to the transmission of the ODT stop command 9Bh, the terminating circuit or circuits 203_C, 218_C, 219_C, 220_C, and/or 222_C included in the NAND chip C 200C are placed in the enabled state while the signal CEn2 is at the low level, that is, for a period between time tc and time tg.

Based on the instructions from the memory controller 300, the NAND chip C 200C places its terminating circuits 203_C, 218_C to 220_C, and 222_C in the enabled state at time tc, and places the terminating circuits 203_C, 218_C to 220_C, and 222_C in the disabled state at time tg. In other words, the period for which the terminating circuits 203_C, 218_C to 220_C, and 222_C are terminating the nodes DQI, DQSI, DQSnI, REnI, and REI, that is, the period for which the terminating circuits 203_C, 218_C to 220_C, and 222_C are in the enabled state, spans from time tc to time tg.

Figure 49:
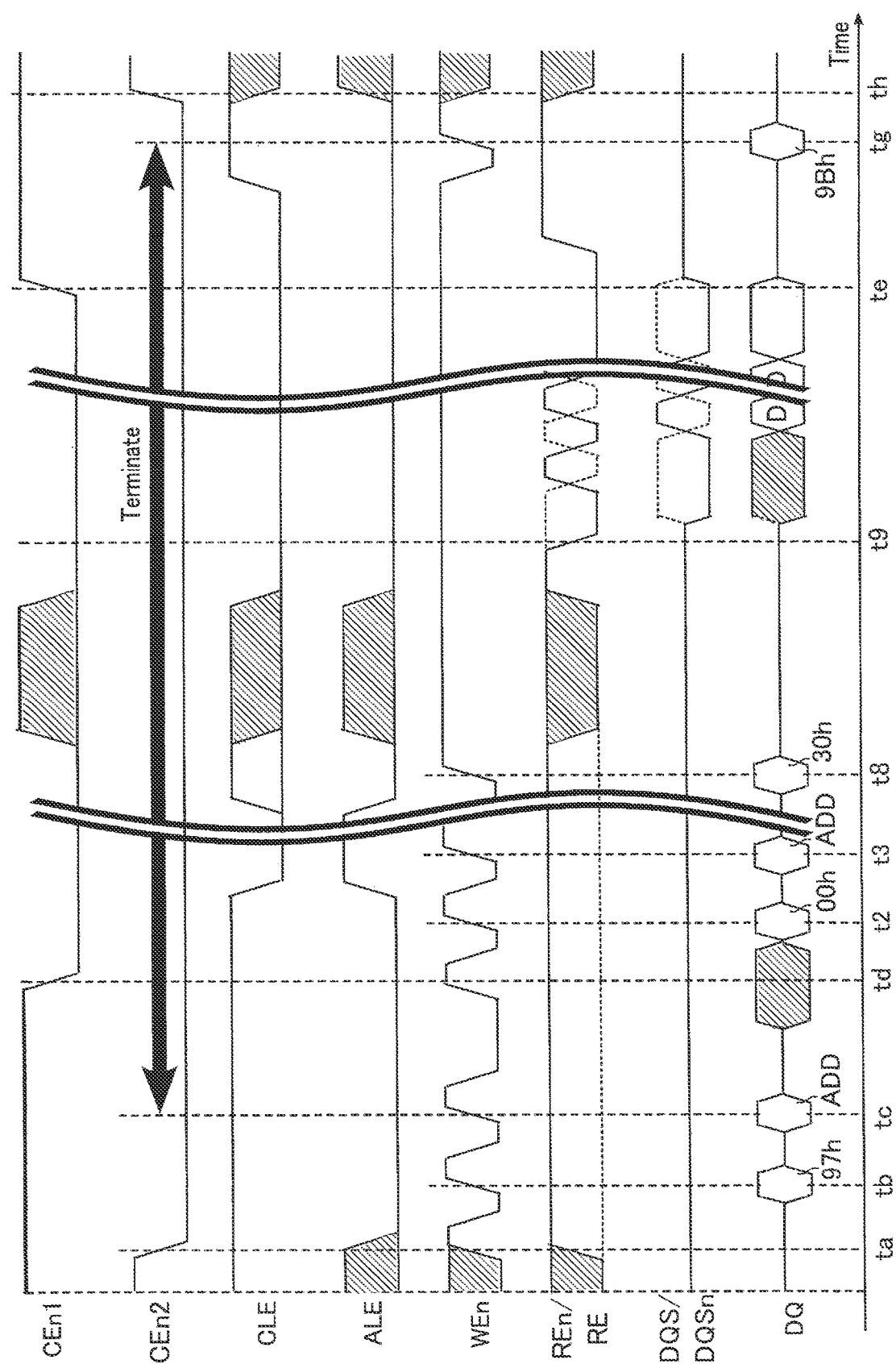
FIG. 49 is one exemplary timing chart for signals in the memory system 100 according to the sixth embodiment.

FIG. 49 is one exemplary timing chart for signals in the memory system 100 according to the sixth embodiment. FIG. 49 shows the timing to place the terminating circuits in the enabled state, assuming that the type of the signal DQ is DataOutput. In the timing chart of FIG. 49, the signals CEn1, CEn2, CLE, ALE, WEn, REn, RE, DQS, DQSn, and DQ are illustrated.

The timing chart for the signals CEn1, CLE, ALE, WEn, REn, RE, DQS, DQSn, and DQ conforms to FIG. 39 illustrating the fourth embodiment, and therefore, a corresponding description will be omitted. The description will mainly focus on the signal CEn2.

FIG. 49, similar to FIG. 46, assumes the use of a special command for enabling the terminating circuit or circuits 203_C, 218_C, 219_C, 220_C, and/or 222_C included in the NAND chip C 200C. More specifically, the memory controller 300 transmits an ODT command 97h, an address ADD, and an ODT stop command 9Bh by means of the signal DQ and also controls the signal CEn2, so as to control the timing to enable the terminating circuit or circuits 203_C, 218_C, 219_C, 220_C, and/or 222_C of the NAND chip C 200C.

At time ta, the memory controller 300 sets the signal CEn2 to the low level. Accordingly, the NAND chip C 200C and the NAND chip D 200D enter the enabled state. For a period from time ta to time th, the memory controller 300 keeps the signal CEn2 at the low level. At time th, the memory controller 300 sets the signal CEn2 to the high level. Accordingly, the NAND chip C 200C and the NAND chip D 200D enter the disabled state.

After the transmission of the ODT command 97h and the address ADD, and up to the transmission of the ODT stop command 9Bh, the terminating circuit or circuits 203_C, 218_C, 219_C, 220_C, and/or 222_C included in the NAND chip C 200C are placed in the enabled state while the signal CEn2 is at the low level, that is, for a period between time tc and time tg.

Based on the instructions from the memory controller 300, the NAND chip C 200C places its terminating circuits 203_C, 218_C to 220_C, and 222_C in the enabled state at time tc, and places the terminating circuits 203_C, 218_C to 220_C, and 222_C in the disabled state at time tg. In other words, the period for which the terminating circuits 203_C, 218_C to 220_C, and 222_C are terminating the nodes DQI, DQSI, DQSnI, REnI, and REI, that is, the period for which the terminating circuits 203_C, 218_C to 220_C, and 222_C are in the enabled state, spans from time tc to time tg.

In view of the above timing charts, the timing to enable one or more terminating circuits in the memory system 100 according to the sixth embodiment will be summarized. The timing to enable the terminating circuit or circuits 203_C, 218_C, 219_C, 220_C, and/or 222_C of the NAND chip C 200C is controlled by the memory controller 300 through the actions of transmitting the ODT command 97h, the address ADD, and the ODT stop command 9Bh using the signal DQ and also controlling the signal CEn2. That is, a special command for enabling the terminating circuits is used.

(6-3) Advantages (Effects)

The memory system 100 according to the sixth embodiment described above includes the transmitters 202_C and 302_C and the receivers 201_C and 301_C as in the third embodiment. Therefore, the same effects as those of the third embodiment can be attained.

Also, similar to the fourth and fifth embodiments while differing from the third embodiment, the memory system 100 according to the sixth embodiment involves use of a terminating circuit or circuits included in the non-selected NAND chip, for the interconnect termination in the semiconductor memory device 200. Therefore, as compared to the third embodiment, the reflection of a signal that occurs with the propagation of the signal in the interconnect can be suppressed.

Also, the memory system 100 according to the sixth embodiment, employing the terminating circuits according to the LVSTL method which requires a low power consumption, can maintain the terminating circuits in the enabled state for a long time.

The sixth embodiment has assumed the exemplary cases where only the terminating circuit or circuits 203_C, 218_C, 219_C, 220_C, and/or 222_C included in the NAND chip C 200C are used for interconnect termination, but the terminating circuit or circuits included in other NAND chips may be used in combination. For example, the termination of the node DQI may be conducted not only by the use of the terminating circuit 203_C of the NAND chip C 200C alone, but also by the simultaneous use of the terminating circuit 203 of the NAND chip A 200A together with the terminating circuit 203_C.

(7) Other Modifications

In the first to sixth embodiments herein, each memory system 100 may include configurations other than the configurations described. For example, it may include components not illustrated in the figures, and structures involving connections formed by interconnects not illustrated in the figures.

As used herein, the term "connection" intends an electrical connection, and does not exclude the cases where, for example, one or more other elements are arranged between the connected elements. The "electrically connected" state may cover the form where one or more insulators are interposed, as long as an operation comparable to the electrically connected configuration is possible.

The first to sixth embodiments have been presented as examples, and they are not intended to pose any limitations to the scope of the inventions. The first to sixth embodiments may be worked in a variety of other forms, and various omissions, substitutions, and changes in the form of the embodiments may be made without departing from the spirit of the inventions. The accompanying claims and their equivalents are intended to cover the first to sixth embodiments and their modifications as would fall within the scope and spirit.

What is claimed is:

1. A semiconductor memory device comprising:
a first pin configured to receive a first signal and a second signal having a smaller amplitude than the first signal;
a first receiving circuit connected to the first pin and configured to output a third signal and a fourth signal having a smaller amplitude than the third signal, the first receiving circuit outputting the third signal based on a comparison between the first signal and a first voltage, and the first receiving circuit outputting the fourth signal based on a comparison between the second signal and a second voltage;
a first terminating circuit connected to the first pin and configured to be disabled if the first pin receives the first signal and enabled if the first pin receives the second signal;
a second pin configured to receive a fifth signal and a sixth signal having a smaller amplitude than the fifth signal;
a second receiving circuit connected to the second pin and configured to output a seventh signal and an eighth signal having a smaller amplitude than the seventh signal, the second receiving circuit outputting the seventh signal based on a comparison between the fifth signal and the first voltage, and the second receiving circuit outputting the eighth signal based on a comparison between the sixth signal and the second voltage;

a second terminating circuit connected to the second pin and configured to be disabled if the second pin receives the fifth signal and enabled if the second pin receives the sixth signal;

a third pin configured to receive a ninth signal and a tenth signal having a smaller amplitude than the ninth signal;

a third receiving circuit connected to the third pin and configured to output an eleventh signal and a twelfth signal having a smaller amplitude than the eleventh signal, the third receiving circuit outputting the eleventh signal based on a comparison between the ninth signal and the first voltage, and the third receiving circuit outputting the twelfth signal based on a comparison between the tenth signal and the second voltage; and a third terminating circuit connected to the third pin and configured to be disabled if the third pin receives the ninth signal and enabled if the third pin receives the tenth signal.

2. The semiconductor memory device according to claim 1, wherein the second voltage is smaller than the first voltage.

3. The semiconductor memory device according to claim 1, wherein the first terminating circuit includes a first resistor and a first switch connected in series between the first pin and a node for supplying a ground voltage.

4. The semiconductor memory device according to claim 1, wherein:
the first signal includes a command or an address, and
the second signal includes a parameter value or write data.

5. The semiconductor memory device according to claim 1, further comprising a first transmitting circuit configured to output the fifth signal and the sixth signal,
wherein:
the fifth signal includes data indicative of a status, and
the sixth signal includes read data.

6. The semiconductor memory device according to claim 1, further comprising a first transmitting circuit configured to output the fifth signal to the first pin,
wherein the fifth signal includes status or read data.

7. The semiconductor memory device according to claim 6, wherein an output node of the first transmitting circuit is connected, via an NMOS transistor, to a node for supplying a supply voltage.

8. The semiconductor memory device according to claim 1, further comprising:
a fourth pin configured to receive a thirteenth signal and a fourteenth signal having a smaller amplitude than the thirteenth signal;
a fourth receiving circuit connected to the fourth pin and configured to output a fifteenth signal and a sixteenth signal having a smaller amplitude than the fifteenth signal, the fourth receiving circuit outputting the fifteenth signal based on a comparison between the thirteenth signal and the first voltage, and the fourth receiving circuit outputting the sixteenth signal based on a comparison between the fourteenth signal and the second voltage;
a fourth terminating circuit connected to the fourth pin and configured to be disabled if the fourth pin receives the thirteenth signal and enabled if the fourth pin receives the fourteenth signal;

a fifth pin configured to receive a seventeenth signal and an eighteenth signal having a smaller amplitude than the seventeenth signal;

a fifth receiving circuit connected to the fifth pin and configured to output a nineteenth signal and a twentieth signal having a smaller amplitude than the nineteenth signal, the fifth receiving circuit outputting the nineteenth signal based on a comparison between the seventeenth signal and the first voltage, and the fifth receiving circuit outputting the twentieth signal based on a comparison between the eighteenth signal and the second voltage; and a fifth terminating circuit connected to the fifth pin and configured to be disabled if the fifth pin receives the seventeenth signal and enabled if the fifth pin receives the eighteenth signal.

9. The semiconductor memory device according to claim 8, further comprising:
a first circuit connected to the second receiving circuit and the third receiving circuit and configured to output a twenty-first signal and a twenty-second signal, the first circuit outputting the twenty-first signal and the twenty-second signal based on the seventh signal and the eleventh signal or based on the eighth signal and the twelfth signal; and
a latch circuit configured to store, based on the twenty-first signal and the twenty-second signal, data included in the third signal or the fourth signal.

10. The semiconductor memory device according to claim 1, further comprising a first chip including the first pin, the first receiving circuit, and the first terminating circuit.

11. The semiconductor memory device according to claim 1, further comprising:
a first chip including the first pin and the first receiving circuit; and
a second chip including the first terminating circuit.

12. The semiconductor memory device according to claim 11, wherein after receipt of a first command which is the first signal and up to receipt of a second command, the first terminating circuit is in an enabled state for a period where the second chip is receiving a signal for enabling the second chip.

13. A memory system comprising:
a first transmitting circuit configured to receive a first signal and output a second signal having a smaller amplitude than the first signal;
a first pin configured to receive the second signal;
a first receiving circuit connected to the first pin and configured to output a third signal based on a comparison between the second signal and a first voltage; and
a first terminating circuit connected to the first pin and configured to be in an enabled state for a period where the first pin is receiving the second signal,
wherein an output node of the first transmitting circuit is connected, via an NMOS transistor, to a node for supplying a supply voltage.

14. The memory system according to claim 13, wherein the first terminating circuit includes a first resistor and a first switch connected in series between the first pin and a node for supplying a ground voltage.

15. The memory system according to claim 13, wherein the first signal includes a command or an address.

16. The memory system according to claim 15, wherein the first signal further includes a parameter value or write data.

17. The memory system according to claim 13, further comprising a second transmitting circuit configured to receive a fourth signal and output a fifth signal to the first pin, the fifth signal having a smaller amplitude than the fourth signal, wherein:

the fifth signal includes data indicative of a status, or write data, and an output node of the second transmitting circuit is connected, via an NMOS transistor, to a node for supplying the supply voltage.

18. The memory system according to claim 13, further comprising:

a second transmitting circuit configured to receive a fourth signal and output a fifth signal having a smaller amplitude than the fourth signal;

a second pin configured to receive the fifth signal;

a second receiving circuit connected to the second pin and configured to output a sixth signal based on a comparison between the fifth signal and the first voltage;

a second terminating circuit connected to the second pin and configured to be in an enabled state for a period where the second pin is receiving the fifth signal;

a third transmitting circuit configured to receive a seventh signal and output an eighth signal having a smaller amplitude than the seventh signal;

a third pin configured to receive the eighth signal;

a third receiving circuit connected to the third pin and configured to output a ninth signal based on a comparison between the eighth signal and the first voltage; and a third terminating circuit connected to the third pin and configured to be in an enabled state for a period where the third pin is receiving the eighth signal.

19. The memory system according to claim 18, further comprising:

a fourth transmitting circuit configured to receive a tenth signal and output an eleventh signal having a smaller amplitude than the tenth signal;

a fourth pin configured to receive the eleventh signal;

a fourth receiving circuit connected to the fourth pin and configured to output a twelfth signal based on a comparison between the eleventh signal and the first voltage;

a fourth terminating circuit connected to the fourth pin and configured to be in an enabled state for a period where the fourth pin is receiving the eleventh signal;

a fifth transmitting circuit configured to receive a thirteenth signal and output a fourteenth signal having a smaller amplitude than the thirteenth signal;

a fifth pin configured to receive the fourteenth signal;

a fifth receiving circuit connected to the fifth pin and configured to output a fifteenth signal based on a comparison between the fourteenth signal and the first voltage; and a fifth terminating circuit connected to the fifth pin and configured to be in an enabled state for a period where the fifth pin is receiving the fourteenth signal.

20. The memory system according to claim 19, further comprising:

a first circuit connected to the second receiving circuit and the third receiving circuit and configured to output a sixteenth signal and a seventeenth signal based on the sixth signal and the ninth signal; and a latch circuit configured to store, based on the sixteenth signal and the seventeenth signal, data included in the third signal.

21. The memory system according to claim 13, further comprising a first chip including the first pin, the first receiving circuit, and the first terminating circuit.

22. The memory system according to claim 13, further comprising:

a first chip including the first pin and the first receiving circuit; and a second chip including the first terminating circuit.

23. The memory system according to claim 22, wherein after receipt of a first command which is the first signal and up to receipt of a second command, the first terminating circuit is in an enabled state for a period where the second chip is receiving a signal for enabling the second chip.

24. The memory system according to claim 13, further comprising:

a memory controller including the first transmitting circuit; and a semiconductor memory device including the first pin and the first terminating circuit.

* * * * *